US010643960B2

(12) United States Patent
Kariyazaki et al.

(10) Patent No.: US 10,643,960 B2
(45) Date of Patent: May 5, 2020

(54) SEMICONDUCTOR DEVICE

(71) Applicant: RENESAS ELECTRONICS CORPORATION, Tokyo (JP)

(72) Inventors: Shuuichi Kariyazaki, Tokyo (JP); Wataru Shiroi, Tokyo (JP); Shinji Katayama, Tokyo (JP); Keita Tsuchiya, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/192,323

(22) Filed: Nov. 15, 2018

(65) Prior Publication Data

US 2019/0198463 A1   Jun. 27, 2019

(30) Foreign Application Priority Data

Dec. 25, 2017 (JP) ................................ 2017-247511

(51) Int. Cl.
*H01L 23/66* (2006.01)
*H01L 23/31* (2006.01)
(Continued)

(52) U.S. Cl.
CPC .......... *H01L 23/66* (2013.01); *H01L 23/3185* (2013.01); *H01L 23/49822* (2013.01); *H01L 23/49827* (2013.01); *H01L 23/49838* (2013.01); *H01L 24/16* (2013.01); *H01L 24/05* (2013.01); *H01L 24/13* (2013.01); *H01L 2223/6611* (2013.01); *H01L 2223/6616* (2013.01);
(Continued)

(58) Field of Classification Search
CPC ................. H01L 23/66; H01L 23/3185; H01L 23/49822; H01L 23/49827; H01L 23/49838; H01L 24/16; H01L 2223/6611; H01L 2223/6616; H01L 2223/6638; H01L 2224/16227
USPC ........................................................ 257/668
See application file for complete search history.

(56) References Cited

U.S. PATENT DOCUMENTS 6,867,502 B2    3/2005  Katagiri et al.
2014/0300003 A1* 10/2014  Kariyazaki ....... H01L 23/49816
                                              257/774

FOREIGN PATENT DOCUMENTS

JP    2003-264256 A    9/2003
JP    2008-311682 A   12/2008
JP    2013-110293 A    6/2013

* cited by examiner

*Primary Examiner* — Tong-Ho Kim
(74) *Attorney, Agent, or Firm* — McDermott Will & Emery LLP

(57) ABSTRACT

A semiconductor device includes a semiconductor chip including a first circuit and a wiring substrate over which the semiconductor chip is mounted. The wiring substrate includes input signal wires transmitting an input signal to the semiconductor chip, output signal wires transmitting an output signal from the semiconductor chip, and first conductor planes supplied with a reference potential. When a wire cross-sectional area is defined as the cross-sectional area of each wire in a direction orthogonal to a direction in which the wire extends, the wire cross-sectional area of each input signal wire is smaller than the wire cross-sectional area of each output signal wire. In the thickness direction of the wiring substrate, each input signal wire is interposed between second conductor planes and third conductor planes each supplied with the reference potential. Between the output signal wires and the input signal wires, the third conductor planes are disposed.

17 Claims, 28 Drawing Sheets

(51) Int. Cl.
*H01L 23/498* (2006.01)
*H01L 23/00* (2006.01)
(52) U.S. Cl.
CPC ............... *H01L 2223/6638* (2013.01); *H01L 2224/16227* (2013.01); *H01L 2224/16235* (2013.01); *H01L 2224/16237* (2013.01); *H01L 2224/32225* (2013.01); *H01L 2224/73204* (2013.01); *H01L 2924/15311* (2013.01); *H01L 2924/3025* (2013.01)

SEMICONDUCTOR DEVICE

CROSS-REFERENCE TO RELATED APPLICATIONS

The disclosure of Japanese Patent Application No. 2017-247511 filed on Dec. 25, 2017 including the specification, drawings and abstract is incorporated herein by reference in its entirety.

BACKGROUND

The present invention relates to a semiconductor device and to a technique which is effective when applied to, e.g., a semiconductor device including a circuit which transmits a signal at a high speed.

Patent Document 1 (Japanese Unexamined Patent Application Publication No. 2003-264256 describes a semiconductor chip in which, in a first region adjacent to the middle region of a main surface, bump electrodes for inputting/outputting a data signal are disposed and, outside the first region, bump electrodes for inputting/outputting an address signal are disposed.

Patent Document 2 (Japanese Unexamined Patent Application Publication No. 2008-311682) describes a structure in which, around a through conductor coupled to wires which transmit a differential signal, a plurality of through conductors supplied with a ground potential are arranged.

Patent Document 3 (Japanese Unexamined Patent Application Publication No. 2013-110293) describes a wiring substrate in which the width and thickness of a high-speed signal wire are larger than the width and thickness of a low-speed signal wire.

RELATED ART DOCUMENTS

Patent Documents

[Patent Document 1] Japanese Unexamined Patent Application Publication No. 2003-264256
[Patent Document 2] Japanese Unexamined Patent Application Publication No. 2008-311682
[Patent Document 3] Japanese Unexamined Patent Application Publication No. 2013-110293

SUMMARY

The present inventors have developed a technique which improves the performance of a semiconductor device. As a part of the development, the present inventors have worked to increase the transmission speed of a signal which is input to a semiconductor chip mounted over a wiring substrate or a signal which is output from the semiconductor chip. The present inventors have found that, in terms of improving the performance (such as transmission reliability or size increase control) of a semiconductor device including a high-speed transmission path which transmits a signal at a high speed, there is a room for improvement.

For example, when a device is required to process a large amount of data at a high speed and perform communication, a technique which can increase the speed of an input/output circuit for a data signal and also stabilize a power supply to a core circuit which processes data is required.

Other problems and novel features of the present invention will become apparent from a statement in the present specification and the accompanying drawings.

A semiconductor device according to an embodiment includes a semiconductor chip including a first circuit and a wiring substrate over which the semiconductor chip is mounted. The wiring substrate includes a plurality of input signal wires which transmit an input signal input to the semiconductor chip, a plurality of output signal wires which transmit an output signal output from the semiconductor chip, and a plurality of conductor patterns which are supplied with a reference potential. When a wire cross-sectional area is defined as the cross-sectional area of each of the wires in a direction orthogonal to a direction in which the wire extends, the wire cross-sectional area of each of the plurality of input signal wires is smaller than the wire cross-sectional area of each of the plurality of output signal wires. In a thickness direction of the wiring substrate, each of the plurality of input signal wires is interposed between the plurality of conductor patterns supplied with the reference potential. Between the plurality of output signal wires and the plurality of input signal wires, the respective conductor patterns supplied with the reference potential are disposed.

According to the foregoing embodiment, the performance of the semiconductor device can be improved.

Figure 1:
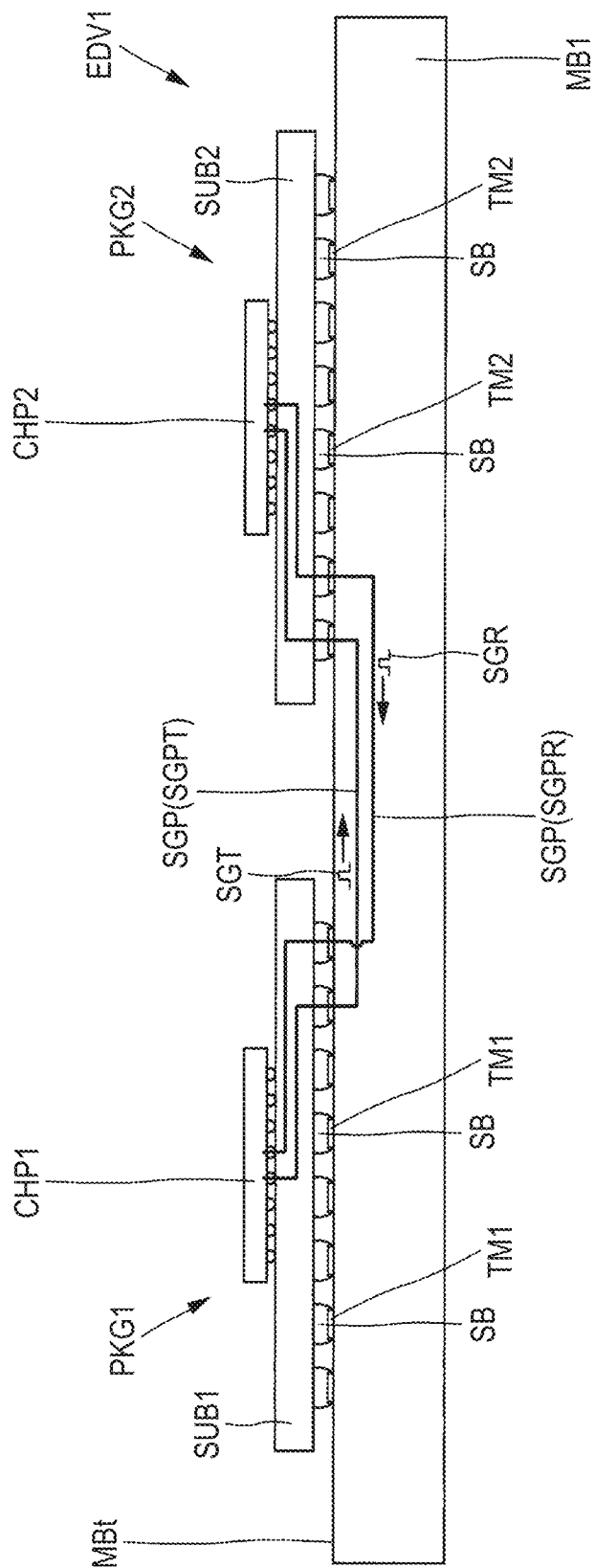
FIG. 1 is a an illustrative view showing an example of a configuration of an electronic device.

DETAILED DESCRIPTION (Explanation of Description Form, Basic Terminology, and Use Thereof in Present Invention)

In the present invention, if necessary for the sake of convenience, an embodiment will be described by being divided into a plurality of sections or the like. However, they are by no means independent of or distinct from each other unless particularly explicitly described otherwise, and one of the individual parts of a single example is details, modifications, and so forth of part or the whole of the others irrespective the order in which they are described. In principle, a repetitive description of like parts will be omitted. Also, each component in the embodiment is not indispensable unless particularly explicitly described otherwise, unless the component is theoretically limited to a specific number, or unless it is obvious from the context that the component is indispensable.

Likewise, even when such wording as "X comprised of A" is used in association with a material, a composition, or the like in the description of the embodiment or the like, it is not intended to exclude a material, a composition, or the like which contains an element other than A unless particularly explicitly described otherwise or unless it is obvious from the context that it excludes such a material, a composition, or the like. For example, when a component is mentioned, the wording means "X containing A as a main component" or the like. It will be appreciated that, even when a "silicon member" or the like is mentioned, it is not limited to pure silicon, and a member containing a SiGe (silicon/germanium) alloy, another multi-element alloy containing silicon as a main component, another additive, or the like is also included. Additionally, even when a gold plating, a Cu layer, a nickel plating, or the like is mentioned, it is assumed to include not only a pure gold plating, a pure Cu layer, a pure nickel plating, or the like, but also a member containing gold, Cu, nickel, or the like as a main component unless it is particularly explicitly described otherwise.

Further, when a specific numerical value or numerical amount is mentioned, it may be a numerical value either more or less than the specific numerical value unless particularly explicitly described otherwise, unless the numerical value is theoretically limited to the number, or unless it is obvious from the context that the numeral value is limited to the number.

In the individual drawings of the embodiment, the same or like parts are designated by the same or similar symbols or reference numerals, and the description thereof will not be repeated in principle.

In the accompanying drawings, hatching or the like may be omitted even in a cross section when hatching or the like results in complicated illustration or when the distinction between a portion to be illustrated with hatching or the like and a vacant space is distinct. In relation thereto, even when a hole is two-dimensionally closed, the background outline thereof may be omitted in such a case where it is obvious from the description or the like that the hole is two-dimensionally closed. On the other hand, even though not shown in a cross section, a portion other than a vacant space may be illustrated with hatching or a dot pattern to clearly show that the portion with hatching or a dot pattern is not a vacant space or clearly show the boundary of a region.

<Electronic Device>

Figure 2:
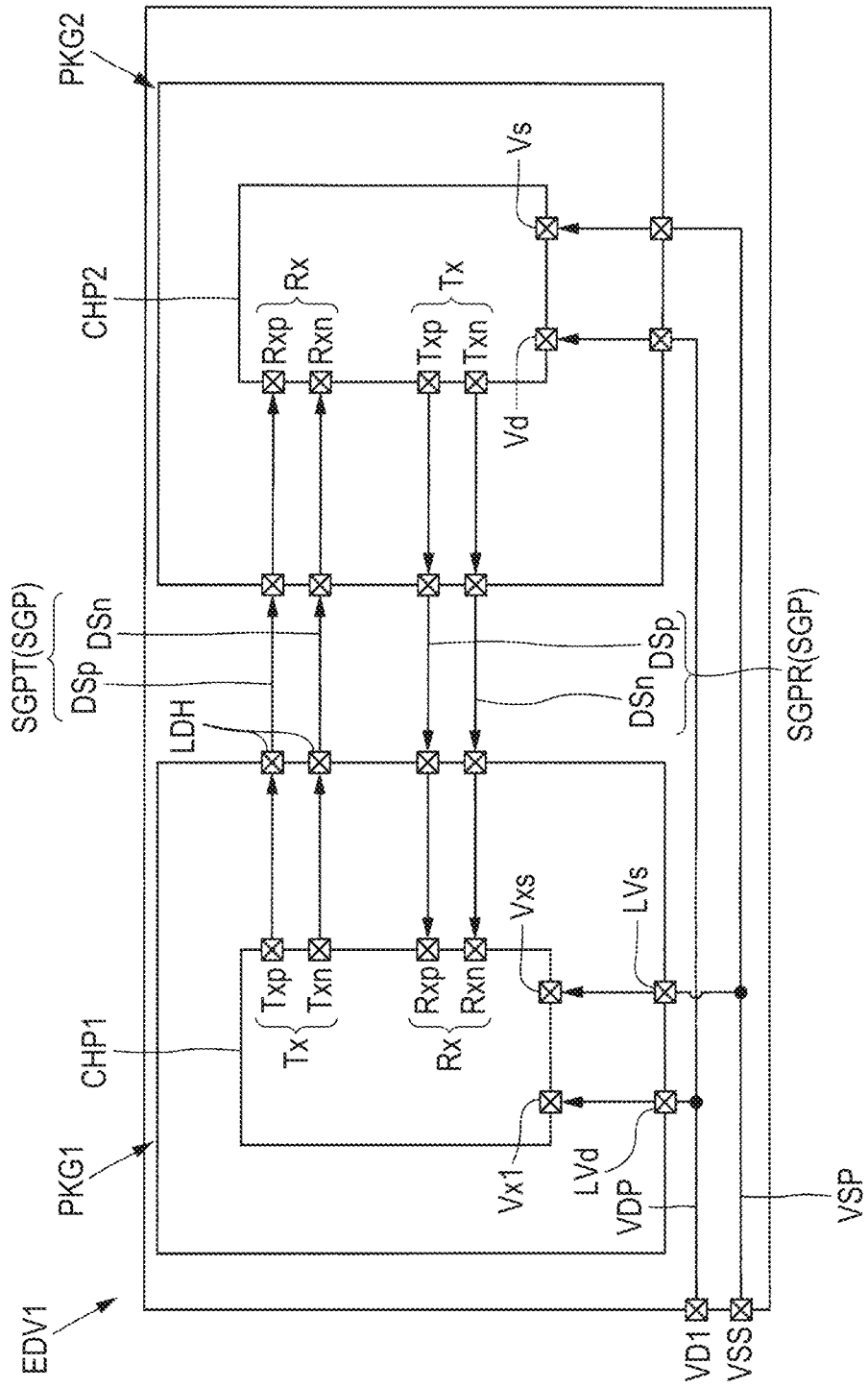
FIG. 2 is an illustrative view showing an example of a configuration of the circuits included in the electronic device shown in FIG. 1.
Figure 3:
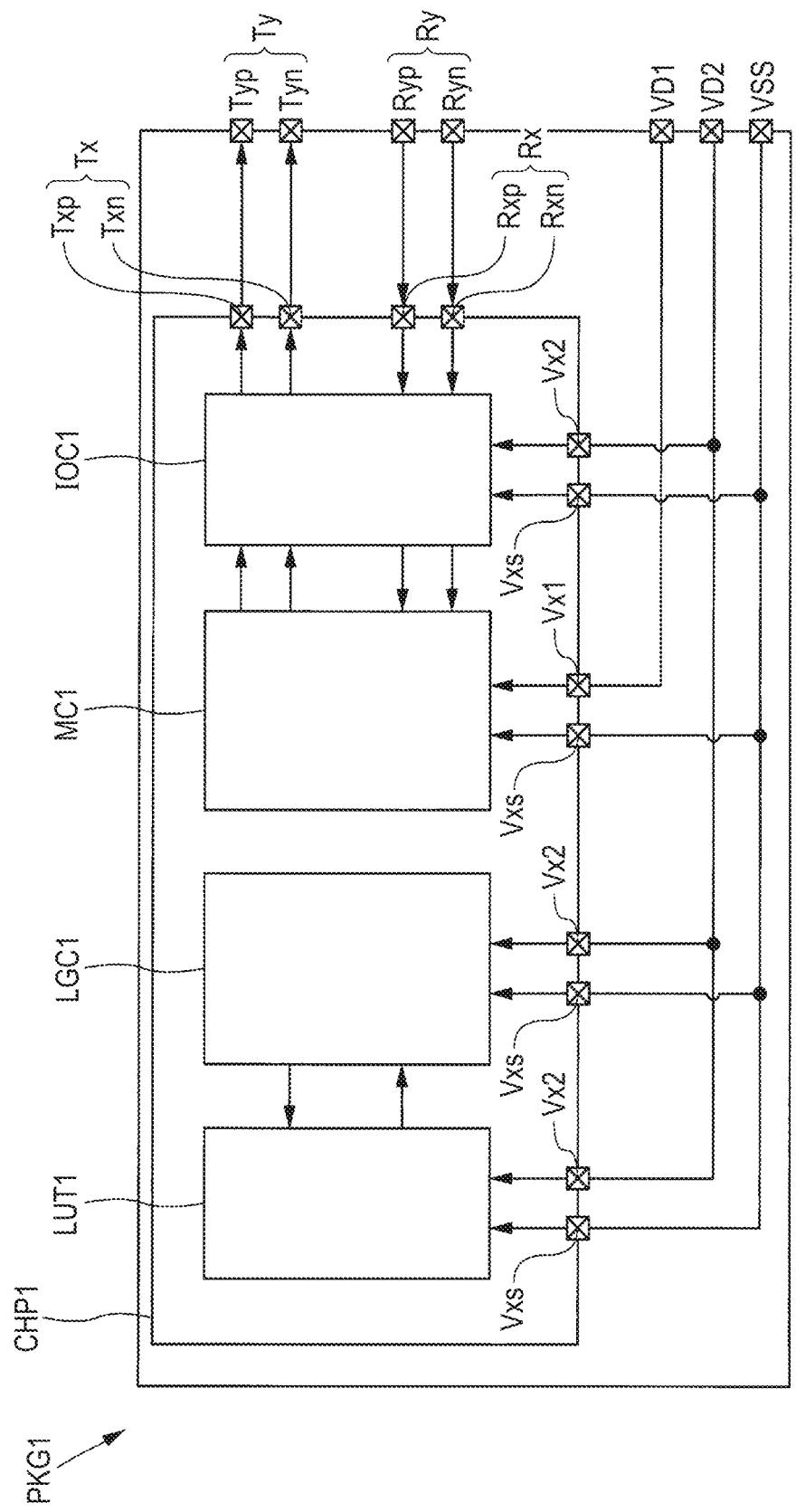
FIG. 3 is an illustrative view showing the details of an example of a configuration of the circuits included in one of the two semiconductor devices shown in FIG. 2.

First, using FIGS. 1 to 3, a description will be given of an example of a configuration of an electronic device in which a plurality of semiconductor devices (semiconductor packages) are mounted over a motherboard and an electric signal is transmitted between the plurality of semiconductor devices. FIG. 1 is an illustrative view showing an example of a configuration of the electronic device including the semiconductor devices in the present embodiment. FIG. 2 is an illustrative view showing an example of a configuration of the circuits included in the electronic device shown in FIG. 1. FIG. 3 is an illustrative view showing the details of an example of a configuration of the circuits included in one of the two semiconductor devices shown in FIG. 2. Note that, in FIG. 1, to clearly show that a semiconductor device PKG1 and a semiconductor device PKG2 are electrically coupled together, signal transmission paths SGP shown in FIG. 2 are schematically shown by the thick lines.

An electronic device (electronic equipment) EDV1 shown in FIG. 1 has a wiring substrate (motherboard or mounting substrate) MB1 and the semiconductor devices PKG1 and PKG2 mounted over the wiring substrate MB1. The semiconductor devices PKG1 and PKG2 are electrically coupled together via the signal transmission paths SGP formed in the wiring substrate MB1. Signals transmitted via the signal transmission paths SGP include a signal SGT output from the semiconductor device PKG1 and a signal SGR input to the semiconductor device PKG1. The signal transmission paths SGP include a signal transmission path SGPT which transmits the signal SGT and a signal transmission path SGPR which transmits the signal SGR.

In the example shown in FIG. 1, the signal SGT is output from the semiconductor device PKG1 and input to the semiconductor device PKG2. On the other hand, the signal SGR is output from the semiconductor device PKG2 and input to the semiconductor device PKG1. However, the device to which the signal SGT is output and the device from which the signal SGR is output are not limited to those in the example shown in FIG. and have various modifications. Since the semiconductor devices PKG1 and PKG2 shown in FIG. 1 have the same structure, the following will describe the semiconductor device PKG1 as a representative.

As shown in FIG. 2, the electronic device EDV1 has the plurality of signal transmission paths SGP. In the example shown in FIG. 2, each of the plurality of signal transmission paths SGP coupled to the semiconductor device PKG1 is a high-speed signal transmission path (high-speed transmission path) which transmits an electric signal at a transmission speed of, e.g., not less than 50 Gbps (Gigabit per second).

Each of the plurality of signal transmission paths SGP electrically coupling together a semiconductor chip CHP1 and a semiconductor chip CHP2 transmits an electric signal by a serial transmission method. Specifically, the semiconductor chip CHP1 has a SerDes circuit (SERializer/DESerializer) which converts a serial mode signal to a parallel mode signal and vice versa. The input signal which is input by the serial transmission method is converted by the SerDes circuit (input/output circuit) to a parallel mode signal. The SerDes circuit is included in an input/output circuit IOC1 of the semiconductor chip CHP1 shown in FIG. 3. The parallel mode signal is converted to a serial mode signal by the SerDes circuit and then output.

Signal transmission methods are roughly divided into a parallel transmission method which simultaneously transmits a plurality of bits using a plurality of transmission paths and the serial transmission method which successively transmits a plurality of bits using one or several transmission paths. In the case of using the parallel transmission method, it is possible to widen the band width of a data transfer rate, while inhibiting a clock frequency in each of the plurality of signal transmission paths from increasing. However, when the band width of the data transfer rate is widened in the parallel transmission method, the problem of a skew resulting from the transmission speed difference between the plurality of transmission paths is aggravated. Also, when the signal transmission speed is increased in the parallel transmission method, the number of the transmission paths increases. This increases the influence of crosstalk noise between the adjacent signal transmission paths. When the distance by which the adjacent signal transmission paths are spaced apart is increased to control crosstalk noise, the size of a semiconductor device increases.

On the other hand, in the case of using the serial transmission method, the influence of the skew when the signal transmission speed is increased is as small as can be substantially ignored compared to that in the case of using the parallel transmission method. In addition, in the serial transmission method, the number of the signal transmission paths SGP can be reduced compared to that in the parallel transmission method. As a result, it is possible to reduce the influence of crosstalk noise between the adjacent signal transmission paths. Otherwise, the reduced number of the signal transmission paths allows a reduction in the size of the semiconductor device.

Note that the semiconductor device PKG1 may also have a low-speed signal transmission path which transmits an electric signal at a transmission speed (e.g., about not more than 3 Gbps) lower than the transmission speed (e.g., not less than 50 Gbps) of each of the signal transmission paths SGP. In other words, the semiconductor device PKG1 may also have a low-speed signal transmission path which transmits an electric signal at a first transmission speed and a high-speed signal transmission path which transmits an electric signal at a second transmission speed higher than the first transmission speed.

Each of the signal transmission paths SGP shown in FIG. includes a pair of differential signal transmission paths DSp and DSn which transmit a differential signal. The pair of differential signal transmission paths DSp and DSn form a differential pair. In the differential signal transmission paths DSp and DSn, currents in opposite phases flow. The differential signal is transmitted as the potential difference between the differential pair. In the case of using a differential transmission method, the amplitude of a signal waveform can be reduced compared to that in the case of using a single end transmission method which allows an electric signal to flow in one signal transmission path. In addition, the differential transmission method can more significantly reduce the influence of noise from the outside than the single end transmission method. Note that, in the present embodiment, as an example of each of the signal transmission paths SGP, a mode of implementation in which a differential signal is transmitted via the pair of differential signal transmission paths DSp and DSn will be described. However, as the transmission method of the signal transmission path SGP, not only the differential transmission method, but also various modifications such as, e.g., the single end transmission method can be used appropriately.

The semiconductor chip CHP1 of the semiconductor device PKG1 shown in FIG. 2 includes a plurality of electrodes. The plurality of electrodes of the semiconductor chip CHP1 include an electrode (output signal electrode) Tx (specifically, electrodes Txp and Txn from which the pair of differential signals are output) to which the signal SGT (see FIG. 1) as an output signal (transmission signal) is transmitted. The plurality of electrodes of the semiconductor chip CHP1 also include an electrode (input signal electrode) Rx (specifically, electrodes Rxp and Rxn to which a pair of differential signals are input) to which the signal SGR (see FIG. 1) as an input signal (reception signal) is transmitted.

As shown in FIG. 3, the plurality of electrodes of the semiconductor chip CHP1 also include an electrode Vxs which supplies a reference potential VSS to a memory circuit (core circuit or first circuit) MC1 in the semiconductor chip CHP1 and an electrode Vx1 which supplies a power supply potential (first potential) VD1 different from the reference potential VSS to the memory circuit MC1. To the semiconductor chip CHP1 (specifically, the memory circuit MC1 included in the semiconductor chip CHP1), the power supply potential VD1 is supplied via the electrode Vx1. Also, to the semiconductor chip CHP1 (specifically, the memory circuit MC1 included in the semiconductor chip CHP1), the reference potential VSS is supplied via the electrode Vxs.

In the example shown in FIG. 3, the semiconductor chip CHP1 has not only the memory circuit MC1 capable of storing data, but also the input/output circuit IOC1 which receives or outputs a signal, a logic circuit LGC1 which controls the respective operations of the memory circuit MC1 and the input/output circuit IOC1, and a lookup table (transfer destination information storage circuit) LUT1. The input/output circuit IOC1 is an interface circuit which includes the SerDes circuit described above, a driver circuit, and the like and controls signal input and signal output between the outside and inside of the semiconductor chip CHP1. The logic circuit LGC1 calculates the position of a memory cell in which signal data is stored or the position of a port from which the signal data is output on the basis of transfer destination information extracted from the header information of the signal data or the information stored in the lookup table LUT1. In the lookup table LUT1, data such as the destination of transferred data (position of the memory cell in which the signal data is stored) is stored.

The plurality of electrodes of the semiconductor chip CHP1 include the electrode Vxs which supplies the reference potential VSS to the input/output circuit IOC1 of the semiconductor chip CHP1 and an electrode Vx2 which supplies a power supply potential VD2 to the input/output circuit IOC1. The plurality of electrodes of the semiconductor chip CHP1 also include the electrode Vxs which supplies the reference potential VSS to the logic circuit LGC1 of the semiconductor chip CHP1 and the electrode Vx2 which supplies the power supply potential VD2 to the logic circuit LGC1. The plurality of electrodes of the semiconductor chip CHP1 also include the electrode Vxs which supplies the reference potential VSS to the lookup table LUT1 of the semiconductor chip CHP1 and the electrode Vx2 which supplies the power supply potential VD2 to the lookup table LUT1. In the example of the present embodiment, the power supply potential VD1 and the power supply potential VD2 which are shown in FIG. 3 are different. However, in a modification, the power supply potential VD1 and the power supply potential VD2 may also be the same. The reference potential VSS is, e.g., a ground potential, and each of the power supply potentials VD1 and VD2 is higher in potential level than the reference potential VSS.

Note that the power supply potentials supplied to the individual circuits included in the semiconductor chip CHP1 are not limited to those in the example shown in FIG. 3. For example, it may also be possible to supply four different types of potentials to four types of circuits. Also, it may also be possible that, e.g., the power supply potential VD1 and the power supply potential VD2 are at the same potential level.

<Semiconductor Device>

Figure 4:
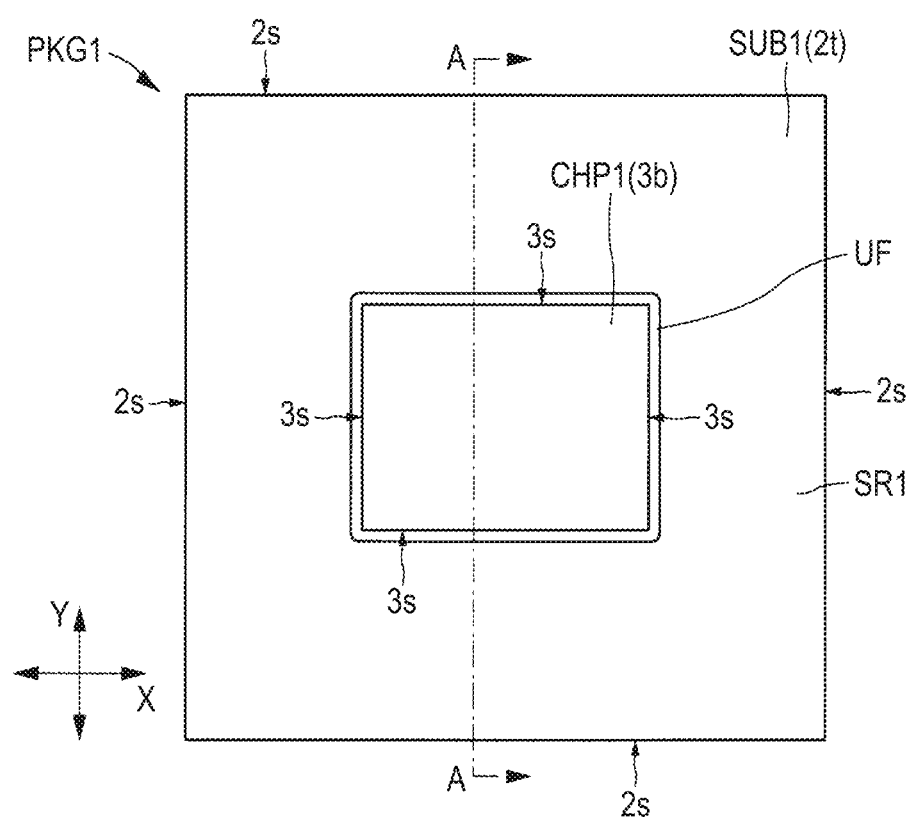
FIG. 4 is a top view of one of the two semiconductor devices shown in FIG. 1.
Figure 5:
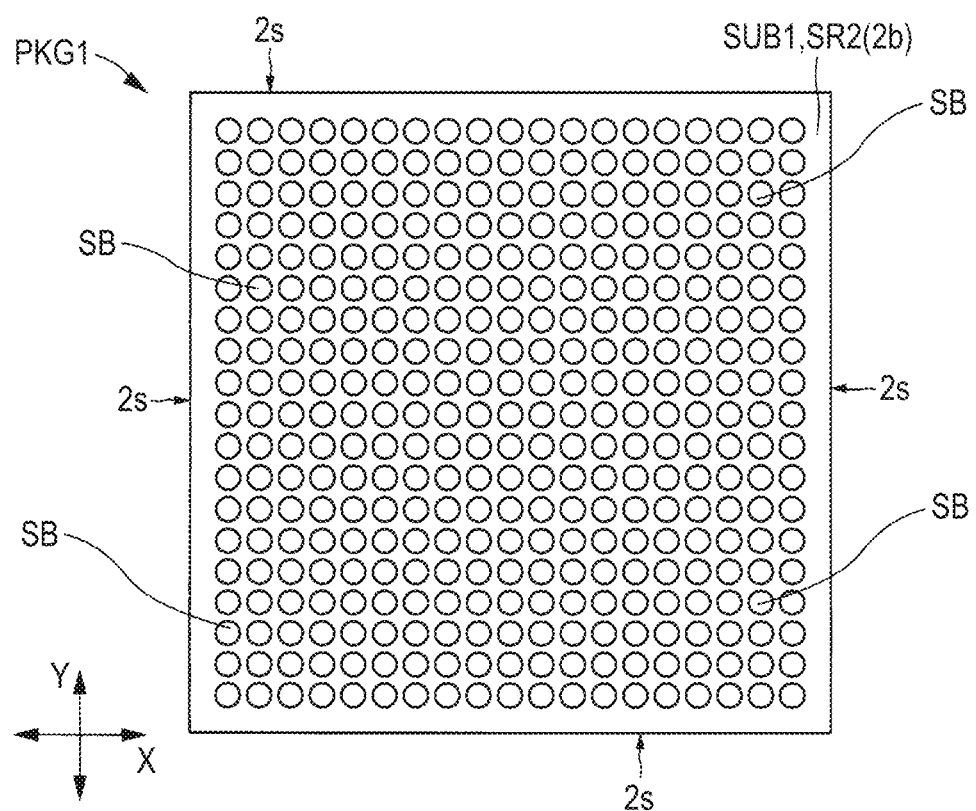
FIG. 5 is a bottom view of the semiconductor device shown in FIG. 4.
Figure 6:
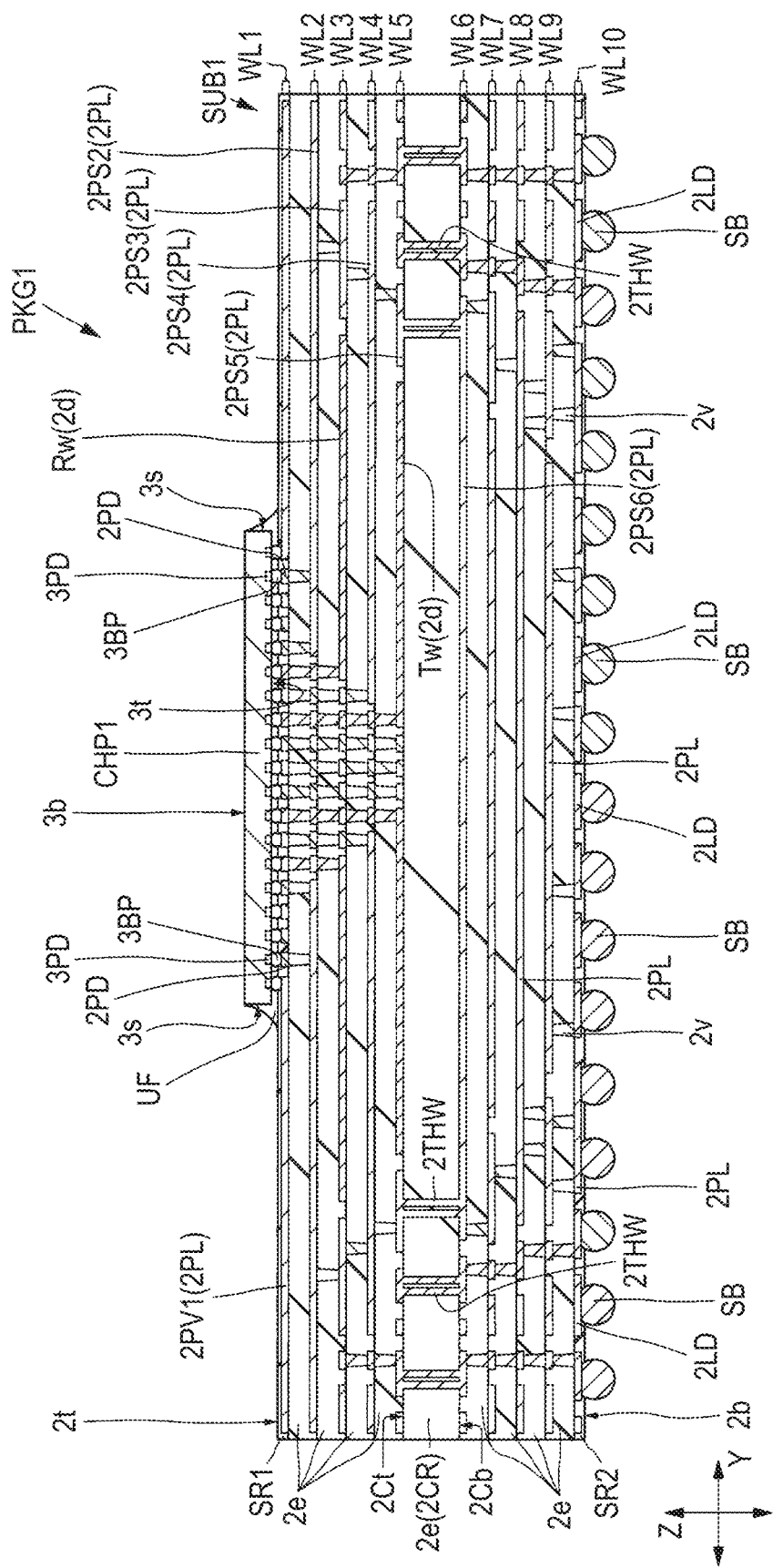
FIG. 6 is a cross-sectional view along the line A-A in FIG. 4.
Figure 7:
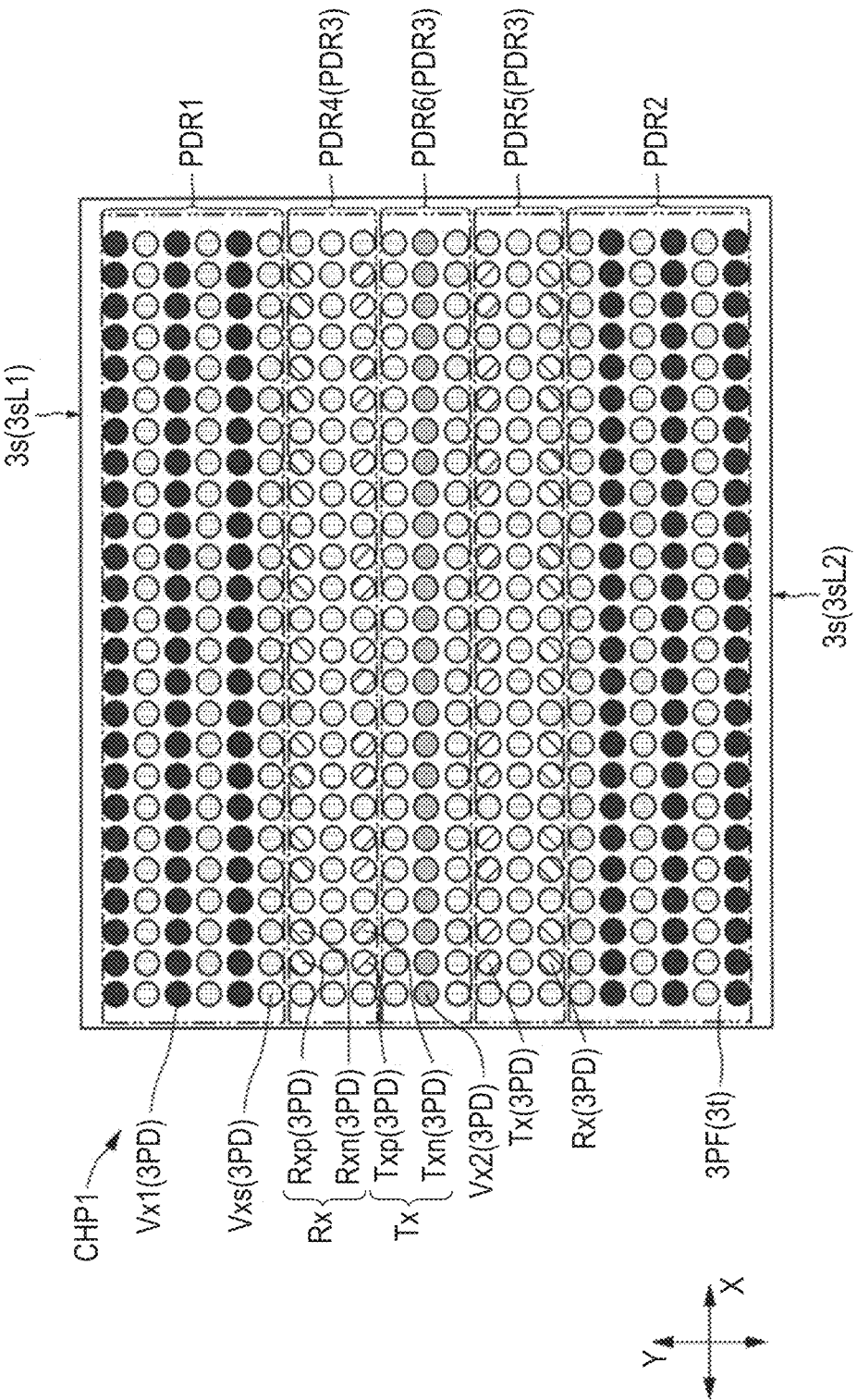
FIG. 7 is a plan view of the surface of the semiconductor chip shown in FIG. 6 where electrodes are disposed.

Next, using the semiconductor device PKG1 shown in FIG. 1 as an example, a description will be given of an example of a structure of the signal transmission paths in the semiconductor device PKG1. First, the outline of the semiconductor device PKG1 is described, and then a description will be given of the structure of the signal transmission paths. FIG. 4 is a top view of one of the two semiconductor devices shown in FIG. 1. FIG. 5 is a bottom view of the semiconductor device shown in FIG. 1. FIG. 6 is a cross-sectional view along the line A-A in FIG. 4. FIG. 7 is a plan view of the surface of the semiconductor chip shown in FIG. 6 where the electrodes are disposed.

Note that, in the present embodiment, a mode of implementation in which the number of the electrodes, the number of the terminals, or the number of the wires is small is described by way of example. However, the number of the electrodes, the number of the terminals, or the number of the wires is not limited to that in the example shown in the present embodiment, and various modifications can be used appropriately.

The semiconductor device PKG1 in the present embodiment shown in FIG. 4 includes a wiring substrate SUB1 and the semiconductor chip CHP1 mounted over the wiring substrate SUB1.

As shown in FIG. 6, the wiring substrate SUB1 has an upper surface (surface, main surface, chip mounting surface, or first main surface) 2t over which the semiconductor chip CHP1 is mounted and a lower surface (surface, main surface, mounting surface, or second main surface) 2b opposite to the upper surface 2t. The wiring substrate SUB1 also has a plurality of side surfaces 2s (see FIG. 4) crossing the respective outer edges of the upper surface 2t and the lower surface 2b. In the case of the present embodiment, each of the upper surface 2t (see FIG. 4) and the lower surface 2b (see FIG. 5) of the wiring substrate SUB1 has a quadrilateral shape.

The wiring substrate SUB1 is an interposer (interposing substrate) which electrically couples together the semiconductor chip CHP1 mounted over the upper surface 2t and a wiring substrate MB1 (see FIG. 1) as the motherboard (mounting substrate). The wiring substrate SUB1 has a plurality of wiring layers (ten layers in the example shown in FIG. 6) WL1, WL2, WL3, WL4, WL5, WL6, WL7, WL8, WL9, and WL10 which electrically couple together terminals over the upper surface 2t as the chip mounting surface and terminals under the lower surface 2b as the mounting surface. Each of the wiring layers has a conductor pattern of wires as paths which supply an electric signal and power and the like. Between the individual wiring layers, insulating layers 2e are disposed. The individual wiring layers are electrically coupled together via vias 2v as interlayer conductive paths extending through the insulating layers 2e or through hole wires 2THW. The wiring substrate SUB1 includes conductor planes (conductor patterns) 2PL as large-area conductor patterns in the plurality of respective wiring layers.

The major part of the wiring layer WL1 disposed closest to the upper surface 2t among the plurality of wiring layers is covered with an insulating layer SR1 as a solder resist film. Also, the major part of the wiring layer WL10 disposed closest to the lower surface 2b is covered with an insulating layer SR2 as a solder resist film.

The wiring substrate SUB1 is formed by, e.g., stacking a plurality of wiring layers over each of an upper surface 2Ct and a lower surface 2Cb of an insulating layer (core material or core insulating layer) 2CR made of a prepreg obtained by impregnating glass fiber with a resin using a build-up method. The wiring layer WL5 over the upper surface 2Ct of the insulating layer 2CR and the wiring layer WL6 over the lower surface 2Cb of the insulating layer 2CR are electrically coupled together via the plurality of through hole wires 2THW embedded in a plurality of through holes provided to extend through the insulating layer 2CR from one of the upper and lower surfaces 2Ct and 2Cb to the other.

Over the upper surface 2t of the wiring substrate SUB1, a plurality of pads (terminals, bonding pads, bonding leads, or semiconductor chip coupling terminals) 2PD are formed to be electrically coupled to the semiconductor chip CHP1. Under the lower surface 2b of the wiring substrate SUB1, a plurality of lands 2LD as the external input/output terminals of the semiconductor device PKG1 are formed. The plurality of pads 2PD and the plurality of lands 2LD are electrically coupled together via wires 2d, the vias 2v, and the through hole wires 2THW.

Note that, in FIG. 6, the wiring substrate SUB1 having the ten wiring layers is shown by way of example but, in a modification, a wiring substrate having, e.g., eleven or more layers or eight or less wiring layers may also be used.

In the example shown in FIG. 6, to the plurality of respective lands 2LD, solder balls (solder members, external terminals, electrodes, or external electrodes) SB are coupled. The solder balls SB are conductive members which electrically couple together a plurality of terminals (illustration thereof is omitted) over the wiring substrate MB1 and the plurality of lands 2LD when the semiconductor device PKG1 is mounted over the wiring substrate MB1 shown in FIG. 1. The solder balls SB are, e.g., Sn—Pb solder members containing lead (Pb) or solder members made of a so-called lead-free solder which does not substantially contain Pb. Examples of the lead-free solder include a pure tin (Sn) solder, a tin-bismuth (Sn—Bi) solder, a tin-coper-silver (Sn—Cu—Ag) solder, a tin-copper (Sn—Cu) solder, and the like. The lead-free solder mentioned herein means a solder having a lead (Pb) content of not more than 0.1 wt %. The content is determined as a RoHS (Restriction of Hazardous Substances) directive standard.

As shown in FIG. 5, the plurality of solder balls SB are arranged in rows and columns (in the form of an array or a matrix). The plurality of lands 2LD (see FIG. 6) to which the plurality of solder balls SB are joined are also arranged in rows and columns (in the form of a matrix), though the illustration thereof is omitted in FIG. 5. The semiconductor device in which the plurality of external terminals (solder balls SB or lands 2LD) are thus arranged in rows and columns over the mounting surface of the wiring substrate SUB1 is referred to as an area-array-type semiconductor device. The area-array-type semiconductor device is preferable in that the mounting surface (lower surface 2b) of the wiring substrate SUB1 can effectively be used as a space where the external terminals are disposed and, even when the number of the external terminals is increased, it is possible to inhibit the footprint of the semiconductor device from being increased. Briefly, the semiconductor device in which the number of external terminals increases as the functionality and integration thereof increases can be mounted in a smaller space.

The semiconductor device PKG1 includes the semiconductor chips CHP1 mounted over the wiring substrate SUB1. As shown in FIG. 6, each of the semiconductor chips CHP1 includes a top surface (main surface or upper surface) 3t and a back surface (main surface or lower surface) 3b opposite to the top surface 3t. The semiconductor chip CHP1 also includes a plurality of side surfaces 3s crossing the top surface 3t and the back surface 3b. As shown in FIG. 4, in plan view, the semiconductor chip CHP1 has a quadrilateral outer shape smaller in plane area than the wiring substrate SUB1. In the example shown in FIG. 4, the semiconductor chip CHP1 is mounted over the center portion of the upper surface 2t of the wiring substrate SUB1, and the four side surfaces 3s of the semiconductor chip CHP1 extend along the four side surfaces 2s of the wiring substrate SUB1.

As shown in FIG. 7, over the top surface 3t of the semiconductor chip CHP1, a plurality of electrodes (pads, electrode pads, or bonding pads) 3PD are formed. The plurality of electrodes 3PD are exposed from an insulating film (passivation film or protective insulating film) 3PF covering the major part of the top surface 3t of the semiconductor chip CHP1. Over the top surface 3t, the plurality of electrodes 3PD are arranged in a plurality of rows which are arranged in directions extending from the outermost rows closest to the outer edge of the top surface 3t toward the center of the top surface 3t. In the present embodiment, over the top surface 3t of the semiconductor chip CHP1, the plurality of electrodes 3PD are arranged in the rows and columns (in the form of a matrix or an array). By arranging the plurality of electrodes 3PD of the semiconductor chip CHP1 in the rows and the columns, the top surface 3t of the semiconductor chip CHP1 can effectively be used as the space where the electrodes are disposed. As a result, even when the number of the electrodes of the semiconductor chip CHP1 is increased, an increased plane area can favorably be inhibited.

As also shown in FIG. 6, the semiconductor chip CHP1 is mounted over the wiring substrate SUB1 with the top surface 3t facing the upper surface 2t of the wiring substrate SUB1. Such a mounting method is referred to as a face-down mounting method or a flip-chip coupling method.

In the main surface of the semiconductor chip CHP1 (specifically, a semiconductor element formation region provided in the element formation surface of a semiconductor substrate as the base material of the semiconductor chip CHP1), a plurality of semiconductor elements (circuit elements) are formed, though the illustration thereof is omitted. The plurality of electrodes 3PD are electrically coupled to the plurality of semiconductor elements via wires (the illustration thereof is omitted) formed in the wiring layers disposed in the semiconductor chip CHP1 (specifically, between the top surface 3t and the semiconductor element formation region not shown).

The semiconductor chip CHP1 (specifically, the base material of the semiconductor chip CHP1) is made of, e.g., silicon (Si). Over the top surface 3t, the insulating film 3PF (see FIG. 7) covering the base material of the semiconductor chip HCP1 and the wires is formed. The respective portions of the plurality of electrodes 3PD are exposed from the insulating film 3PF in the openings formed in the insulating film. The plurality of electrodes 3PD are made of a metal which is, e.g., aluminum (Al) in the present embodiment.

As also shown in FIG. 6, to the plurality of respective electrodes 3PD, protruding electrodes 3BP are coupled. The plurality of electrodes 3PD of the semiconductor chip CHP1 and the plurality of pads 2PD of the wiring substrate SUB1 are electrically coupled together via the plurality of protruding electrodes 3BP. The protruding electrodes (bump electrodes) 3BP are metal members (conductive members) formed to protrude over the top surface 3t of the semiconductor chip CHP1. In the present embodiment, the protruding electrodes 3BP are so-called solder bumps each including a solder member stacked over the electrode 3PD via an underlying metal film (under-bump metal). Examples of the underlying metal film include a multi-layer film in which, e.g., titanium (Ti), copper (Cu), and nickel (Ni) are stacked over the surface coupled to the electrodes 3PD (in which a gold (Au) film may also be formed over the nickel film). As the solder member included in each of the solder bumps, a solder member containing lead or a lead-free solder can be used in the same manner as in the solder balls SB described above. When the semiconductor chip CHP1 is mounted over the wiring substrate SUB1, solder bumps are formed in advance over both of the plurality of electrodes 3PD and the plurality of pads 2PD, and a heating process (reflow process) is performed in the state where the solder bumps are in contact with each other. As a result, the solder bumps are integrated with each other to form the protruding electrodes 3BP. In a modification of the present embodiment, pillar bumps (columnar electrodes) each including a solder film formed over the tip surface of a conductor pillar made of copper (Cu) or nickel (Ni) may also be used as the protruding electrodes 3BP.

As also shown in FIG. 6, between the semiconductor chip CHP1 and the wiring substrate SUB1, an under-fill resin (insulating resin) UF is disposed. The under-fill resin UF is disposed so as to fill up the space between the top surface 3t of the semiconductor chip CHP1 and the upper surface 2t of the wiring substrate SUB1. The under-fill resin UF is made of an insulating (non-conductive) material (e.g., resin material) and disposed so as to seal the electrically coupled portions (joined portions of the plurality of protruding electrodes 3BP) of the semiconductor chip CHP1 and the wiring substrate SUB1. By thus covering the joined portions of the plurality of protruding electrodes 3BP and the plurality of pads 2PD with the under-fill resin UF, it is possible to reduce the stress formed in the electrically coupled portions of the semiconductor chip CHP1 and the wiring substrate SUB1. It is also possible to reduce the stress generated in the joined portions of the plurality of electrodes 3PD of the semiconductor chip CHP1 and the plurality of protruding electrodes 3BP. It is also possible to protect the main surface of the semiconductor chip CHP1 where the semiconductor elements (circuit elements) are formed.

Note that, in the example shown in FIG. 6), over the back surface 3b of the semiconductor chip CHP1, another member is not mounted but, in a modification, another member may also be mounted over the back surface 3b of the semiconductor chip CHP1. For example, to the back surface 3b of the semiconductor chip CHP1, a metal plate may also be bonded. The metal plate functions as a heat dissipation plate (heat spreader or heat release member) to be able to improve the heat dissipation property of the semiconductor device PKG1.

Also, in the example shown in FIGS. 4 and 6, over the wiring substrate SUB1 of the semiconductor device PKG1, only the semiconductor chip CHP1 is mounted and no other electronic components are mounted. However, in a modification, in addition to the semiconductor chip CHP1, another electronic component may also be mounted over the semiconductor substrate SUB1. For example, for the purpose of stabilizing a drive voltage supplied to the semiconductor chip CHP1, a capacitor may also be mounted over the wiring substrate SUB1. Alternatively, for example, a capacitor which is inserted in and coupled in series to the signal transmission path coupled to the semiconductor chip CHP1 to cut a dc component in an ac signal may also be mounted over the wiring substrate SUB1.

<Circuit Operations in Semiconductor Chip>

Figure 8:
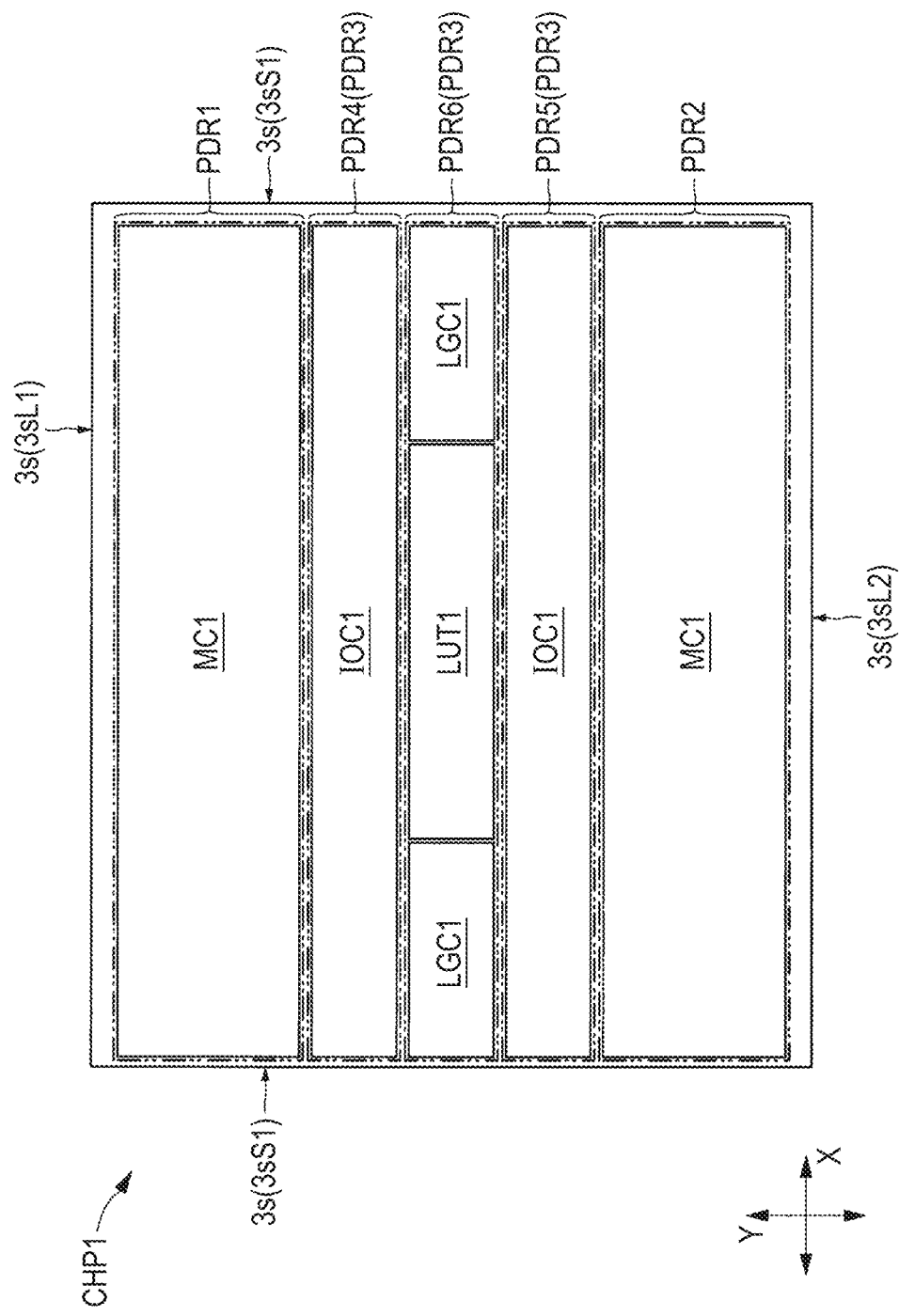
FIG. 8 is a plan view showing an example of a layout of the circuits included in the semiconductor chip shown in FIG. 7 in plan view.

Next, a description will be given of circuit operations in the semiconductor chip CHP1 included in the semiconductor device PKG1. FIG. 8 is a plan view showing an example of a layout of the circuits included in the semiconductor chip shown in FIG. 7 in plan view. In FIGS. 7 and 8, the boundaries between regions PDR1 to PDR6 described later are shown by the two-dot-dash lines. In FIG. 7, for identification of the types of signals and potentials supplied to the individual transmission paths, hatching and patterns are added thereto. To the transmission paths for an output signal (transmission signal) and the transmission paths for an input signal (reception signal), different kinds of hatching are added. To the transmission paths for the reference potential and the transmission paths for the power supply potentials, dot patterns in different tones are added according to the types of supplied potentials.

As described using FIG. 1, in the signal transmission paths SGP extending from the semiconductor chip CHP1 to the semiconductor chip CHP2, a signal is transmitted using the serial transmission method. The electronic device EDV1 (see FIG. 1) including the semiconductor device PKG1 in the present embodiment includes the signal transmission paths SGP each of which transmits an electric signal at a transmission speed of, e.g., not less than 50 Gbps. For example, when there are the sixteen signal transmission paths SGP each of which transmits an electric signal at a transmission speed of 56 Gbps, the band width of a data transfer rate in the semiconductor device PKG1 is about 900 Gbps. When a differential signal is transmitted as in the present embodiment, the number of the wires required as the signal transmission paths is doubled to 32. Also, when signal transmission paths for an output signal and signal transmission paths for an input signal are separately provided as in the semiconductor device PKG1 in the present embodiment, the number of the wires required as the signal transmission paths is further doubled to 64. When the band width of the data transfer rate required of the semiconductor device PKG1 is assumed to be, e.g. 2 Tbps (Terabit per second), it is sufficient for the number of the signal transmission paths SGP to be 36 (the number of the wires required to transmit the differential signals is 72). As described above, in the case of using the serial transmission method, even when an electric signal is transmitted at a transmission speed of not less than 50 Gbps in each of the plurality of signal transmission paths, it is substantially unnecessary to give consideration to the problem of a skew.

However, when a clock frequency for signal transmission increases, a signal waveform is more likely to deteriorate due to noise from the outside. Accordingly, for the signal transmission paths SGP, it is important to take a measure for reducing the influence of noise from the outside. When the band width of the data transfer rate increases, the amount of data processed per unit time increases, and consequently the power consumed by the core circuit increases. This leads to the need for a power supply path capable of stably supplying power in response to a change in the power needed by the core circuit when the power needed by the core circuit abruptly increases.

The wires included in the semiconductor chip CHP1 shown in FIG. 6 are smaller in width and thickness than the wires included in the wiring substrate SUB1. Accordingly, a wiring path in the semiconductor chip CHP1 has a wiring resistance higher than that of a wiring path in the wiring substrate SUB1. Therefore, in terms of reducing a loss in the transmission of a signal or potential signals, a wire routing distance in the semiconductor chip CHP1 is preferably reduced. In addition, the time required for data transmission in the semiconductor chip CHP1 is preferably minimized.

When an electric signal is input to the input/output circuits IOC1 of the semiconductor chip CHP1 shown in FIG. 8, the logic circuits LGC1 calculate the position of the one of the plurality of memory cells included in the memory circuit MC1 in which data is to be stored. The data of the input signal is transmitted to the position of the memory cell specified on the basis of a command from the logic circuits LGC1 and stored therein. The logic circuits LGC1 extract transfer destination information from the header information included in the data and perform calculation to determine an output port on the basis of the transfer destination information and the information stored in the lookup table LUT1. The input/output circuits IOC1 include a plurality of output ports, and calculation is performed to determine the one of the plurality of output ports from which a signal is to be output. The logic circuits LGC1 also make preparations to transmit the signal from the output port determined by the calculation and transmit a command for moving the data from the memory cell storing the data to the output port. Then, the input/output circuits IOC1 output the data as an output signal to the outside of the semiconductor chip CHP1. In the case of performing such a circuit operation, the time required by a data write process and a data read process can be reduced by reducing not only the time required for data transmission between the input/output circuits IOC1 and the memory circuits MC1, but also the time required for data transmission between the logic circuits LGC1 and the input/ output circuits IOC1 or between the logic circuits LGC1 and the memory circuits MC1. In addition, by reducing a data transmission distance between the input/output circuits IOC1 and the memory circuits MC1, it is possible to inhibit the degradation of a signal level in the data write process and the data read process.

In the case of using the semiconductor chip CHP1 in the present embodiment, as shown in FIG. 8, the input/output circuits IOC1 are disposed between the memory circuits MC1 located at two positions in a Y-direction in plan view. In other words, in plan view, the semiconductor chip CHP1 has a side (long side or first side) 3sL1, a side (long side or second side) 3sL2 opposite to the side 3sL1, the region PDR1 located between the sides 3sL1 and 3sL2, the region PDR2 located between the region PDR1 and the side 3sL2, and the region PDR3 located between the regions PDR1 and PDR2. The memory circuits MC1 are present in the regions PDR1 and PDR2, and absent in the region PDR3. The input/output circuit LOCI is present in the region PDR3, and absent in the regions PDR1 and PDR2.

As an example studied with regard to the example in FIG. 8, there is a semiconductor chip in which, in the Y-direction, the input/output circuits IOC1 are disposed along the side 3sL1 and the side 3sL2, and the memory circuits MC1 are disposed between the input/output circuits IOC1. The data input to the input/output circuits IOC1 is not constantly stored in the memory cell closest thereto in the memory circuits MC1. Consequently, to reduce the time required for data transmission between the input/output circuits IOC1 and the memory circuits MC1, it is necessary to reduce the maximum lengths of the paths electrically coupling together the input/output circuits IOC1 and the memory circuits MC1. In the case where the semiconductor chip CHP1 has the circuit layout shown in FIG. 8, the maximum lengths of the paths electrically coupling together the input/output circuits IOC1 and the memory circuits MC1 can be reduced compared to that in the foregoing examined example.

In the example shown in FIG. 8, in the Y-direction, each of the logic circuits LGC1 and the lookup table LUT1 is disposed between the input/output circuits IOC1. In other words, the region PDR3 includes a region PDR4 located between the regions PDR1 and PDR2, a region PDR5 located between the regions PDR4 and PDR2, and a region PDR6 located between the regions PDR4 and PDR5. The input/output circuits IOC1 are present in the regions PDR4 and PDR5, and absent in the region PDR6. The logic circuits LGC1 and the lookup table LUT1 are present in the region PDR6, and absent in the regions PDR4 and PDR5. When the input/output circuits IOC1 and the logic circuits LGC1 have the circuit layout located internally of the memory circuits MC1 in the Y-direction as in the semiconductor chip CHP1 shown in FIG. 8, it is possible to reduce the time required to transmit data or a command in the semiconductor chip CHP1.

As shown in FIG. 7, the semiconductor chip CHP1 in the present embodiment includes the plurality of electrodes 3PD arranged in the plurality of rows over the top surface 3t. The plurality of electrodes 3PD of the semiconductor chip CHP1 include the plurality of electrodes (input signal electrodes or reception electrodes) Rx to which the input signal (signal SGR shown in FIG. 1) input to the semiconductor chip CHP1 is transmitted. Specifically, the electrodes Rx include the electrodes Rxp and the electrodes Rxn which are included in the differential pairs. The plurality of electrodes 3PD also include the plurality of electrodes (output signal electrodes) Tx to which the output signal (signal SGT shown in FIG. 1) output from the semiconductor chip CHP1 is transmitted. Specifically, the electrodes Tx include the electrodes Txp and the electrodes Txn which are included in the differential pairs. The plurality of electrodes 3PD also include the plurality of electrodes (reference potential electrodes) Vxs which supply the reference potential VSS (see FIG. 3) to the memory circuits MC1 of the semiconductor chip CHP1 and the plurality of electrodes (first potential electrodes) Vx1 which supply the power supply potential VD1 (see FIG. 3) different from the reference potential VSS to the memory circuits MC1. The plurality of electrodes 3PD also include the plurality of electrodes (reference potential electrodes) Vxs which supply the reference potential VSS (see FIG. 3) to the logic circuits LGC1 of the semiconductor chip CHP1 and the plurality of electrodes (second potential electrodes) Vx2 which supply the power supply potential VD2 (see FIG. 3) to the logic circuits LGC1.

Among the plurality of electrodes 3PD, the plurality of electrodes Rx and the plurality of electrodes Tx which are included in the signal transmission paths are each arranged in the region PDR3. Specifically, the plurality of electrodes Rx and the plurality of electrodes Tx are arranged in each of the regions PDR4 and PDR5. In other words, the plurality of electrodes Rx and the plurality of electrodes Tx overlap the input/output circuits IOC1 shown in FIG. 8 in plan view. Since the electrodes Rx and the electrodes Tx which are electrically coupled to the input/output circuits IOC1 are arranged at positions overlapping the input/output circuits IOC1 in plan view, the routing distance of the signal transmission path in the semiconductor chip CHP1 can be reduced.

Among the plurality of electrodes 3PD, the plurality of electrodes Vx1 and the plurality of electrodes Vxs are arranged in each of the regions PDR1 and PDR2. In other words, the plurality of electrodes Vx1 and the plurality of electrodes Vsx overlap the memory circuits MC1 shown in FIG. 8 in plan view. Since the electrodes Vx1 and the electrodes Vxs which are electrically coupled to the memory circuits MC1 are thus arranged at positions overlapping the memory circuits MC1 in plan view, the routing distances of the power supply paths in the semiconductor chip CHP1 can be reduced. In this case, a power loss in the semiconductor chip CHP1 can be reduced to allow power supplies to the memory circuits MC1 to be stabilized. Since the plurality of electrodes Vx1 and the plurality of electrodes Vxs are arranged in each of the regions PDR1 and PDR2, the path which supplies power to one of the memory circuits M1 is branched to a plurality of paths. In this case, when the power need abruptly increases in a portion of the memory circuit MC1, the power is supplied from the plurality of power supply paths to the portion where the power need is increased. As a result, it is possible to stably supply power in response to a change in power need.

Among the plurality of electrodes 3PD, the plurality of electrodes Vx2 and the plurality of electrodes Vxs are each arranged in the region PDR6. In other words, the plurality of electrodes Vx2 and the plurality of electrodes Vxs overlap the logic circuits LGC1 shown in FIG. 8 in plan view. Thus, the electrodes Vx2 and the electrodes Vxs which are electrically coupled to the logic circuits LGC1 are arranged at positions overlapping the logic circuits LGC1 in plan view to be able to reduce the routing distances of the power supply paths in the semiconductor chip CHP1. In this case, a power loss in the semiconductor chip CHP1 can be reduced to allow power supplies to the logic circuits LGC1 to be stabilized. In addition, since the plurality of electrodes Vx2 and the plurality of electrodes Vxs are arranged in the region PDR6, the path which supplies power to one of the logic circuits LGC1 is branched to a plurality of paths. In this case, when the power need abruptly increases in a portion of the logic circuit LGC1, power is supplied from the plurality of power supply paths to the portion where the power need is increased. As a result, it is possible to stably supply power in response to a change in power need.

However, it has been found that, in the case of using a structure in which the input/output circuits IOC1 are collectively disposed at the middle portion of the semiconductor chip CHP1 in the Y-direction as shown in FIG. 8, a new problem arises. In the case of using a structure in which, e.g., the input/output circuits IOC1 are arranged in the peripheral region of the semiconductor chip CHP1 and the memory circuits MC1 as the core circuits are disposed at the middle of the semiconductor chip CHP1, a large-area conductor pattern can be disposed in the region of the wiring substrate SUB1 (see FIG. 6) which overlaps the memory circuits MC1 as the core circuits. In this case, it is possible to stabilize power supplies to the core circuits. However, when the input/output circuits IOC1 are disposed between the memory circuits MC1 as shown in FIG. 8, the power supply paths to the memory circuits MC1 are divided by the signal transmission paths. As a result, a need arises for another measure for stabilizing the power supplies to the memory circuits MC1.

When the signal transmission paths are disposed between the power supply paths, a need arises for a measure for inhibiting the influence of electromagnetic noise generated from the power supply paths from being exerted on the signal transmission paths. As a noise reduction measure for the signal transmission paths, there is a technique which disposes a conductor pattern supplied with a reference potential such that the conductor pattern surrounds the peripheries of the signal transmission paths. For example, there is a measure which disposes a large-area conductor pattern supplied with a reference potential in each of a wiring layer where the wires included in the signal transmission paths are provided, a wiring layer located thereabove, and a wiring layer located therebelow in the wiring substrate SUB1 (see FIG. 6) to provide a structure in which the signal transmission paths are interposed between the conductor patterns. In the case of using this measure, the conductor patterns supplied with the reference potential function as an electromagnetic shield to be able to inhibit an electric signal flowing in the signal transmission paths from being affected by external noise.

However, when all the wires included in the signal transmission paths are shielded by the method described above, the number of the wiring layers of the wiring substrate increases. When the number of the wiring layers increases, a problem such as, e.g., an increased package size or a reduced manufacturing efficiency resulting from the complicated wiring structure arises. Consequently, in terms of improving the performance of the entire semiconductor device PKG1, it is necessary to perform wiring design in accordance with the placement of the circuits and the arrangement of the electrodes in the semiconductor chip CHP1 described above.

<Structure of Wiring Substrate>

Figure 9:
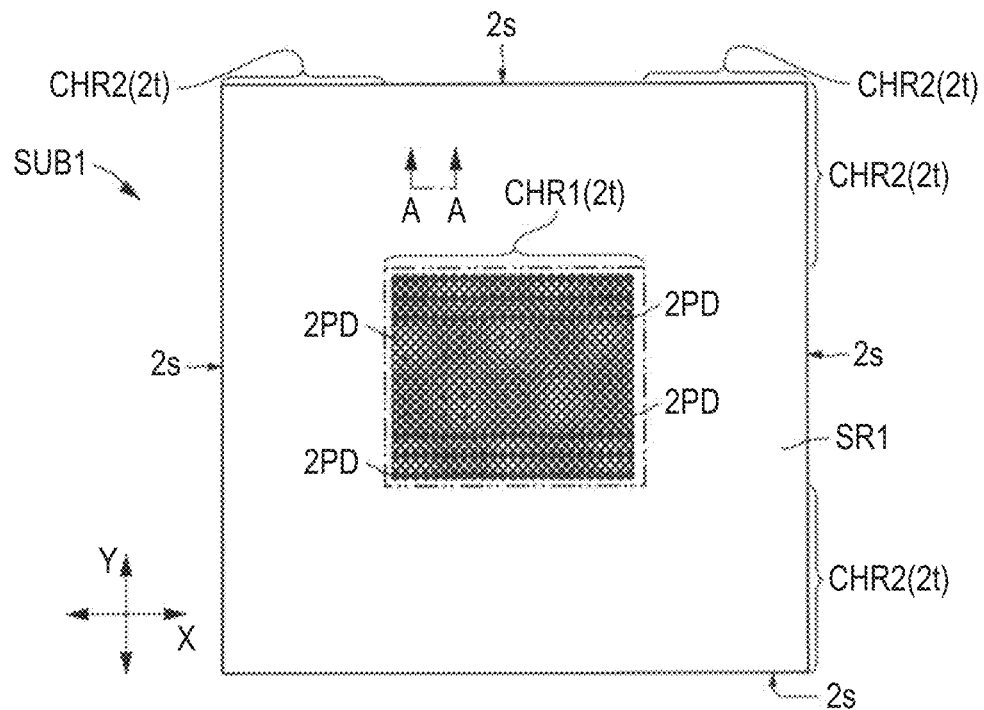
FIG. 9 is a plan view showing the upper surface of the wiring substrate shown in FIG. 6.
Figure 10:
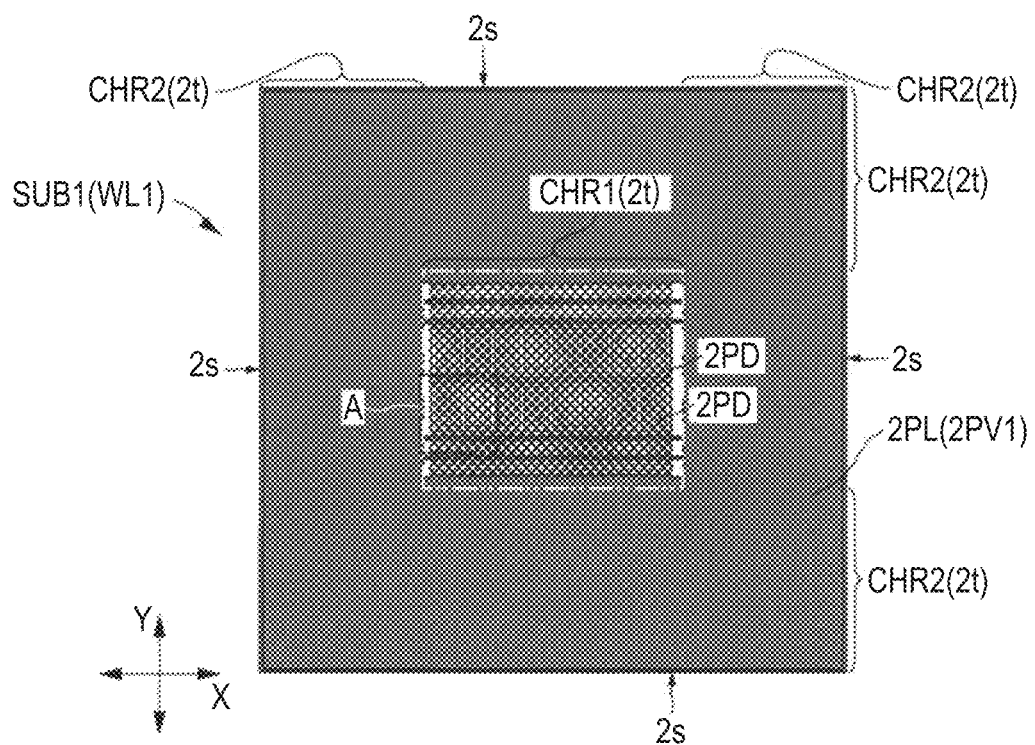
FIG. 10 is a plan view showing a state in which the solder resist film shown in FIG. 9 is removed.
Figure 11:
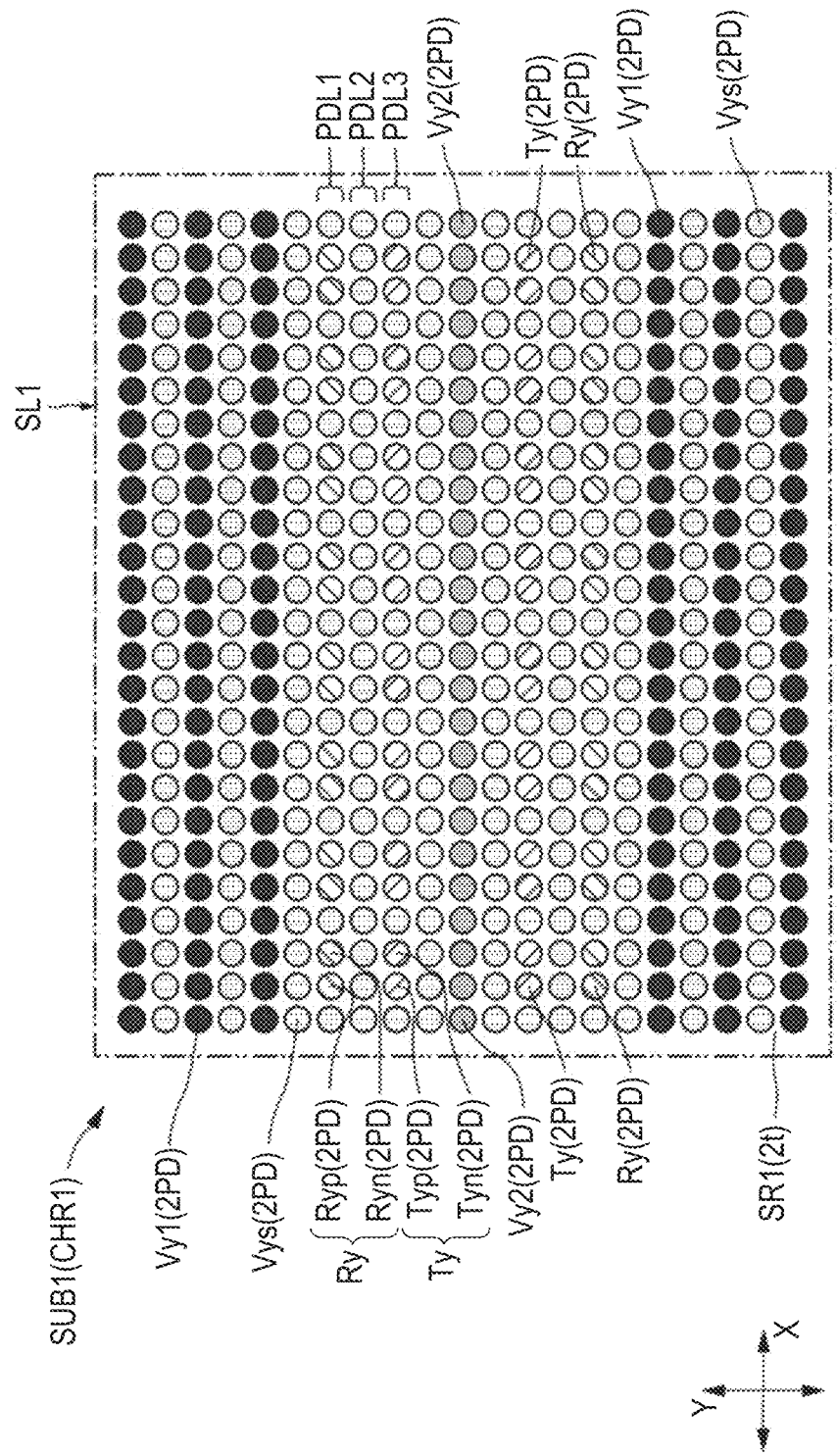
FIG. 11 is an enlarged plan view of the region of the upper surface of the wiring substrate shown in FIG. 9 which overlaps the semiconductor chip shown in FIG. 6.
Figure 12:
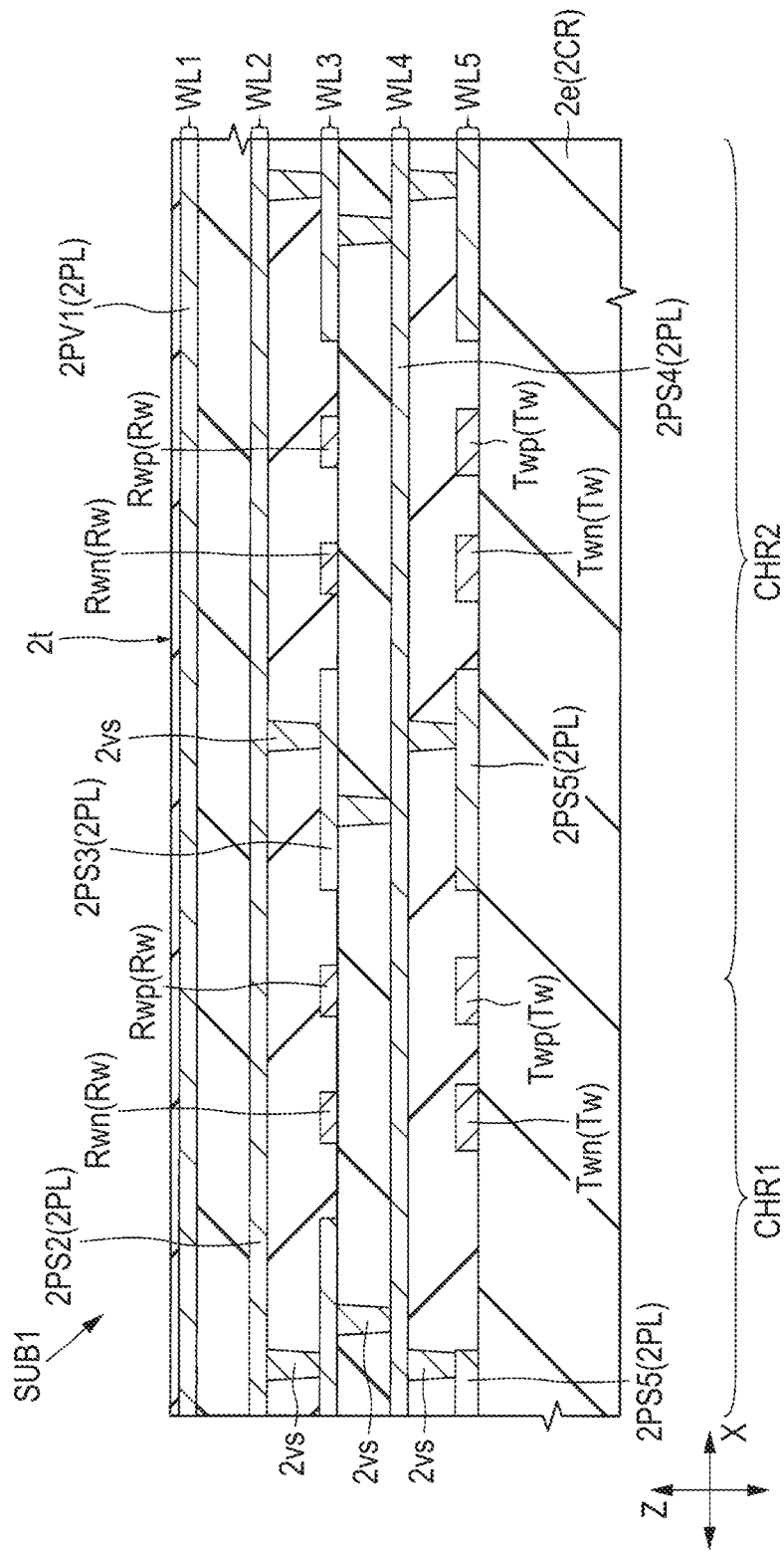
FIG. 12 is an enlarged cross-sectional view along the line A-A in FIG. 9.
Figure 13:
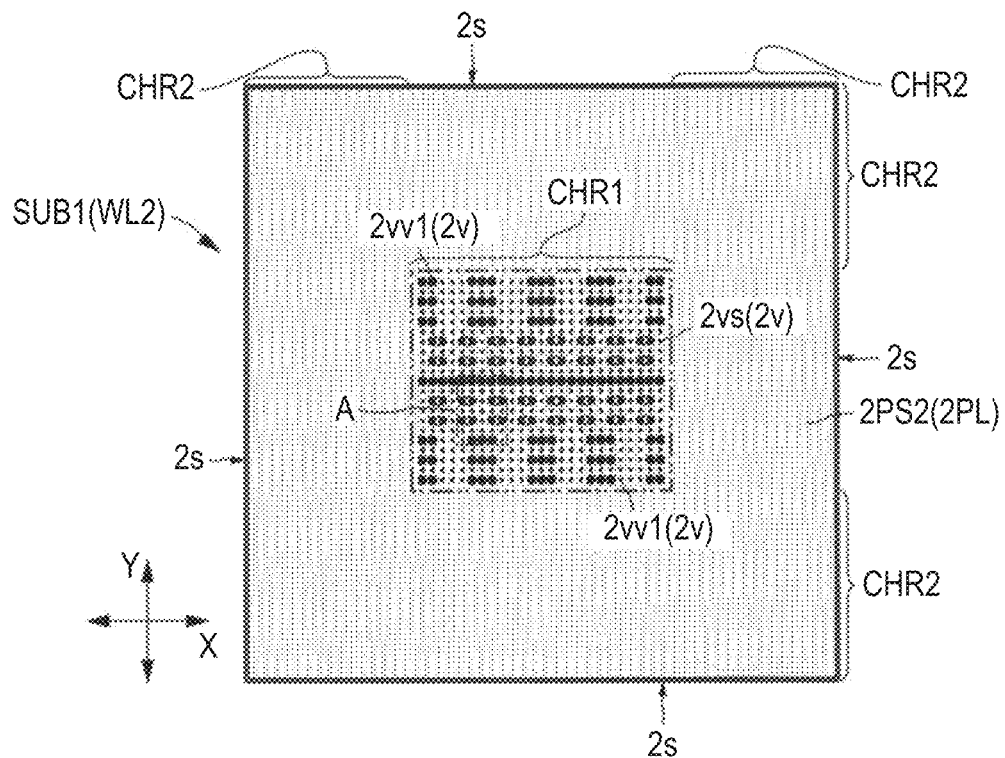
FIG. 13 is an enlarged plan view of a wiring layer (second layer) located below the wiring layer shown in FIG. 11.
Figure 14:
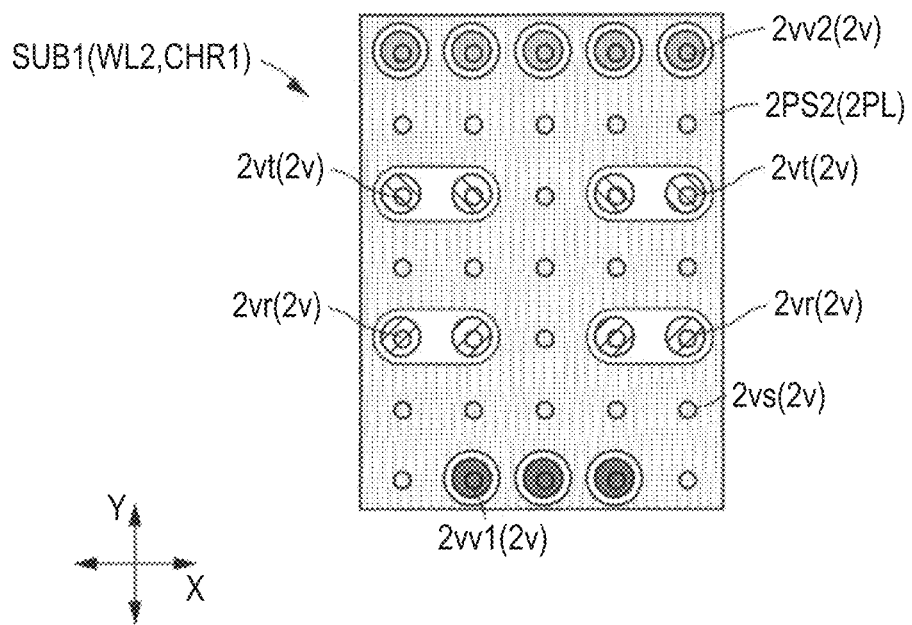
FIG. 14 is an enlarged plan view of the portion A in FIG. 13.
Figure 15:
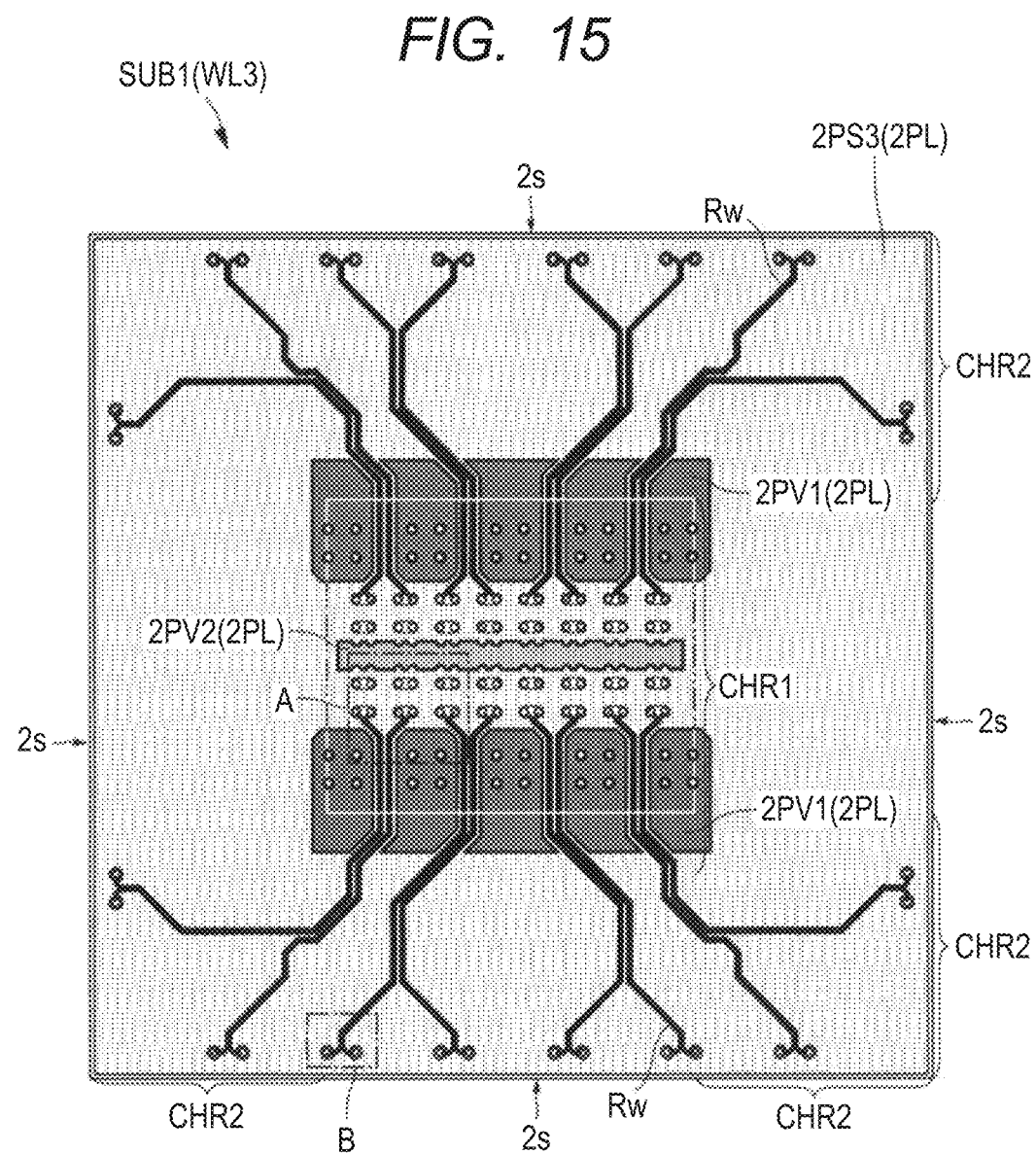
FIG. 15 is a plan view of a wiring layer (third layer) located below the wiring layer shown in FIG. 13.
Figure 16:
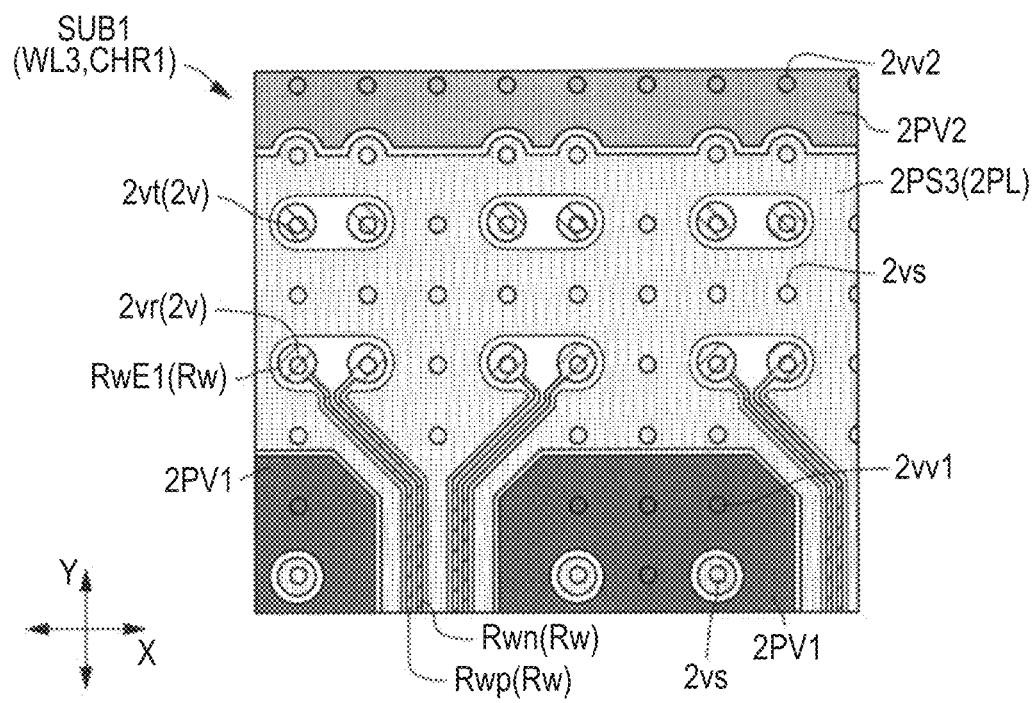
FIG. 16 is an enlarged plan view of the portion A in FIG. 15.
Figure 17:
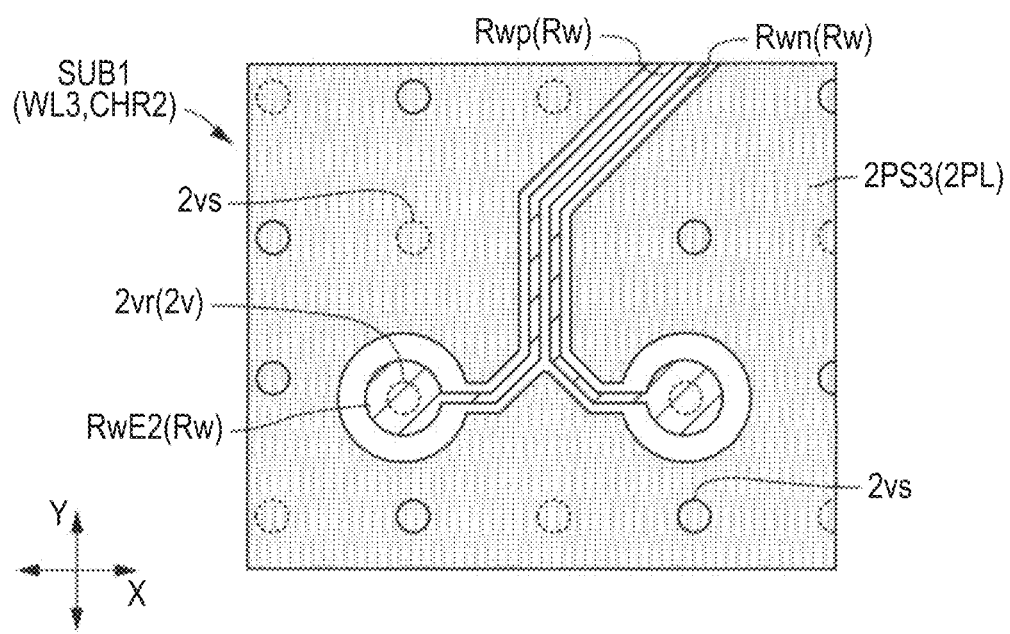
FIG. 17 is an enlarged plan view of the portion B in FIG. 15.
Figure 18:
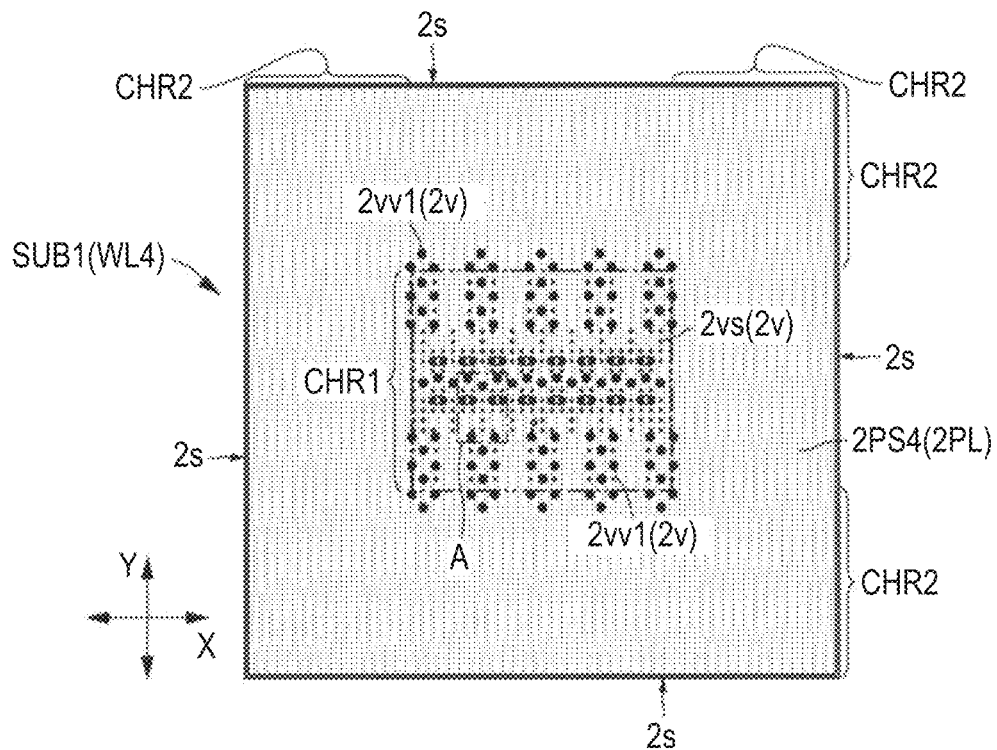
FIG. 18 is a plan view of a wiring layer (fourth layer) located below the wiring layer shown in FIG. 15.
Figure 19:
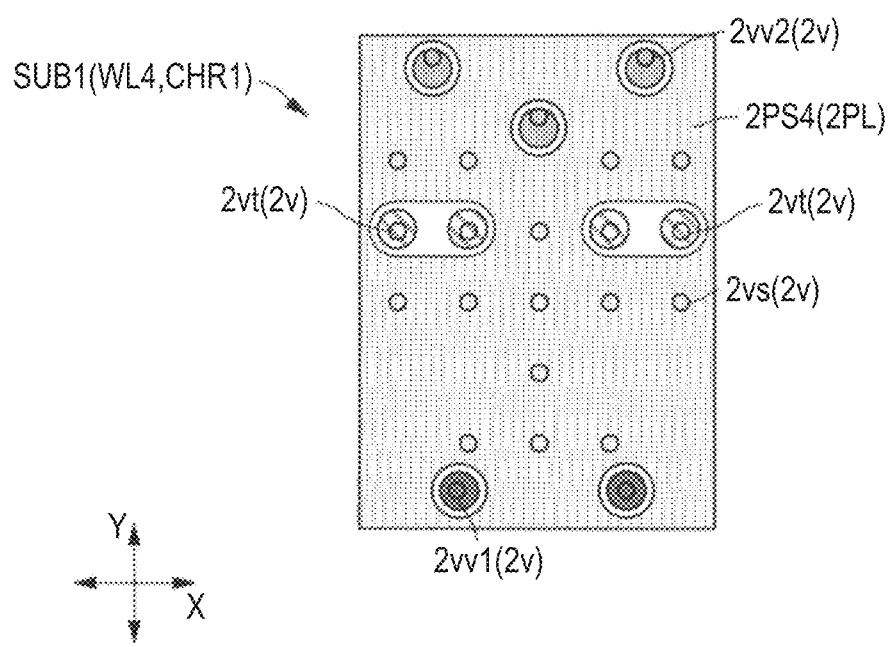
FIG. 19 is an enlarged plan view of the portion A in FIG. 18.
Figure 20:
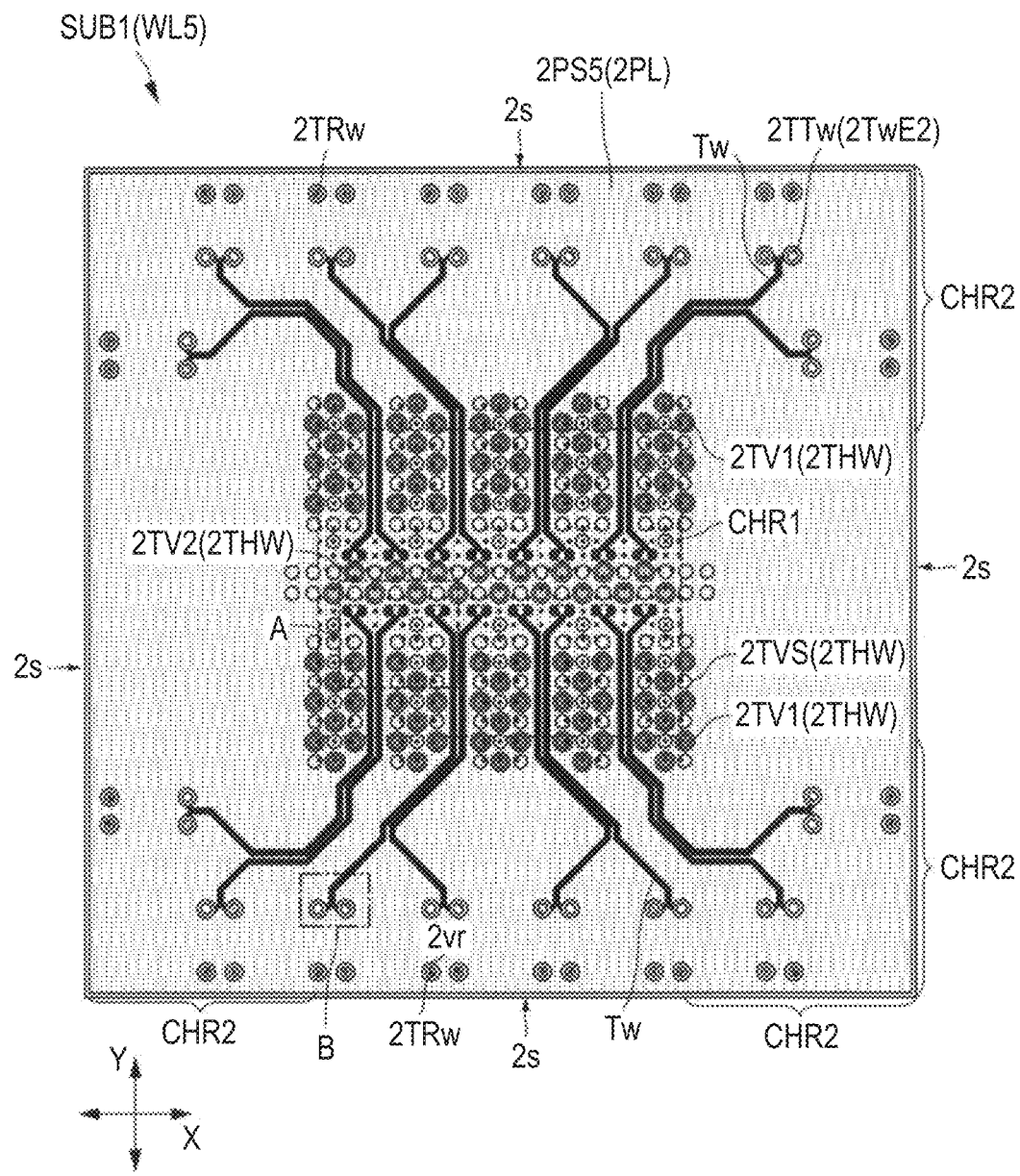
FIG. 20 is a plan view of a wiring layer (fifth layer) located below the wiring layer shown in FIG. 18.
Figure 21:
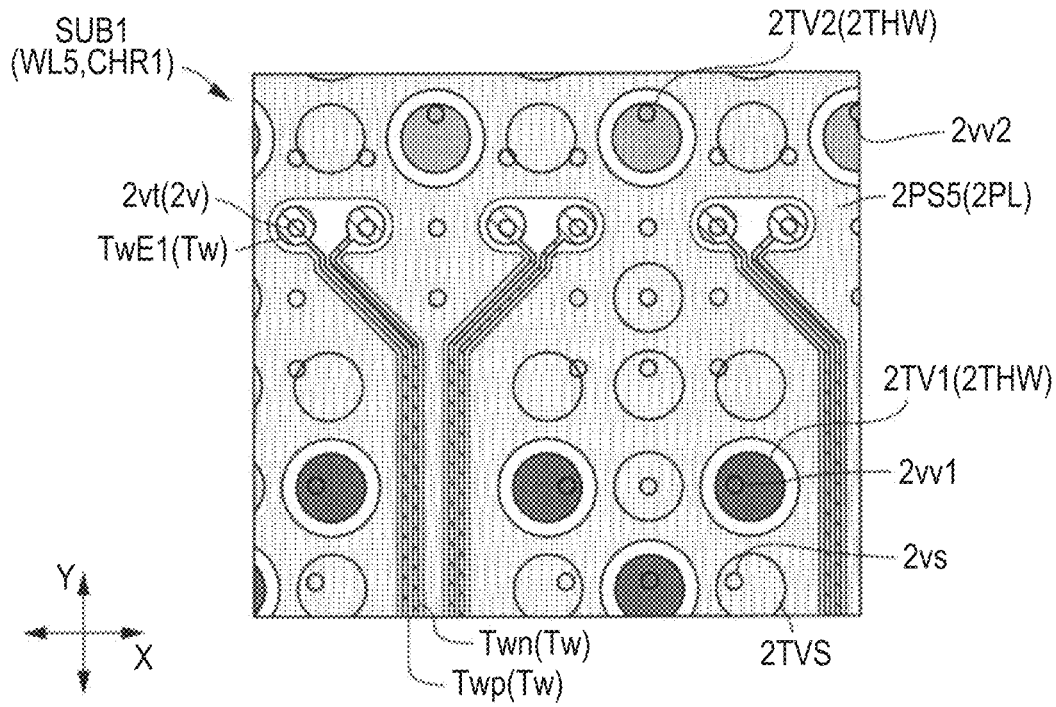
FIG. 21 is an enlarged plan view of the portion A in FIG. 20.
Figure 22:
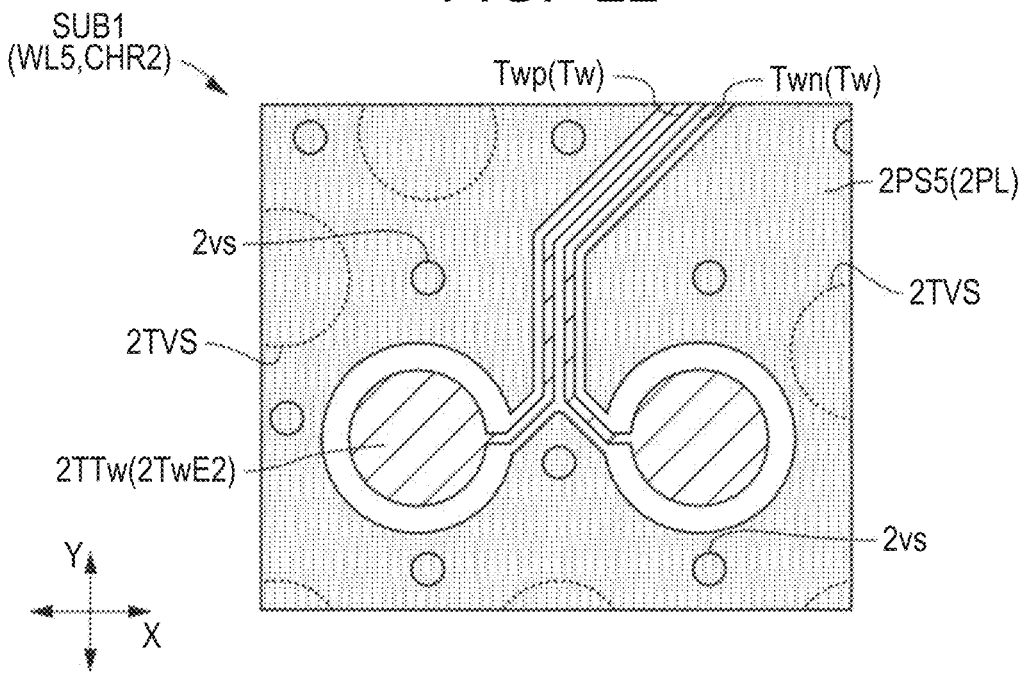
FIG. 22 is an enlarged plan view of the portion B in FIG. 20.
Figure 23:
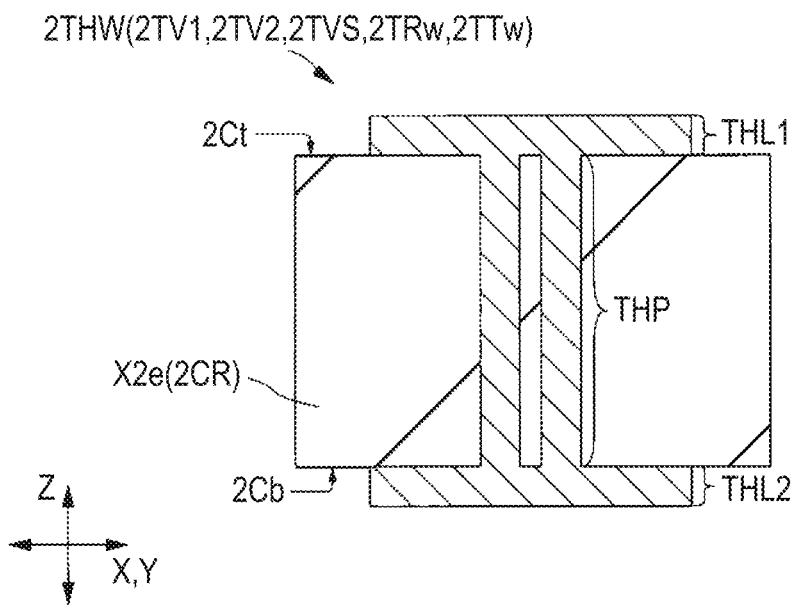
FIG. 23 is an enlarged cross-sectional view of one of the through hole wires shown in FIG. 20.

Next, a detailed description will be given of an example of the wiring layout included in the wiring substrate SUB1 where the semiconductor chip CHP1 is mounted. FIG. 9 is a plan view showing the upper surface of the wiring substrate shown in FIG. 6. FIG. 10 is a plan view showing a state in which the solder resist film shown in FIG. 9 is removed. FIG. 11 is an enlarged plan view of the region of the upper surface of the wiring substrate shown in FIG. 9 which overlaps the semiconductor chip shown in FIG. 6. FIG. 12 is an enlarged cross-sectional view along the line A-A in FIG. 9. FIG. 13 is an enlarged plan view of the wiring layer (second layer) located below the wiring layer shown in FIG. 11. FIG. 14 is an enlarged plan view of the portion A in FIG. 13. FIG. 15 is a plan view of the wiring layer (third layer) located below the wiring layer shown in FIG. 13. FIG. 16 is an enlarged plan view of the portion A in FIG. 15. FIG. 17 is an enlarged plan view of the portion B in FIG. 15. FIG. 18 is a plan view of the wiring layer (fourth layer) located below the wiring layer shown in FIG. 15. FIG. 19 is an enlarged plan view of the portion A in FIG. 18. FIG. 20 is a plan view of the wiring layer (fifth layer) located below the wiring layer shown in FIG. 18. FIG. 21 is an enlarged plan view of the portion A in FIG. 20. FIG. 22 is an enlarged plan view of the portion B in FIG. 20. FIG. 23 is an enlarged cross-sectional view of one of the through hole wires shown in FIG. 20.

Each of the plurality of wiring layers of the wiring substrate SUB1 shown in FIG. 6 has a region (chip overlapping region) CHR1 (see FIG. 9) which overlaps the semiconductor chip CHP1 and a region (chip non-overlapping region) CHR2 (see FIG. 9) which surrounds the periphery of the region CHR1 and does not overlap the semiconductor chip CHP1. In each of FIGS. 9 to 11, 13, 15, 18, and 20, the boundary between the region CHR1 and the region CHF2 is shown by the two-dot-dash line. In FIGS. 9 to 11 and 13 to 22, for identification of the types of the signals and potentials supplied to the individual transmission paths, hatching and patterns are added in the same manner as in FIG. 7. To the transmission paths for the output signal (transmission signal) and the transmission paths for the input signal (reception signal), different kinds of hatching are added. To the transmission paths for the reference potential VSS (see FIG. 3), dot patterns are added. To the transmission paths for the power supply potential VD2 (see FIG. 3), a dot pattern in a tone darker than that of the dot pattern added to the transmission paths for the reference potential VSS is added. Also, to the transmission paths for the power supply potential VD1 (see FIG. 3), a dot pattern in a tone darker than that of the dot pattern added to the transmission paths for the power supply potential VD2 is added.

The plurality of vias 2v electrically coupling together the conductor planes 2PL in the individual wiring layers shown in FIG. 6 are disposed in both of the region CHR1 (see FIG. 9) and the region CHR2 (see FIG. 9) in plan view. In FIGS. 15, 18, and 20, the illustration of some of a plurality of vias 2vs disposed in the region CHR2 is omitted. In FIGS. 17 and 22, the vias 2vs coupled to the upper wiring layers are shown by the solid circles, while the vias 2vs coupled to the lower wiring layers are shown by the dotted circles. However, to a conductor plane 2PV1 in the wiring layer WL1 and a conductor plane 2PS2 in the wiring layer WL2, different potentials are supplied. Accordingly, as shown in FIG. 13, in the region CHR2, between the wiring layer WL1 and the wiring layer WL2, the vias 2vs electrically coupling together the paths supplied with the reference potential are not disposed.

As shown in FIGS. 9 to 11, the wiring substrate SUB1 has the plurality of pads 2PD facing the plurality of electrodes 3PD of the semiconductor chip CHP1. The plurality of pads 2PD are each provided in the wiring layer WL1 (see FIG. 11) which is closest to the chip mounting surface among the plurality of wiring layers included in the wiring substrate SUB1 to face the plurality of respective electrodes 3PD shown in FIG. 7. The plurality of pads 2PD are also arranged in the region (chip overlapping region) CHR1 of the upper surface 2t of the wiring substrate SUB1 which overlaps the semiconductor chip CHP1 (see FIG. 7) in plan view and are absent outside the region CHR1.

The plurality of pads 2PD of the wiring substrate SUB1 include a plurality of pads (input signal pads or reception pads) Ry to which the input signal (signal SGR shown in FIG. 1) input to the semiconductor chip CHP1 (see FIG. 7) is transmitted. Specifically, the pads Ry include a pad Ryp and a pad Ryn which are included in a differential pair. The plurality of pads 2PD also include a plurality of pads (output signal pads) Ty to which the output signal (signal SGT shown in FIG. 1) output from the semiconductor chip CHP1 is transmitted. Specifically, the pads Ty include a pad Typ and a pad Tyn which are included in a differential pair. The plurality of pads 2PD also include a plurality of (reference potential) pads Vys which supply the reference potential VSS (see FIG. 3) to the memory circuits MC1 of the semiconductor chip CHP1 and a plurality of pads (first potential pads) Vy1 which supply the power supply potential VD1 (see FIG. 3) different from the reference potential VSS to the memory circuits MC1. The plurality of pads 2PD also include the plurality of pads (reference potential pads) Vys which supply the reference potential VSS (see FIG. 3) to the logic circuits LGC1 (see FIG. 8) of the semiconductor chip CHP1 and a plurality of pads (first potential pads) Vy2 which supply the power supply potential VD2 (see FIG. 3) to the logic circuits LGC1.

The plurality of pads Ty face the plurality of respective electrodes Tx shown in FIG. 7. The plurality of pads Ry face the plurality of respective electrodes Rx shown in FIG. 7. The plurality of pads Vy1 face the plurality of respective electrodes Vx1 shown in FIG. 7. The plurality of pads Vy2 face the plurality of respective electrodes Vx2 shown in FIG. 7. The plurality of pads Vys face the plurality of respective electrodes Vxs shown in FIG. 7.

As shown in FIG. 7, in the Y-direction, the plurality of electrodes Tx and the plurality of electrodes Rx are arranged in different rows. In the example shown in FIG. 11, at the upper surface 2t of the wiring substrate SUB1, in a row (first row) PDL1 between the outer edge (side SL1) of the region CHR1 and the middle of the region CHR1 in the Y-direction, the plurality of pads Ry are arranged. In a row (second row) PDL2 between the row PDL1 and the middle of the region CHR1 in the Y-direction, the plurality of pads Vys are arranged. In a row (third row) PDL3 between the row PDL2 and the middle of the region CHR1 in the Y-direction, the plurality of pads Ty are arranged. As in the present embodiment, the input pads Ry and the output pads Ty are arranged in different rows to allow simplification of a layout of the wires in the wiring substrate and a reduction in crosstalk noise between the output signal and the input signal.

In the case of the present embodiment, each of the signal SGT and the signal SGR which are shown in FIG. 1 is the differential signal. Accordingly, the pads Ry include the pads Ryp and Ryn which output the pair of differential signals. As shown in FIG. 11, the pads Ryp and Ryn included in the differential pair are arranged to be adjacent to each other along the X-direction as the direction in which the plurality of pads Ry are arranged. On the other hand, the pads Ty include the pads Typ and Tyn to which the pair of differential signals are input. The pads Typ and Tyn included in the differential pair are arranged to be adjacent to each other along the X-direction as the direction in which the plurality of pads Ty are arranged.

As can be seen from a comparison between FIGS. 9 and 10, in the wiring layer WL1 (see FIG. 10), a plurality of conductor patterns are formed. The plurality of pads 2PD are the portions of the conductor patterns formed in the wiring layer WL1 which are exposed from the openings provided in the insulating layer SR1.

As shown in FIG. 10, in the wiring layer WL1, the conductor plane 2PV1 as a large-area conductor pattern is formed. To the conductor plane 2PV1, the power supply potential VD1 (see FIG. 3) is supplied. The conductor plane 2PV1 has a largest area among the plurality of conductor patterns formed in the wiring layer WL1. In plan view, the conductor plane 2PV1 is disposed so as to cover the major part of the region CHR2. The conductor plane 2PV1 also has a portion disposed in the region CHR1 (see FIG. 9). By disposing the large-area conductor plane 2PV1 supplied with the power supply potential VD1 in the wiring layer WL1 closest to the semiconductor chip CHP1 among the plurality of wiring layers shown in FIG. 6 as in the present embodiment, even when the power need instantaneously increases in the memory circuits MC1 shown in FIG. 8, it is possible to inhibit the occurrence of a voltage drop or the like. In other words, the conductor plane 2PV1 disposed in the wiring layer WL1 reinforces the power supply paths to the memory circuits MC1.

As shown in FIG. 9, each of the plurality of wiring layers of the wiring substrate SUB1 includes the region (chip overlapping region) CHR1 overlapping the semiconductor chip CHP1 (see FIG. 6) and the region (chip non-overlapping region or peripheral region) CHR2 located around the region CHR1 and not overlapping the semiconductor chip CHP1. Each of the plurality of signal transmission paths is led out of the region CHR1 to the region CHR2 in any of the plurality of wiring layers. In the case of the present embodiment, the plurality of signal transmission paths for the output signal and the plurality of signal transmission paths for the input signal are led out of the region CHR1 to the region CHR2 in the different wiring layers.

As shown in FIG. 6, the plurality of wiring layers of the wiring substrate SUB1 include the wiring layer WL1 located between the upper surface 2t and the lower surface 2b, the wiring layer WL2 located between the wiring layer WL1 and the lower surface 2b, the wiring layer WL3 located between the wiring layer WL2 and the lower surface 2b, the wiring layer WL4 located between the wiring layer WL3 and the lower surface 2b, and the wiring layer WL5 located between the wiring layer WL4 and the lower surface 2b. The plurality of signal transmission paths for the input signal are led out of the region CHR1 (see FIG. 9) to the region CHR2 (see FIG. 9) in the wiring layer WL3. On the other hand, the plurality of signal transmission paths for the output signal are led out of the region CHR1 to the region CHR2 in the wiring layer WL5.

Specifically, the wiring substrate SUB1 includes wires (input signal wires, signal wires, or signal lines) Rw formed in the wiring layer WL3 and coupled to the electrodes Rx (see FIG. 7). The signal transmission paths for the input signal are led out of the region CHR1 (see FIG. 9) to the region CHR2 (see FIG. 9) via the wires Rw in the wiring layer WL3. The wiring substrate SUB1 also includes wires (output signal wires, signal wires, or signal lines) Tw formed in the wiring layer WL5 and coupled to the electrodes Tx (see FIG. 7). The signal transmission paths for the output signal are led out of the region CHR1 (see FIG. 9) to the region CHR2 (see FIG. 9) via the wires Tw in the wiring layer WL5. Each of the wires Rw and the wires Tw extends so as to cross the boundary between the region CHR1 and the region CHR2 in plan view.

In the wiring layers WL2, WL3, WL4, and WL5, the respective conductor patterns 2PL as the large-area conductor patterns supplied with the reference potential and electrically coupled together are formed. Specifically, the wiring layer WL2 has the conductor plane (conductor pattern) 2PS2 supplied with the reference potential. The wiring layer WL3 has a conductor plane (conductor pattern) 2PS3 electrically coupled to the conductor plane 2PS2. The wiring layer WL4 has a conductor plane (conductor pattern) 2PS4 electrically coupled to the conductor plane 2PS3. The wiring layer WL5 has a conductor plane (conductor pattern) 2PS5 electrically coupled to the conductor plane 2PS4. The conductor planes 2PS2, 2PS3, 2PS4, and 2PS5 are electrically coupled together via the plurality of vias 2vs shown in FIGS. 13 to 22. The conductor planes 2PS2, 2PS3, 2PS4, and 2PS5 overlap each other in plan view. The wires Rw are located between the conductor plane 2PS2 and the conductor plane 2PS4. In other words, the wires Rw are interposed between the conductor plane 2PS2 and the conductor plane 2PS4. This structure can reduce electromagnetic noise given by the wiring layers other than the wiring layer WL3 to the wires Rw in the wiring layer WL3. In plan view, the wires Tw overlap the conductor plane 2PS4 in plan view. This structure can reduce electromagnetic noise given by the layers (wiring layers WL3, WL2, and WL1) located above the wiring layer WL4 to the wires Tw in the wiring layer WL5.

According to the present embodiment, the wires Tw and the wires Rw are disposed in the different layers and, between the wires Tw and the wires Rw, the conductor plane 2PS4 is interposed. This can reduce crosstalk noise between the transmission paths for the input signal and the transmission paths for the output signal. Among crosstalk noises between the signal transmission paths, crosstalk noise from the transmission paths for the output signal has particularly large influence on the transmission paths for the input signal compared to crosstalk noise in another mode. However, according to the present embodiment, the crosstalk noise having particularly large influence is reduced by the shielding effect of the conductor plane 2PS4.

When the wires Tw and the wires Rw are disposed in the same wiring layer, as a measure against the crosstalk noise described above, the wires Tw and the wires Tr need to be spaced apart by large distances. However, in the case of the present embodiment, the wires Tw and the wires Rw are disposed in the different wiring layers. This can reduce the intervals at which the wires Tw and the wires Rw are disposed. As a result, it is possible to increase the number of the signal transmission paths per unit area.

In the region CHR1 overlapping the semiconductor chip CHP1 and the region in the vicinity thereof, the large number of signal transmission paths are densely located. Accordingly, the crosstalk noise between the signal transmission paths has particularly large influence in the region CHR1 and in the peripheral region thereof. As shown in FIG. 6, in the case of the semiconductor device PKG1, in the region CHR1 overlapping the semiconductor chip CHP1 and in the vicinity of the region CHR1, the conductor plane 2PS3 is interposed between the wires Tw and the wires Rw. In other words, in the case of the semiconductor device PKG1, the structure is provided in which, in the region CHR1 overlapping the semiconductor chip CHP1, the electromagnetic influence of noise generated from the wires Tw is shielded and is not transmitted to the wires Rw. Consequently, in the region where the crosstalk noise has particularly large influence, the influence of the noise can be reduced. Conversely, in the case of the semiconductor device PKG1, the influence of the noise can be reduced in the region CHR1 and in the vicinity thereof to allow the large number of signal transmission paths to be integrated.

As shown in FIG. 6, the wiring layer WL6 of the wiring substrate SUB1 has a conductor plane (conductor pattern) 2PS6 electrically coupled to the conductor plane 2PS5 via the through hole wires 2THW. Most of the wires Tw are interposed between the conductor plane 2PS4 and the conductor plane 2PS6. However, the wiring layer WL5 is located over the upper surface 2Ct of the insulating layer (core material or core insulating layer) 2CR made of prepreg obtained by impregnating glass fiber with a resin. The insulating layer 2CR is a substrate which reliably provides the wiring substrate SUB1 with a supporting strength and has a thickness (distance in a Z-direction from one of the upper surface 2Ct and the lower surface 2Cb to the other) thicker (larger) than that of each of the other insulating layers 2e. For example, the distance by which the wiring layer WL5 and the wiring layer WL6 are spaced apart is longer than the distance by which the wiring layer WL4 and the wiring layer WL5 are spaced apart. In other words, the distance by which each of the wires Tw and the conductor plane 2PS6 are spaced apart is longer than the distance by which each of the wires Tw and the conductor plane 2PS4 are spaced apart. In terms of reducing the electromagnetic noise given to the signal transmission paths, it is preferable to dispose the conductor plane 2PL supplied with the reference potential at a position closer to the signal transmission paths. Accordingly, when a comparison is made between the wiring structure of the wiring layer WL3 and the wiring structure of the wiring layer WL5 from a viewpoint of noise control, it can be said that the wiring layer WL3 has the structure in which crosstalk noise is more likely to be reduced.

However, the structure in which the wires Tw included in the signal transmission paths are disposed in the wiring layer WL5 over the insulating layer 2CR as the core layer is advantageous in that the number of the wiring layers of the wiring substrate SUB1 can be reduced. When the wires TW are to be shielded from therearound similarly to the wires Rw, a method may be used which provides additional another wiring layer over the insulating layer 2CR shown in FIG. 6 and then provides the wires Tw in the additional wiring layer. In this case, the conductor plane 2PL overlapping the wires Tw and supplied with the reference potential can be disposed in the wiring layer WL5 over the insulating layer 2CR as the core layer. In the case of using this method, the noise resistance of the wires Tw can be improved, but the number of the wiring layers is increased. When the number of the wiring layers of the wiring substrate is increased, manufacturing difficulty is increased. In other words, in terms of improving the manufacturing efficiency, it is preferable to minimize the number of the wiring layers of the wiring substrate.

As described above, the thickness of the insulating layer 2CR is larger than that of each of the other insulating layers 2e. In addition, when glass fiber is included in the insulating layer 2CR, the insulating layer 2CR has a dielectric constant higher than that of each of the insulating layers 2e including no glass fiber. Accordingly, when the wires Tw included in the signal transmission paths are formed in the wiring layer WL5 as in the present embodiment, it is necessary to consider the characteristic impedance of the signal transmission paths. In other words, to provide the wires Tw disposed in the wiring layer WL5 and the wires Rw disposed in the wiring layer WL3 with equal characteristic impedances, the cross-sectional area of each of the wires Rw is set smaller than the cross-sectional area of each of the wires Tw, as shown in FIG. 12. When a wire cross-sectional area is defined as the cross-sectional area of a wire in a direction (X-direction in FIG. 12) orthogonal to the direction in which the wire extends, the wire cross-sectional area of each of the plurality of wires Rw is smaller than the cross-sectional area of each of the plurality of wires Tw. In other words, the wire cross-sectional area of each of the plurality of wires Tw is larger than the wire cross-sectional area of each of the plurality of wires Rw.

Note that, in the example shown in FIG. 12, the thickness (length in the Z-direction orthogonal to the upper surface 2*t* shown in FIG. 6) of each of the plurality of wires Tw is larger than the thickness of each of the plurality of wires Rw. Also, the width (length in a direction orthogonal to the direction in which the wire Tw extends) of each of the plurality of wires Tw is larger (wider) than the width of each of the plurality of wires Rw. Note that the wire cross-sectional area described above is defined by the thickness and width of the wire as the two-dimensional factors thereof. For example, if the cross-sectional shape of the wire is assumed to be a rectangle, the wire cross-sectional area described above is defined as the product of the thickness and width of the wire. Alternatively, if the cross-sectional shape of the wire is assumed to be a trapezoid, the wire cross-sectional area described above is defined as Thickness of Wire×(Upper Side (Width of Upper Surface)+Lower Side (Width of Lower Surface)×½. Accordingly, the definition that "the wire cross-sectional area of each of the plurality of wires Tw is larger than the wire cross-sectional area of each of the plurality of wires Rw" given above includes the case where, e.g., the thickness of the wire Tw is not more than the thickness of the wire Rw and the width of the wire Tw is larger than the width of the wire Rw. Also, the definition that "the wire cross-sectional area of each of the plurality of wires Tw is larger than the wire cross-sectional area of each of the plurality of wires Rw" includes the case where, e.g., the width of the wire Tw is not more than the width of the wire Rw and the thickness of the wire Tw is larger than the thickness of the wire Rw.

When consideration is given to the degree of the influence of noise given from the outside on signal quality, the influence on the transmission paths for the input signal is larger than the influence on the output signal. Since the signal SGT as the output signal is output from the semiconductor chip CHP1 as shown in FIG. 1, the signal SGT output from the semiconductor device PKG1 is in the state where the signal level thereof is high (signal intensity thereof is high). On the other hand, the signal SGR as the input signal is output from the semiconductor chip CHP2 and input to the semiconductor device PKG1 via the wiring substrate SUB2 of the semiconductor device PKG2 and via the wiring substrate MB1 as the motherboard. Consequently, the signal attenuates in the signal transmission path SGPR so that, in the semiconductor device PKG1, the signal is in the state where the signal level thereof is low (signal intensity thereof is low). As a result, when a comparison is made between the signal SGT and the signal SGR, in the wiring substrate SUB1 included in the semiconductor device PKG1, the signal SGR is more susceptible to the influence of noise than the signal SGT.

In general, to inhibit a reduction in signal level, it is preferable to reduce the wiring resistance of a signal transmission path. Accordingly, in the case where the respective wires in the wiring layers WL3 and WL5 have different cross-sectional areas as in the present embodiment, when consideration is given only to a reduction in signal level, it is conceivable that the wires Rw are preferably disposed in the wiring layer WL5.

However, in a signal transmission path which performs signal transmission at a high speed, it is particularly important to reduce the influence of noise given from the outside. Accordingly, in the case of the present embodiment, the wires Rw which are more susceptible to the influence of noise are disposed in the wiring layer WL3 where the wires Rw can be disposed to be interposed between the conductor planes 2PL supplied with the reference potential. On the other hand, the wires Tw which are less susceptible to the influence of noise are disposed in the wiring layer WL5. In addition, between the wires Tw and the wires Rw, the conductor plane 2PS4 is disposed to be able to inhibit the influence of noise from the wires Tw from being exerted on the wires Rw.

As shown in FIG. 13, the conductor plane 2PS supplied with the reference potential in the wiring layer WL2 has the largest area among the plurality of conductor patterns formed in the wiring layer WL2. In the example shown in FIG. 13, the major part of the wiring layer WL2 is covered with the conductor plane 2PS2. The conductor plane 2PS2 is located between the region CHR1 and the region CHR2. As shown in FIG. 14, the conductor plane 2PS2 is provided with a plurality of openings and, in each of the plurality of openings, the conductor pattern included in the signal transmission paths and the supply paths for the power supply potentials is disposed. The foregoing conductor pattern is spaced apart (electrically isolated) from the conductor plane 2PS2. Each of vias 2*vt* which transmit the transmission signal, vias 2*vr* which transmit the input signal, vias 2*vv*1 which are supplied with the power supply potential VD1 (see FIG. 3), and vias 2*vv*2 which are supplied with the power supply potential VD2 (see FIG. 3) is coupled to the conductor pattern provided in the openings in the conductor plane 2PS2. On the other hand, each of the plurality of vias 2*vs* supplied with the reference potential is coupled to the conductor plane 2PS2 in the region CHR1. Note that, as described above, in the case of the wiring layer WL2, in the conductor plane 2PS2 disposed in the region CHR2, a current at a potential different from that in the conductor plane 2PV1 in the upper wiring layer WL1 (see FIG. 10) flows. Accordingly, in the region CHR2, the vias 2*vs* coupling together the wiring layer WL1 and the wiring layer WL2 are not disposed.

As also shown in FIG. 15, in the wiring layer WL3, not only the conductor plane 2PS3 supplied with the reference potential, but also the plurality of conductor planes (conductor patterns) 2PV1 supplied with the power supply potential VD1 (see FIG. 3) and a conductor plane (conductor pattern) 2PV2 supplied with the power supply potential VD2 (see FIG. 3) are formed. The conductor plane 2PS3 supplied with the reference potential has the largest area among the plurality of conductor patterns formed in the wiring layer WL3. In the example shown in FIG. 15, the conductor plane 2PS3 is present in the region CHR1 and the region CHR2.

The wiring layer WL3 has the plurality of wires Rw included in the signal transmission paths for the input signal. Each of the plurality of wires Rw includes an end portion RwE1 (circular portion shown in FIG. 16), an end portion RwE2 (circular portion shown in FIG. 17) opposite to the end portion RwE1, and a wiring portion (extending portion) electrically coupling together the end portion RwE1 and the end portion RwE2. As shown in FIG. 16, the plurality of wires Rw are electrically coupled to the pads Ry (see FIG. 11) via the vias 2*vr*. In plan view, the one end portions RwE1 of the plurality of wires Rw are located in the region CHR1. The vias 2*vr* are coupled to the end portions RwE1 of the wires Rw. As shown in FIG. 17, the other end portions RwE2 of the plurality of wires Tw are located in the region CHR2. Each of the plurality of wires Rw (specifically, the wiring portions of the wires Rw) extends so as to cross the boundary between the region CHR1 and the region CHR2.

As also shown in FIG. 16, the conductor plane 2PS3 is provided with a plurality of openings and, in each of the plurality of openings, the conductor pattern included in the transmission paths for the output signal, the plurality of wires Rw, the plurality of conductor planes 2PV1, and the conductor plane 2PV2 are disposed. Each of the foregoing conductor pattern, the plurality of wires Rw, the plurality of conductor planes 2PV1, and the conductor plane 2PV2 is spaced apart (electrically isolated) from the conductor plane 2PS3. The vias 2vt which transmit the output signal are coupled to the conductor pattern in the openings. The vias 2vr which transmit the input signal are coupled to the end portions RwE1 of the wires Rw, as described above. The plurality of vias 2vv1 which transmit the power supply potential VD1 (see FIG. 3) are coupled to the conductor plane 2PV1. The plurality of vias 2vv2 which transmit the power supply potential VD2 (see FIG. 3) are coupled to the conductor plane 2PV2.

In each of the plurality of conductor planes 2PV1 formed in the wiring layer WL3, a plurality of openings are provided. In the plurality of openings of the conductor plane 2PV1, the conductor pattern supplied with the reference potential is disposed. Some of the plurality of vias 2vs supplied with the reference potential are coupled to the conductor pattern formed in the plurality of openings of the conductor plane 2PV1. The foregoing conductor pattern is spaced apart (electrically isolated) from the conductor plane 2PV1.

In the case of the present embodiment, the signal SGR (see FIG. 1) as the input signal is a differential signal. Accordingly, the plurality of wires Rw include differential pairs (first differential pairs or input signal differential pairs). As shown in FIGS. 16 and 17, between two wires Rwp and Rwn included in each of the differential pairs, the conductor plane 2PS3 is not disposed. The two wires Rwp and Rwn included in the differential pair are disposed adjacent to each other. In other words, the two wires Rwp and Rwn included in the differential pair are disposed so as to extend in parallel with each other. Preferably, the distance by which the two wires Rwp and Rwn are spaced apart has a given value if possible.

As shown in FIGS. 12, 16, and 17, in plan view, between the adjacent two of the plurality of differential pairs (wires Rwp and wires Rwn) of the plurality of wires Rw, the conductor plane 2PS3 is present. This can reduce crosstalk noise between the signal transmission paths which transmit different signals.

As also shown in FIG. 16, in plan view, between the adjacent two of the plurality of differential pairs (wires Rwp and Rwn) of the plurality of wires Rw, any (one in FIG. 16) of the plurality of conductor planes 2PV1 and the conductor plane 2PS3 are present. Between each of the plurality of conductor planes 2PV1 and each of the plurality of wires Rw, the conductor plane 2PS3 is present. The total value of the respective areas of the plurality of conductor planes 2PV1 is largest next to the area of the conductor plane 2PS3 among the respective areas of the plurality of conductor patterns formed in the wiring layer WL3. However, the area of the conductor plane 2PV2 may be about the same as the area of each of the plurality of conductor planes 2PV1. In the example shown in FIG. 15, the wiring layer WL3 has the ten conductor planes 2PV1 spaced apart from each other. The ten conductor planes 2PV1 include the conductor planes 2PV1 each having an area larger than that of the conductor plane 2PV2 and the conductor planes 2PV1 each having an area smaller than that of the conductor plane 2PV2. The plurality of conductor planes 2PV1 are electrically coupled to the plurality of respective electrodes Vx1 of the semiconductor chip CHP1 shown in FIG. 7.

When consideration is given only to the influence of noise on the wires Rw, between the wires Rw as the high-speed signal transmission paths, the conductor plane 2PV1 supplied with the high potential is preferably absent. However, when it is allowed to dispose the conductor plane 2PV1 between the wires Rw as in the present embodiment, the conductor plane 2PV1 as the large-area conductor pattern can be disposed at positions overlapping the memory circuits MC1 (see FIG. 8) in plan view. In other words, according to the present embodiment, the large-area conductor plane 2PV1 is provided at a middle point in the supply path for the power supply potential VD1 (see FIG. 3) and in the vicinities of the memory circuits MC1. This can stabilize the power supplies to the memory circuits MC1.

In addition, by interposing the conductor plane 2PS3 between the conductor planes 2PV1 and the wires Rw, the influence of noise from the conductor planes 2PV1 on the wires Rw can be reduced.

In the case of the present embodiment, the conductor plane 2PV2 as the large-area conductor pattern is provided in the wiring layer WL3. The conductor plane 2PV2 is electrically coupled to through hole wires 2TV2 via the vias 2vv2 shown in FIG. 21. The area of the conductor plane 2PV2 is largest next to that of the plurality of conductor planes 2PV1 among the respective areas of the plurality of conductor patterns formed in the wiring layer WL3. The conductor plane 2PV2 is electrically coupled to the plurality of electrodes Vx2 of the semiconductor chip CHP1 shown in FIG. 7. Also, in plan view, the conductor plane 2PV2 is disposed at a position overlapping the region PDR6 where the logic circuits LGC1 and the lookup table LUT1 each shown in FIG. 8 are disposed. In this case, it is possible to stabilize power supplies to the input/output circuits IOC1, the logic circuits LGC1, the lookup table LUT1, and the like.

As also shown in FIG. 16, between the conductor plane 2PV2 and the vias 2vt and between the conductor plane 2PV2 and the wires Rw, the conductor plane 2PS3 is interposed. This can reduce the influence of noise from the conductor plane 2PV2 on the signal transmission paths.

As also shown in FIG. 18, in the wiring layer WL4, the conductor plane 2PS4 supplied with the reference potential has the largest area among the plurality of conductor patterns formed in the wiring layer WL4. In the example shown in FIG. 18, the major part of the wiring layer WL4 is covered with the conductor plane 2PS4. The conductor plane 2PS4 is present in the region CHR1 and the region CHR2. As shown in FIG. 19, the conductor plane 2PS4 is provided with a plurality of openings and, in each of the plurality of openings, the conductor pattern included in the signal transmission paths and the supply paths for the power supply potentials is disposed. The foregoing conductor pattern is spaced apart (electrically isolated) from the conductor plane 2PS4. The vias 2vt which transmit the transmission signal, the vias 2vv1 which are supplied with the power supply potential VD1 (see FIG. 3), and the vias 2vv2 which are supplied with the power supply potential VD2 (see FIG. 3) are each coupled to the conductor pattern provided in the openings in the conductor plane 2PS4. On the other hand, the plurality of vias 2vs which are supplied with the reference potential are each coupled to the conductor plane 2PS4. The signal transmission paths for the input signal are already led out to the peripheral region in the wiring layer WL3 shown in FIG. 15. Consequently, in the region CHR1 in the wiring layer WL4 shown in FIG. 18, the signal transmission paths for the input signal are absent. As shown in FIG. 19, in the wiring layer WL4, at the positions overlapping the end portions RwE1 of the wires Rw shown in FIG. 16, the conductor plane 2PS4 is disposed. This can inhibit the end portions RwE1 of the wires Rw included in the signal transmission paths for the input signal from being affected by electromagnetic noise from the wiring layers located below the wiring layer WL4. Likewise, the major parts of the wiring paths (portions except for the end portions RwE2 shown in FIG. 17) of the plurality of wires Rw shown in FIG. 15 are interposed between the conductor plane 2PS2 (see FIG. 13) and the conductor plane 2PS4 (see FIG. 18). This can inhibit the wires Rw from being affected by electromagnetic noise from another wiring layer.

As also shown in FIG. 20, in the wiring layer WL5, the conductor plane 2PS5 supplied with the reference potential has the largest area among the plurality of conductor patterns formed in the wiring layer WL5. In the example shown in FIG. 20, the conductor plane 2PS5 is present in the region CHR1 and the region CHR2. In the wiring layer WL5, not only the conductor plane 2PS5 supplied with the reference potential, but also a plurality of through hole wires 2TV1 supplied with the power supply potential VD1 (see FIG. 3), the through hole wires 2TV2 supplied with the potential VD2 (see FIG. 3), and a plurality of through hole wires 2TVS supplied with the reference potential VSS (see FIG. 3) are formed. In FIG. 20, of the plurality of through hole wires 2TVS formed in the region CHR2 of the wiring layer WL5, those disposed in the vicinity of the region CHR1 are shown by way of example. In the region CHR2 of the wiring layer WL5, the large number of through hole wires 2TVS are formed around, e.g., through hole wires 2TRw, the wires Tw shown in FIG. 22, and the like but, for improved clarity of illustration, the illustration thereof is omitted in FIG. 20. Also, in the wiring layer WL5, the plurality of through hole wires 2TRw which transmit the input signal and a plurality of through hole wires 2TTw which transmit the output signal are formed. The through hole wires 2TTw serve also as the respective portions of the wires Tw.

Note that, as shown in FIG. 23, each of the through hole wires 2TV1, 2TV2, 2TVS, 2TRw, and 2TTw has a through portion THP, a land portion (through hole land) THL1, and a land portion (through hole land) THL2. The through portion THP extends through the insulating layer 2CR as the core layer from one of the upper surface 2Ct and the lower surface 2Cb thereof to the other. The land portion THL1 is formed over the upper surface 2Ct of the insulating layer 2CR and coupled to the through portion THP. The land portion THL2 is formed so as to come into contact with the lower surface 2Cb of the insulating layer 2CR and coupled to the through portion THP. Each of the land portions THL1 and THL2 has, e.g., a circular two-dimensional shape. FIGS. 20 to 22 show the respective land portions THL1 (see FIG. 23) of the through hole wires 2TV1, 2TV2, 2TVS, 2TRw, and 2TTw. The respective land portions THL1 of the plurality of through hole wires 2TVS are coupled to the conductor plane 2PS5.

The wiring layer WL5 has the plurality of wires Tw included in the signal transmission paths for the output signal. Each of the plurality of wires Tw includes an end portion TwE1 (circular portion shown in FIG. 21), an end portion TwE2 (circular portion shown in FIG. 22) opposite to the end portion TwE1, and a wiring portion (extending portion) electrically coupling together the end portion TwE1 and the end portion TwE2. The plurality of wires Tw shown in FIG. 21 are electrically coupled to the respective pads Ty (see FIG. 11) in the wiring layer WL1 (see FIG. 11) via the vias 2vt shown in FIGS. 14, 16, 19, and 21. In plan view, the respective one end portions TwE1 of the plurality of wires Tw are located in the region CHR1. The vias 2vt are coupled to the end portions TwE1 of the wires Tw. On the other hand, as shown in FIG. 22, the respective other end portions TwE2 of the plurality of wires Tw are located in the region CHR2. Each of the plurality of wires Tw (specifically, the wiring portion of each of the wires Tw) extends so as to cross the boundary between the region CHR1 and the region CHR2.

As shown in FIGS. 20 to 22, the conductor plane 2PS5 is provided with a plurality of openings and, in the plurality of respective openings, the plurality of wires Tw, the plurality of through hole wires 2TRw (see FIG. 20) included in the transmission paths for the input signal, the plurality of through hole wires 2TV1 (see FIG. 21), and the plurality of through hole wires 2TV2 (see FIG. 21) are disposed. Each of the wires Tw, the through hole wires 2TRw, the through hole wires 2TV1, and the through hole wires 2TV2 is spaced apart (electrically isolated) from the conductor plane 2PS4.

The vias 2vr (see FIG. 20) which transmit the input signal are coupled to the through hole wires 2TRw in the openings. The vias 2vt which transmit the output signal are coupled to the end portions TwE1 (see FIG. 21) of the wires Tw. The vias 2vv1 which transmit the power supply potential VD1 (see FIG. 3) are coupled to the through hole wires 2TV1 in the openings. The vias 2vv2 which transmit the power supply potential VD2 (see FIG. 3) are coupled to the through hole wires 2TV2 in the openings.

In the case of the present embodiment, the signal SGT (see FIG. 1) as the output signal is the differential signal. Accordingly, the plurality of wires Tw include differential pairs (second differential pairs or output signal differential pairs). As shown in FIGS. 21 and 22, between two wires Twp and Twn included in each of the differential pairs, the conductor plane 2PS5 is not disposed. The two wires Twp and Twn included in the differential pair are disposed adjacent to each other. In other words, the two wires Twp and Twn included in the differential pair are disposed so as to extend in parallel with each other. Preferably, the distance by which the two wires Twp and Twn are spaced apart other is equal if possible.

As shown in FIGS. 12, 21, and 22, in plan view, between the adjacent two of the plurality of differential pairs (wires Twp and wires Twn) of the plurality of wires Tw, the conductor plane 2PS5 is present. This can reduce crosstalk noise between the signal transmission paths which transmit different signals.

As also shown in FIG. 21, in plan view, between the adjacent two of the plurality of differential pairs (wires Twp and wires Twn) of the plurality of wires Tw, the conductor plane 2PS5 coupled to the plurality of through hole wires 2TVS and the plurality of through hole wires 2TV1 spaced apart from the conductor plane 2PS5 are arranged. Between each of the plurality of through hole wires 2TV1 and each of the plurality of wires Tw, the conductor plane 2PS5 is present.

The plurality of through hole wires 2TV1 are coupled to the plurality of conductor planes 2PV1 shown in FIG. 15 via the respective vias 2vv1. When consideration is given only to the influence of noise on the wires Tw, between the wires Tw as the high-speed signal transmission paths, the through hole wires 2TV1 are preferably absent. However, by disposing the plurality of through hole wires 2TV1 between the wires Tw as in the present embodiment, the plurality of conductor planes 2PV1 shown in FIG. 15 can be disposed. In addition, by interposing the conductor plane 2PS5 between the through hole wires 2TV1 and the wires Tw, it is possible to reduce the influence of noise from the through hole wires 2TV1 on the wires Tw.

As also shown in FIG. 15, the wiring substrate SUB1 includes, in the wiring layer WL3, the plurality of conductor planes 2PV1 as the large-area conductor patterns which supply the power supply potential VD1 (see FIG. 3) to the memory circuits MC1 (see FIG. 8). By increasing the areas of the plurality of conductor planes 2PV1, it is possible to stabilize the power supplies to the memory circuits MC1. However, in the case of the present embodiment, it is attempted to increase the area of the conductor planes 2PV1 as follows. Specifically, in the wiring layer WL3, each of the plurality of conductor planes 2PV1 is disposed so as to cross the boundary between the region CHR1 and the region CHR2. When it is merely intended to dispose the conductor planes 2PV1 only in the region overlapping the memory circuit MC1, the conductor planes 2PV1 need not be disposed in the region CHR2. However, in the present embodiment, by disposing the plurality of conductor planes 2PV1 such that each of the conductor planes 2PV1 crosses the boundary between the region CHR1 and the region CHR2, the areas of the conductor planes 2PV1 are increased.

As also shown in FIG. 15, the conductor plane 2PS3 located between the plurality of wires Rw and the conductor planes 2PV1 is disposed so as to cross the boundary between the region CHR1 and the region CHR2 along the wires Rw. Specifically, in the wiring layer WL3, the conductor plane 2PS3 is located between the adjacent differential pairs (two differential pairs which are adjacent via the conductor plane 2PV1 shown in FIG. 16) and the conductor plane 2PV1 located between the foregoing differential pairs. The conductor plane 2PS3 is disposed so as to cross the boundary between the region CHR1 and the region CHR2 along the wires Rw included in the foregoing differential pairs. As a result, even when each of the plurality of conductor planes 2PV1 extends so as to cross the boundary between the region CHR1 and the region CHR2, it is possible to reduce the influence of noise from the conductor plane 2PV1 on the wires Rw in the region CHR2.

As also shown in FIG. 20, in the wiring layer WL5, the plurality of through hole wires 2TV1 are disposed in each of the region CHR1 and the region CHR2. In addition, in plan view, the plurality of through hole wires 2TV1 overlap the plurality of respective conductor planes 2PV1 shown in FIG. 15. The power supply potential VD1 (see FIG. 3) is supplied from the lower surface 2b side of the wiring substrate SUB1 where the solder balls SB shown in FIG. 6 are disposed to the semiconductor chip CHP1 via the plurality of through hole wires 2THW. Accordingly, when the number of the through hole wires 2TV1 coupled to the plurality of respective conductor planes 2PV1 shown in FIG. 15 is increased, the number of the supply paths for the power supply potential VD1 is increased. By disposing the plurality of through hole wires 2TV1 in each of the region CHR1 and the region CHR2 as in the present embodiment, it is possible to increase the number of the through hole wires 2TV1 coupled to the plurality of respective conductor planes 2PV1. As a result, the number of the paths which supply the power supply potential VD1 to the conductor planes 2PV1 is increased to allow the power supplies to the memory circuits MC1 (see FIG. 8) to be stabilized.

As also shown in FIG. 15, in the wiring layer WL5, the conductor plane 2PS3 located between the plurality of through hole wires 2TV1 and the plurality of wires Tw is disposed so as to cross the boundary between the region CHR1 and the region CHR2 along the wires Tx. Specifically, in the wiring layer WL5, the conductor plane 2PS5 is located between the adjacent differential pairs (two differential pairs which are adjacent via the plurality of through hole wires 2TV1 shown in FIG. 21) and the plurality of through hole wires 2TV1 located between the foregoing differential pairs. The conductor plane 2PS5 is disposed so as to cross the boundary between the region CHR1 and the region CHR2 along the wires Tw included in the foregoing differential pairs. As a result, even when each of the plurality of through hole wires 2TV1 is disposed in the region CHR2, it is possible to reduce the influence of noise from the through hole wires 2TV1 on the wires Tw in the region CHR2.

However, in a modification of the wiring substrate SUB1, it may be possible that each of the plurality of conductor planes 2PV1 shown in FIG. 15 is present in the region CHR1 but absent in the region CHR2, though the illustration thereof is omitted. In the case of this modification, each of the plurality of through hole wires 2TV1 shown in FIG. 20 is disposed in the region CHR1, but is not disposed in the region CHR2.

Figure 24:
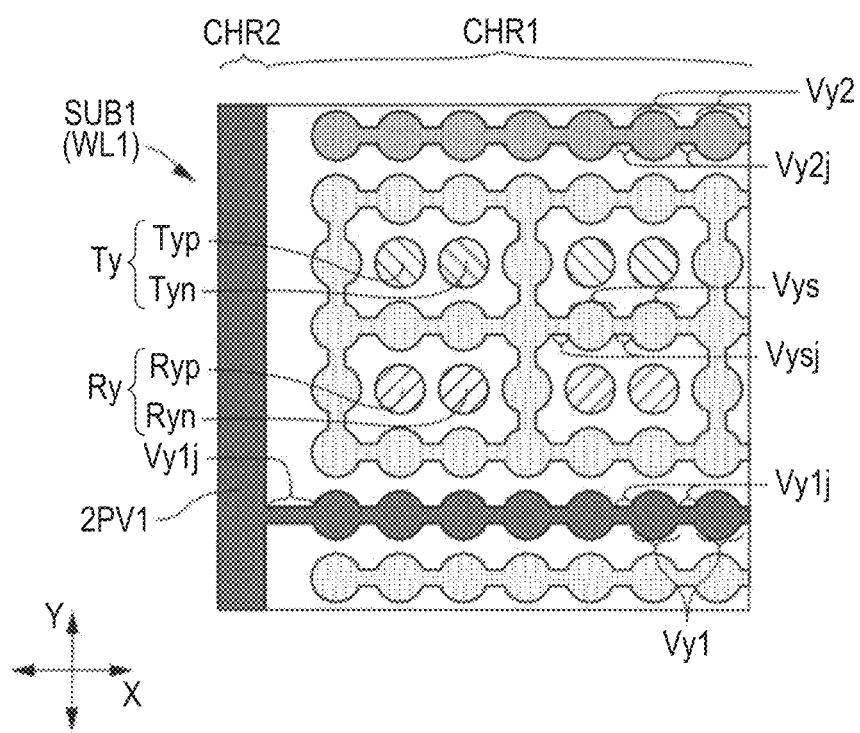
FIG. 24 is an enlarged plan view of the portion A in FIG. 10.

Also, in the present embodiment, not only the plurality of conductor patterns 2PV1 are disposed in the wiring layer WL3 shown in FIG. 15, but also a measure for stabilizing the power supplies to the memory circuits MC1 (see FIG. 8) is taken in the wiring layer WL1 shown in FIG. 10. FIG. 24 is an enlarged plan view of the portion A in FIG. 10.

As shown in FIG. 6, in the wiring layer WL1 of the wiring substrate SUB1, the plurality of pads (terminals) 2PD are disposed to be electrically coupled to the plurality of electrodes 3PD of the semiconductor chip via the protruding electrodes 3BP. The plurality of pads 2PD of the wiring substrate SUB1 include the plurality of pads Vy1 (see FIG. 24) electrically coupled to the plurality of electrodes Vx1 (see FIG. 7) of the semiconductor chip CHP1. As also shown in FIG. 24, the plurality of pads Vy1 are electrically coupled to the conductor plane (conductor pattern) 2PV1 present in the region CHR2 of the wiring layer WL1 via connecting portions Vy1j connecting together the plurality of pads Vy1.

By thus electrically coupling together the adjacent pads Vy1, when the power need instantaneously increases in any of the plurality of pads Vy1, it is possible to use the power supply path of another of the pads Vy1. In addition, since the plurality of pads Vy1 are coupled to the conductor plane 2PV1 as the large-area conductor pattern, it is possible to further stabilize the power supplies.

The plurality of pads 2PD of the wiring substrate SUB1 shown in FIG. 6 include the plurality of pads Vy2 (see FIG. 24) electrically coupled to the plurality of electrodes Vx2 (see FIG. 7) of the semiconductor chip CHP1. As also shown in FIG. 24, the plurality of pads Vy2 are electrically coupled together via connecting portions Vy2j connecting together the plurality of pads Vy2.

By thus electrically coupling together the adjacent pads Vy2, when the power need instantaneously increases in any of the plurality of pads Vy2, it is possible to use the power supply path of another of the pads Vy2. Note that, as described above, in the case of the present embodiment, the power supply potential VD1 and the power supply potential VD2 which are shown in FIG. 3 are different so that the pads Vy2 are not coupled to the conductor plane 2PV. In other words, the plurality pads Vy1 and the plurality of pads Vy2 are electrically isolated from each other. In still other words, the plurality of electrodes Vx1 and the plurality of electrodes Vx2 which are shown in FIG. 7 are electrically isolated from each other.

However, in a modification of the present embodiment, when the power supply potential VD1 and the power supply potential VD2 are the same, it may also be possible to couple the plurality of pads Vy2 to the conductor plane 2PV1. In this case, it is possible to further stabilize the power supplies via the pads Vy2.

The plurality of pads 2PD of the wiring substrate SUB1 shown in FIG. 6 include the plurality of pads Vys (see FIG. 24) electrically coupled to the plurality of electrodes Vxs of the semiconductor chip CHP1. As also shown in FIG. 24, the plurality of pads Vys are electrically coupled together via connecting portions Vysj which couple together the plurality of pads Vys. The plurality of pads Vys and the plurality of connecting portions Vysj connecting together the pads Vys are disposed so as to surround the peripheries of the pads Ry (specifically, the pads Ryp and Ryn included in the differential pairs) as the transmission paths for the input signal. The plurality of pads Vys and the plurality of connecting portions Vysj connecting together the pads Vys are also disposed so as to surround the peripheries of the pads Ty (specifically, the pads Typ and Tyn included in the differential pairs) as the transmission paths for the output signal. By thus disposing the supply paths for the reference potential such that the peripheries of the signal transmission paths are surrounded thereby, it is possible to reduce crosstalk noise on the signal transmission paths.

Note that, as shown in FIG. 10, the periphery of the region CHR1 of the wiring layer WL1 is surrounded by the conductor plane 2PV1 and, as shown in FIG. 24, the plurality of pads Vy1 in the region CHR1 are coupled to the conductor plane 2PV1. Consequently, the plurality of pads Vys coupled together are divided into a plurality of blocks. The plurality of pads Vys are electrically coupled together via the conductor plane 2PS shown in FIG. 13. As a result, when the need for the reference potential in any of the plurality of pads Vys instantaneously increases, it is possible to use the supply path of another of the pads Vys.

As also shown in FIG. 15, each of the plurality of conductor planes 2PV1 disposed in the wiring layer WL3 extends in the Y-direction. As shown in FIG. 24, the plurality of pads Vy1 disposed in the wiring layer WL1 are arranged along the X-direction crossing (in FIG. 24, orthogonal to) the Y-direction and connected together via the connecting portions Vy1j.

As shown in FIG. 15, the plurality of conductor planes 2PV1 are disposed between the wires Rw so that it is difficult to electrically couple together the plurality of conductor planes 2PV1 in the wiring layer WL3. However, in terms of stabilizing the power supplies by increasing the number of the power supply paths to the memory circuits MC1 (see FIG. 8), it is preferable to electrically couple together the plurality of conductor planes 2PV1. As shown in FIG. 24, when the plurality of pads Vy1 arranged along the X-direction are electrically coupled together, it is possible to electrically couple together the plurality of conductor planes 2PV1 shown in FIG. 15 in the vicinities of the memory circuits MC1. As a result, compared to the case where the plurality of conductor planes 2PV1 shown in FIG. 15 are not electrically coupled together, the number of the power supply paths to the memory circuits can be increased.

Figure 25:
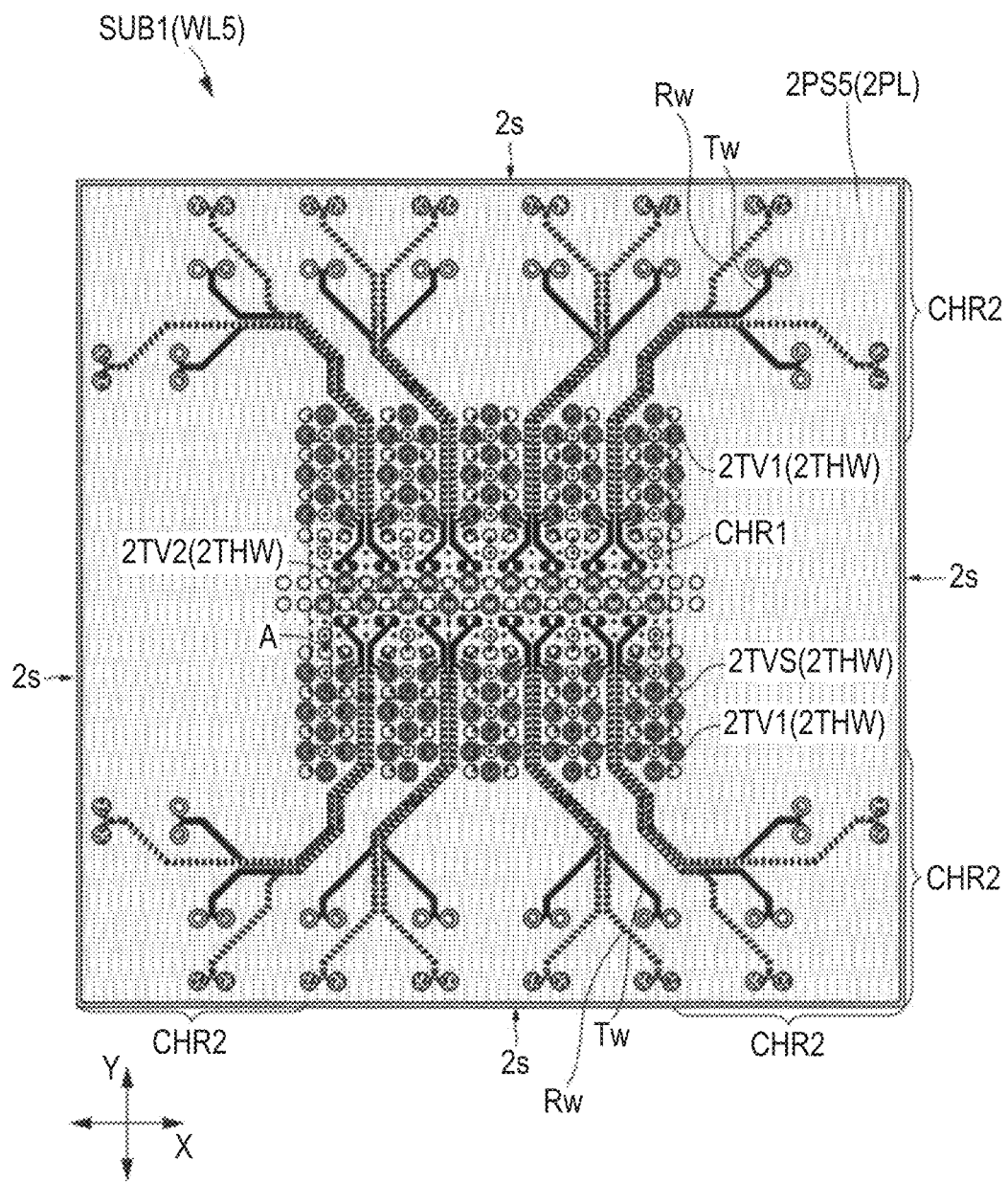
FIG. 25 is a plan view showing the state where the output signal wires shown in FIG. 20 and the input signal wires shown in FIG. 15 are superimposed.

FIG. 25 is a plan view showing the state where the output signal wires shown in FIG. 20 and the input signal wires shown in FIG. 15 are superimposed. In FIG. 25, the conductor pattern formed in the wiring layer WL5 is shown, while the plurality of wires Rw formed in the wiring layer WL3 in FIG. 15 are shown by the dotted lines.

As shown in FIG. 25, the plurality of wires Rw disposed in the wiring layer WL3 (see FIG. 15) and the plurality of output signal wires disposed in the wiring layer WL5 overlap each other in the region CHR1. Specifically, respective portions of the wires Tw overlap respective portions of the wires Rw. Also, in the region CHR1, the plurality of wires Tw and the plurality of wires Rw overlap each other and extend in the same direction. In other words, in the region CHR1, the wires Tw and the wires Rw extend in parallel with each other, while overlapping each other via the conductor plane 2PS4 (see FIG. 12). In the region CHR2, respective portions of the wires Tw overlap respective portions of the wire Rw. Also, in the region CHR2, the plurality of wires Tw and the plurality of wires Rw overlap each other and extend in the same direction. In other words, in the region CHR2, the wires Tw and the wires Rw extend in parallel with each other, while overlapping each other via the conductor plane 2PS4 (see FIG. 12). In plan view, the wires Tw and the wires Rw have respective portions not overlapping each other, but the lengths of the overlapping portions of the wires Tw and the wires Rw are larger than the lengths of the non-overlapping portions of the wires Tw and the wires RW. The wires Tw and the wires Rw overlap each other at least at the boundary between the region CHR1 and the region CHR2.

As described using FIGS. 15 and 20, when the conductor planes 2PV1 are disposed between the adjacent wires Rw in the wiring layer WL3 and the plurality of through hole wires 2TV1 are disposed between the adjacent wires Tw in the wiring layer WL5, the wires Tw and the wires Rw are disposed to overlap each other to allow the conductor planes 2PV1 and the through hole wires 2TV1 to be disposed in overlapping relation. This can reduce the supply paths for the power supply potential VD1 (see FIG. 3) and reduce a loss in the power supply paths.

In the case of the present embodiment, between the wires Rw and the wires Rw, the conductor plane 2PS4 formed in the wiring layer WL4 shown in FIG. 18 is interposed. As a result, even when the wires Rw and the wires Tw overlap each other, it is possible to reduce the influence of noise from the wires Tw on the wires Rw.

Figure 26:
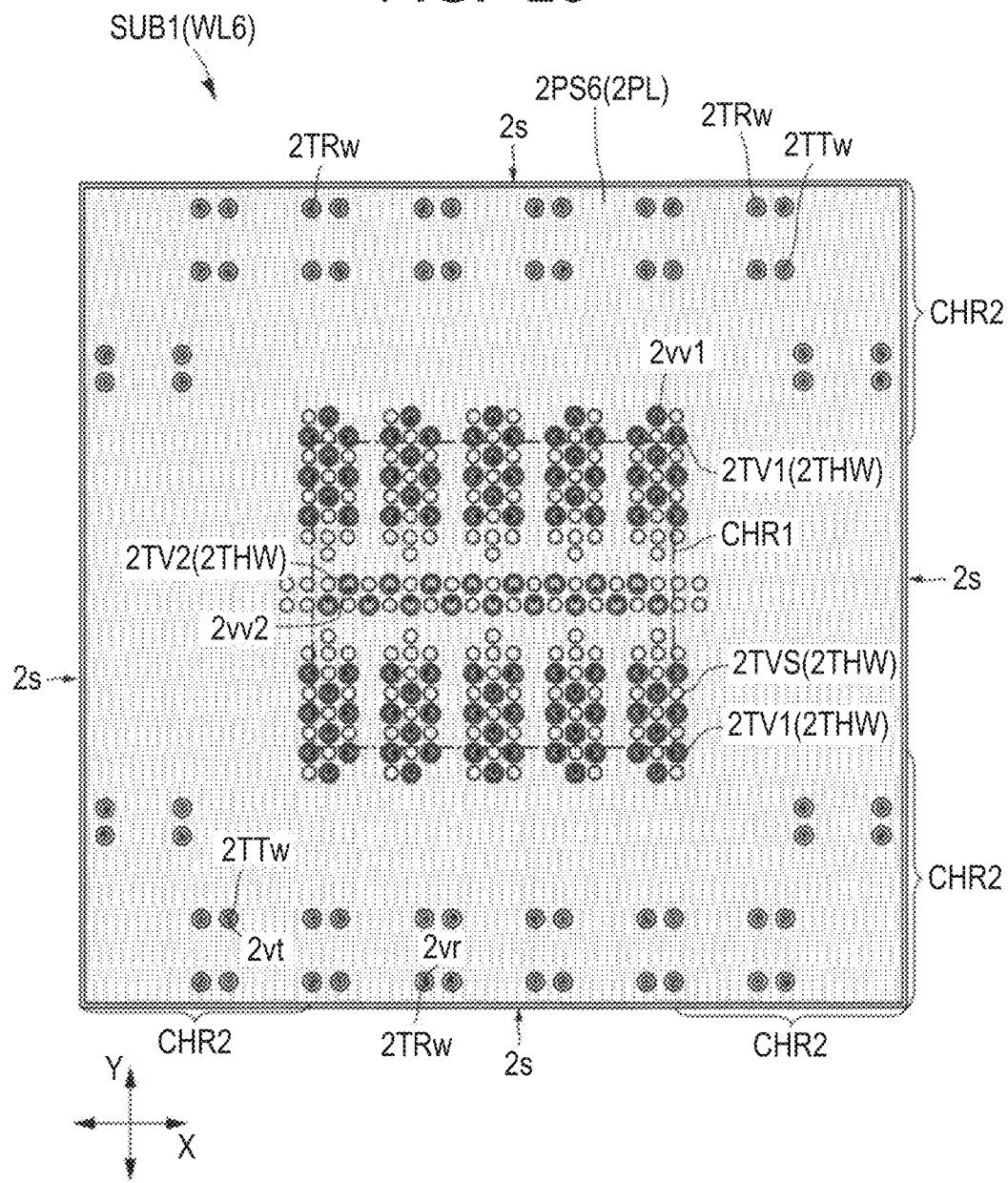
FIG. 26 is a plan view of a wiring layer (sixth wiring layer) located below the wiring layer shown in FIG. 20.
Figure 27:
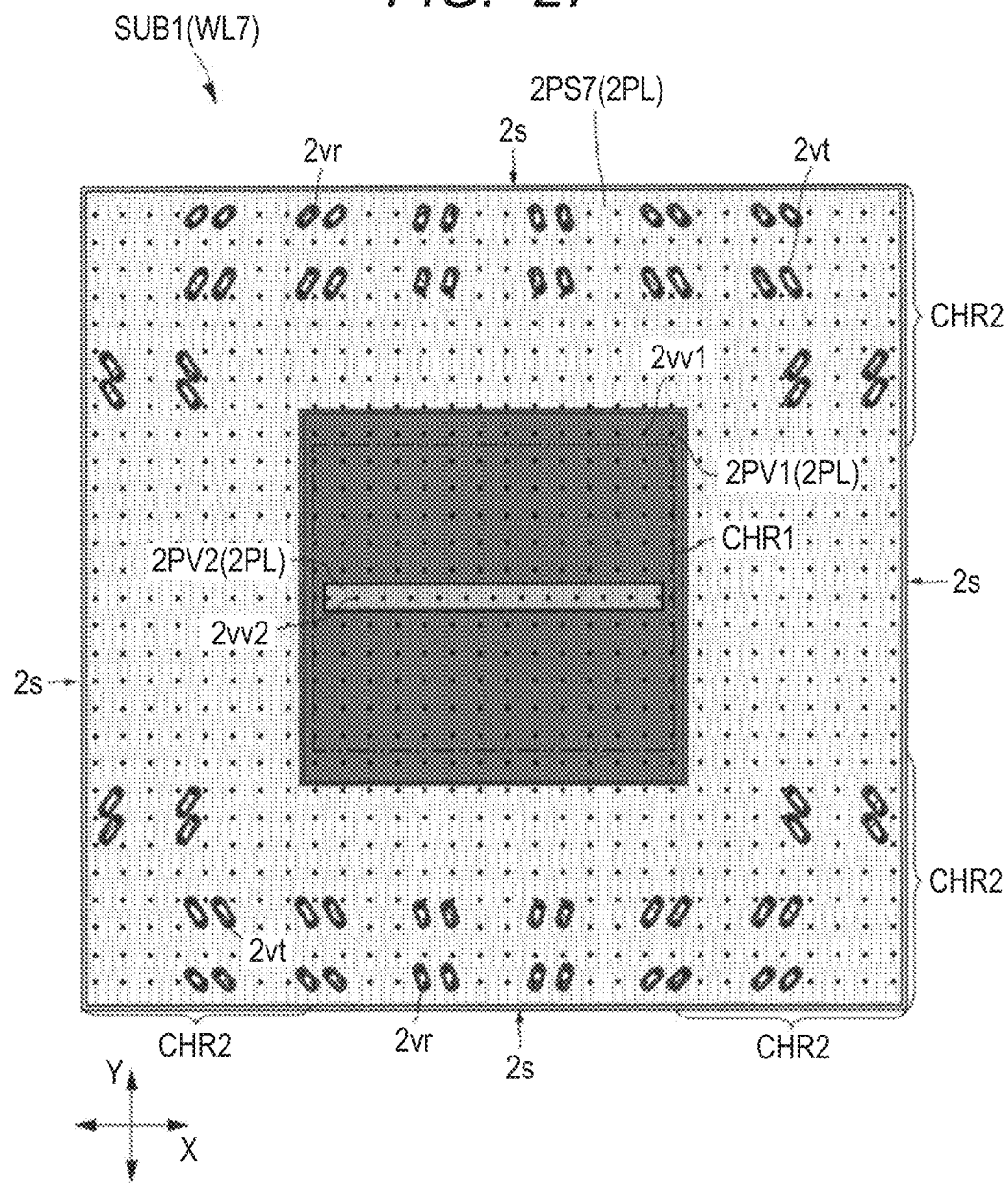
FIG. 27 is a plan view of a wiring layer (seventh wiring layer) located below the wiring layer shown in FIG. 26.
Figure 28:
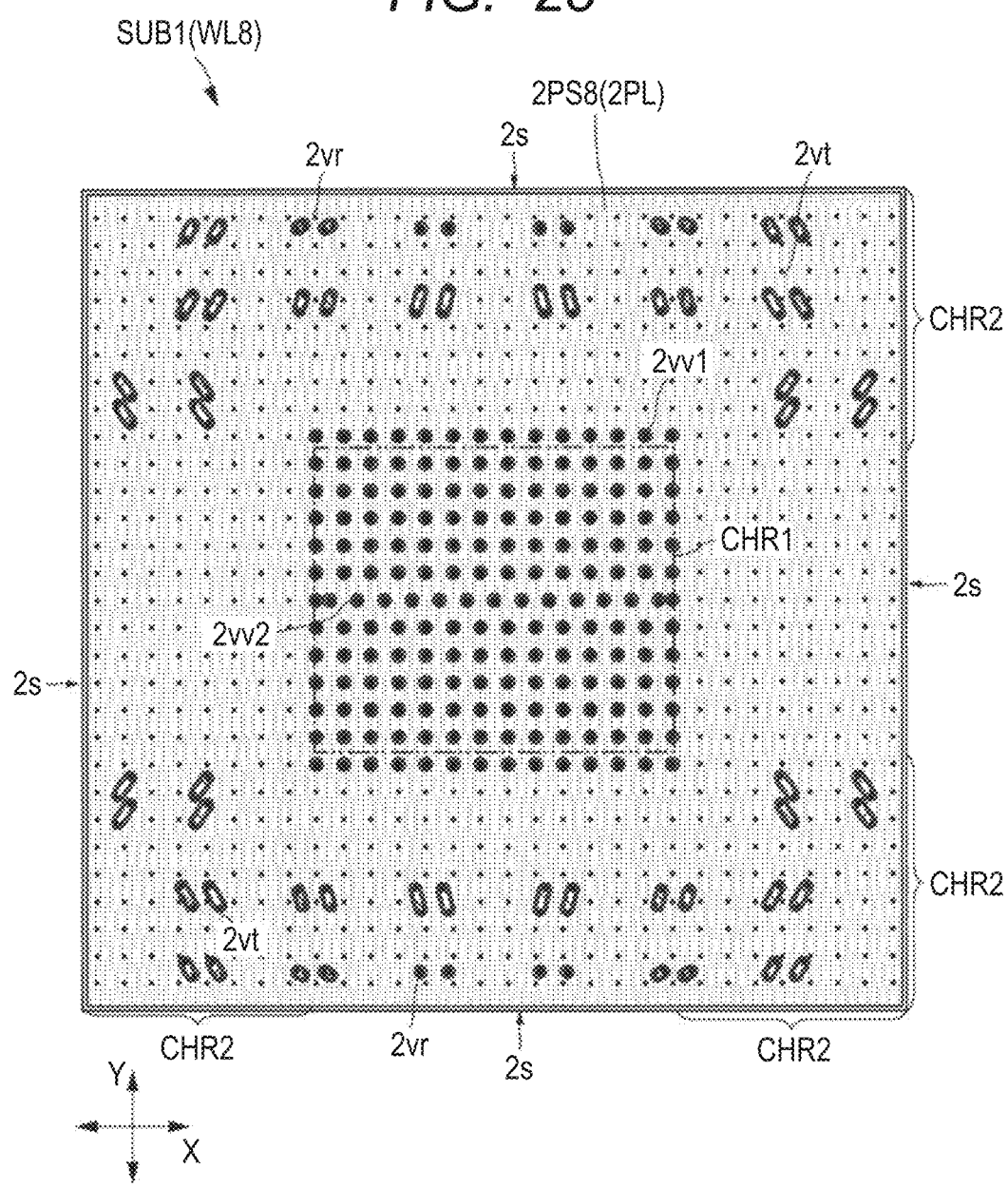
FIG. 28 is a plan view of a wiring layer (eighth wiring layer) located below the wiring layer shown in FIG. 27.
Figure 29:
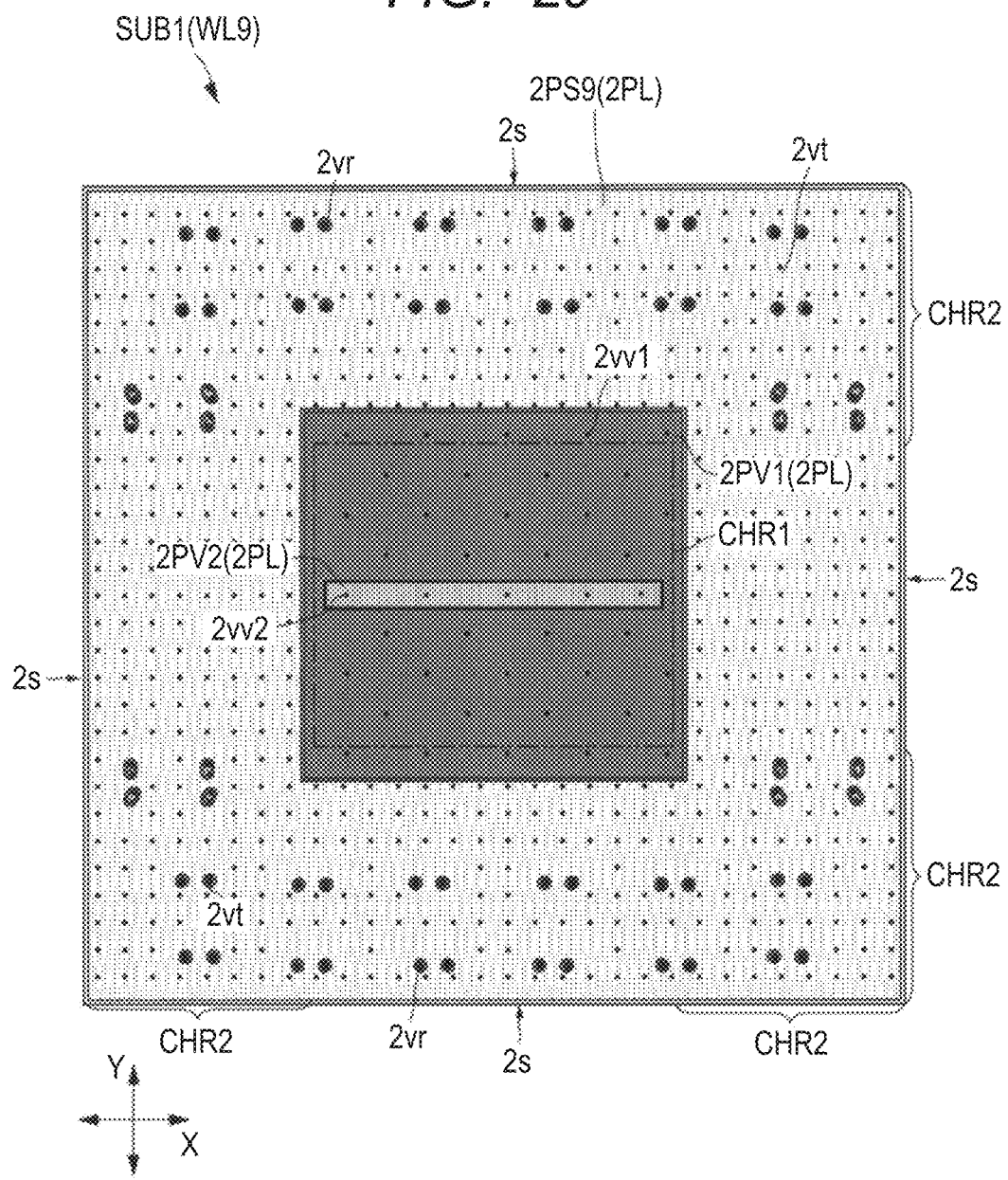
FIG. 29 is a plan view of a wiring layer (ninth wiring layer) located below the wiring layer shown in FIG. 28.
Figure 30:
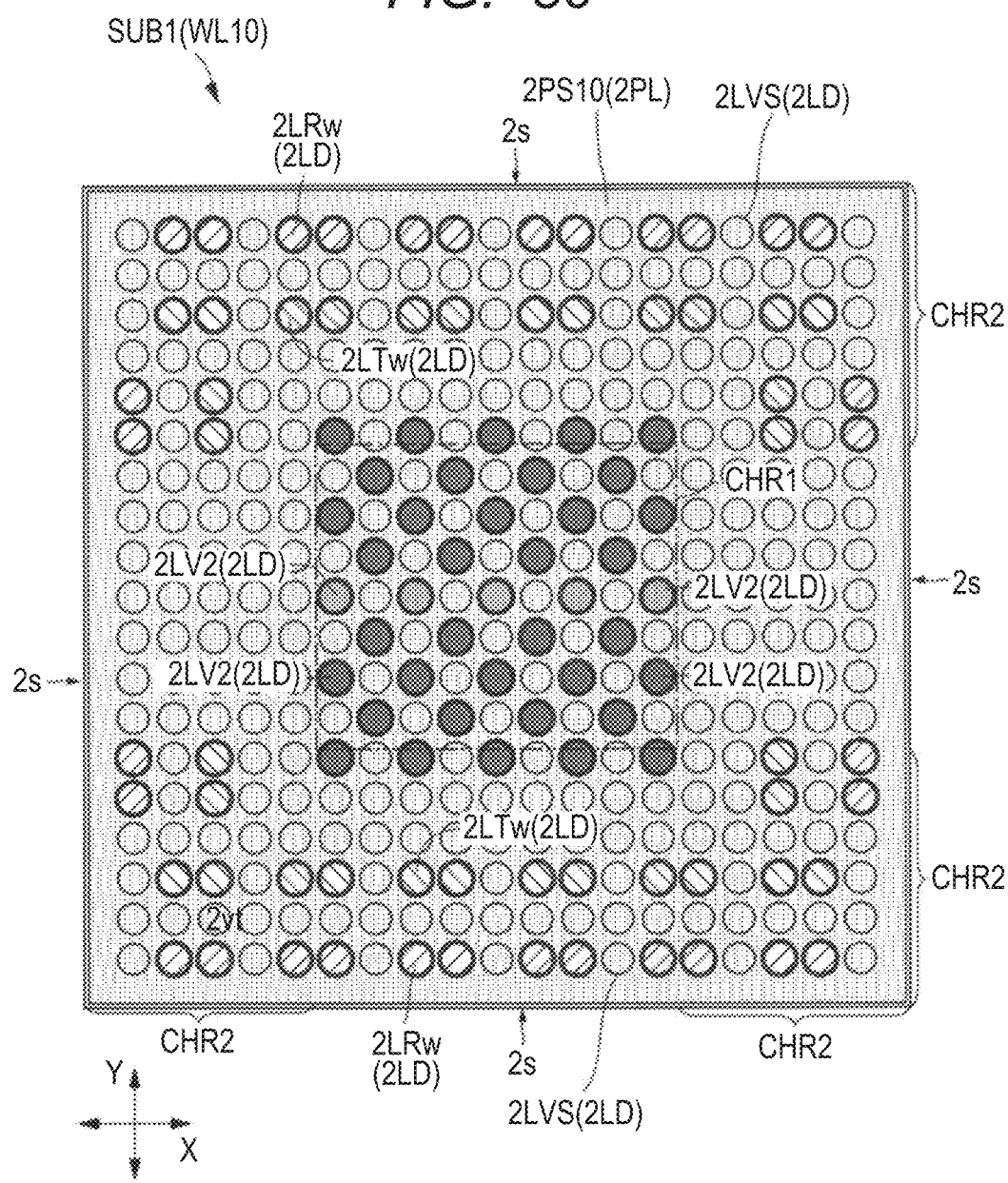
FIG. 30 is a plan view of a wiring layer (tenth wiring layer) located below the wiring layer shown in FIG. 20.

Next, an example of a structure of the wiring layers WL6 to WL10 shown in FIG. 6 will be briefly described. FIG. 26 is a plan view of a wiring layer (sixth layer) located below the wiring layer shown in FIG. 20. FIG. 27 is a plan view of a wiring layer (seventh layer) located below the wiring layer shown in FIG. 26. FIG. 28 is a plan view of a wiring layer (eighth layer) located below the wiring layer shown in FIG. 27. FIG. 29 is a plan view of a wiring layer (ninth layer) located below the wiring layer shown in FIG. 28. FIG. 30 is a plan view of a wiring layer (tenth layer) located below the wiring layer shown in FIG. 20. In each of FIGS. 26 to 30, the boundary between the region CHR1 and the region CHR2 is shown by the two-dot-dash line. In FIGS. 26 to 30, for identification of the types of signals and potentials supplied to the individual transmission paths, hatching and patterns are added in the same manner as in FIG. 7.

As shown in FIG. 26, in the wiring layer WL6, the conductor plane 2PS6 supplied with the reference potential and the plurality of through hole wires 2TVS are formed. Also, in the wiring layer WL6, the plurality of through hole wires 2TV1 supplied with the power supply potential VD1 (see FIG. 3) and the plurality of through hole wires 2TV2 supplied with the power supply potential VD2 are formed. Also, in the wiring layer WL6, the plurality of through hole wires 2TTw which transmit the output signal and the plurality of through hole wires 2TRw which transmit the input signal are formed. In the wiring layer WL6, some of the plurality of through hole wires 2TV1 are located in the region CHR1, while the others of the plurality of through hole wires 2TV1 are located in the region CHR2.

The conductor plane 2PS6 has the largest area among the plurality of conductor patterns formed in the wiring layer WL6. In the conductor plane 2PS6, a plurality of openings are provided and, in the plurality of respective openings, the plurality of through hole wires 2TV1, 2TV2, 2TTw, and 2TRw are disposed. Each of the plurality of through hole wires 2TV1, 2TV2, 2TTw, and 2TRw is spaced apart (electrically isolated) from the conductor plane 2PS6. The plurality of through hole wires 2TVS are formed integrally with the conductor plane 2PS6.

The vias 2vr which transmit the input signals are coupled to the through hole wires 2TRw in the openings. The vias 2vt which transmit the output signal are coupled to the through hole wires 2TTW of the wires Tw. The vias 2vv1 which transmit the power supply potential VD1 (see FIG. 3) are coupled to the through hole wires 2TV1 in the openings. The vias 2vv2 which transmit the power supply potential VD2 (see FIG. 3) are coupled to the through hole wires 2TV2 in the openings. The vias (reference potential vias) supplied with the reference potential are coupled to the conductor plane 2PS6 in the region CHR2 of the wiring layer WL6, though the illustration thereof is omitted in FIG. 26. In the wiring layer WL6, some of the plurality of vias 2vv1 are coupled to the through hole wires 2TV1 in the region CHR1, while the others of the plurality of vias 2vv1 are coupled to the through hole wires 2TV1 in the region CHR2. Each of the plurality of vias 2vv1 shown in FIG. 26 is coupled to the conductor plane 2PV1 shown in FIG. 27.

As shown in FIG. 27, in the wiring layer WL7, a conductor plane 2PS7 supplied with the reference potential is formed. Also, in the wiring layer WL7, the conductor plane 2PV1 supplied with the power supply potential VD1 (see FIG. 3) and the conductor plane 2PV2 supplied with the power supply potential VD2 are formed. Also, in the wiring layer WL7, a plurality conductor patterns coupled to the vias 2vt which transmit the output signal and a plurality of conductor patterns coupled to the vias 2vr which transmit the input signal are formed.

The conductor plane 2PS7 has the largest area among the plurality of conductor patterns formed in the wiring layer WL7. In the conductor plane 2PS7, a plurality of openings are provided and, in the plurality of respective openings, a plurality of conductor patterns included in the signal transmission paths and the conductor plane 2PV1 are disposed. Each of the foregoing plurality of conductor patterns and the conductor plane 2PV1 is spaced apart (electrically isolated) from the conductor plane 2PS7. In the case of the present embodiment, in the conductor plane 2PV1 formed in the wiring layer WL7, an opening is formed and, in the opening, the conductor plane 2PV2 is disposed. The conductor plane 2PV2 is spaced apart (electrically isolated) from the conductor plane 2PV1.

The plurality of vias 2vt which transmit the output signal and the plurality of vias 2vr which transmit the input signal are coupled to the plurality of respective conductor patterns in the openings. The plurality of vias 2vv1 supplied with the power supply potential VD1 (see FIG. 3) are coupled to the conductor plane 2PV1. In the wiring layer WL7, some of the plurality of vias 2vv1 are located in the region CHR1, while the others of the plurality of vias 2vv1 are located in the region CHR2. The plurality of vias 2vv2 supplied with the power supply potential VD2 (see FIG. 3) are coupled to the conductor plane 2PV2. The plurality of vias 2vs supplied with the reference potential VSS (see FIG. 3) are coupled to the conductor plane 2PS7 in the region CHR2 of the wiring layer WL7.

As shown in FIG. 28, in the wiring layer WL8, a conductor plane 2PS8 supplied with the reference potential is formed. Also, in the wiring layer WL8, the plurality of conductor patterns supplied with the power supply potential VD1 (see FIG. 3) and the plurality of conductor patterns supplied with the power supply potential VD2 are formed. In the wiring layer WL8, the plurality of conductor patterns coupled to the vias 2vt which transmit the output signal and the plurality of conductor patterns coupled to the vias 2vr which transmit the input signal are formed.

The conductor plane 2PS8 has the largest area among the plurality of conductor patterns formed in the wiring layer WL8. In the conductor plane 2PS8, a plurality of openings are provided and, in the plurality of respective openings, the plurality of conductor patterns included in the signal transmission paths and the plurality of conductor patterns supplied with the power supply potential VD1 or the power supply potential VD2 are disposed. Each of the foregoing plurality of conductor patterns is spaced apart (electrically isolated) from the conductor plane 2PS8.

The plurality of vias 2vt which transmit the output signal and the plurality of vias 2vr which transmit the input signal are coupled to the plurality of conductor patterns in the respective openings. The vias 2vv1 supplied with the power supply potential VD1 (see FIG. 3) are coupled to the conductor plane 2PV1. The plurality of vias 2vv2 supplied with the power supply potential VD2 (see FIG. 3) are coupled to the conductor plane 2PV2. The plurality of vias 2vs supplied with the reference potential VSS (see FIG. 3) are coupled to the conductor plane 2PS8 in the region CHR2 of the wiring layer WL8.

As shown in FIG. 29, in the wiring layer WL9, a conductor plane 2PS9 supplied with the reference potential is formed. Also, in the wiring layer WL9, the conductor plane 2PV1 supplied with the power supply potential VD1 (see FIG. 3) and the conductor plane 2PV2 supplied with the power supply potential VD2 are formed. Also, in the wiring layer WL9, the plurality of conductor patterns coupled to the vias 2vt which transmit the output signal and the plurality of conductor patterns coupled to the vias 2vr which transmit the input signal are formed.

The conductor plane 2PS9 has the largest area among the plurality of conductor patterns formed in the wiring layer WL9. In the conductor plane 2PS9, a plurality of openings are provided and, in the plurality of respective openings, the plurality of conductor patterns included in the signal transmission path and the conductor plane 2PV1 are disposed. Each of the foregoing plurality of conductor patterns and the foregoing conductive plane 2PV1 is spaced apart (electrically isolated) from the conductor plane 2PS9. In the case of the present embodiment, in the conductor plane 2PV1 formed in the wiring layer WL9, an opening is formed and, in the opening, the conductor plane 2PV2 is disposed. The conductor plane 2PV2 is spaced apart (electrically isolated) from the conductor plane 2PV1.

The plurality of vias 2vt which transmit the output signal and the plurality of vias 2vr which transmit the input signal are coupled to the plurality of conductor patterns in the respective openings. The plurality of vias 2vv1 supplied with the power supply potential VD1 (see FIG. 3) are coupled to the conductor plane 2PV1. The plurality of vias 2vv2 supplied with the power supply potential VD2 (see FIG. 3) are coupled to the conductor plane 2PV2. The plurality of vias 2vs supplied with the reference potential VSS (see FIG. 3) are coupled to the conductor plane 2PS9 in the region CHR2 of the wiring layer WL9.

As shown in FIG. 30, in the wiring layer WL10, a conductor plane 2PS10 supplied with the reference potential is formed. Also, in the wiring layer WL10, the plurality of lands 2LD are formed. The plurality of lands 2LD include a plurality of lands (first power supply potential lands) 2LV1 supplied with the power supply potential VD1 (see FIG. 3) and a plurality of lands (second power supply potential lands) 2LV2 supplied with the power supply potential VD2 (see FIG. 3). The plurality of lands 2LD also include a plurality of lands (output signal lands) 2LTw to which the output signal is transmitted and a plurality of lands (input signal lands) 2LRw to which the input signal is transmitted. The plurality of lands 2LD also include a plurality of lands (reference potential lands) 2LVS supplied with the reference potential VSS (see FIG. 3). Note that the plurality of lands 2LVS are formed integrally with the conductor plane 2PS10.

The conductor plane 2PS10 has the largest area among the plurality of conductor patterns formed in the wiring layer WL10. In the conductor plane 2PS10, a plurality of openings are provided and, in the plurality of respective openings, the plurality of lands 2LV1, the plurality of lands 2LV2, the plurality of lands 2LTw, and the plurality of lands 2LRw are disposed. Each of the plurality of lands 2LV1, the plurality of lands 2LV2, the plurality of lands 2LTw, and the plurality of lands 2LRw is spaced apart (electrically isolated) from the conductor plane 2PS10.

The plurality of vias 2vt shown in FIG. 29 are coupled to the plurality of lands 2LTw shown in FIG. 30. The plurality of vias 2vr shown in FIG. 29 are coupled to the plurality of lands 2LRw shown in FIG. 30. The plurality of vias 2vv1 shown in FIG. 29 are coupled to the plurality of lands 2LV1 shown in FIG. 30. The plurality of vias 2vv2 shown in FIG. 29 are coupled to the plurality of lands 2LV2 shown in FIG. 30. The plurality of vias 2vs shown in FIG. 29 are coupled to the conductor plane 2PS10 shown in FIG. 30.

The wiring substrate SUB1 included in the semiconductor device PKG1 (see FIG. 6) in the present embodiment has the structure described above. The electrodes Rx shown in FIG. 7 are electrically coupled to the lands 2LRw shown in FIG. 30 via the pads Ry shown in FIG. 11, the wires Rw shown in FIG. 15, the through hole wires 2TRw shown in FIG. 20, the plurality of vias 2vr electrically coupling together the individual wiring layers, and the conductor patterns in the individual wiring layers to which the vias 2vr are coupled. The electrodes Tx shown in FIG. 7 are electrically coupled to the lands 2LTw shown in FIG. 30 via the pads Ty shown in FIG. 11, the wires Tw and the through hole wires 2TTw which are shown in FIG. 20, the plurality of vias 2vt electrically coupling together the individual wiring layers, and the conductor patterns in the individual wiring layers to which the vias 2vt are coupled. The electrodes Vx1 shown in FIG. 7 are electrically coupled to the lands 2LV1 shown in FIG. 30 via the pads Vy1 shown in FIG. 11, the conductor planes 2PV1 shown in FIGS. 13, 15, 27, and 29, the through hole wires 2TV1 shown in FIG. 20, the plurality of vias 2vv1 electrically coupling together the individual wiring layers, and the conductor patterns in the individual wiring layers to which the vias 2vv1 are coupled. The electrode Vx2 shown in FIG. 7 are electrically coupled to the lands 2LV2 shown in FIG. 30 via the pads Vy2 shown in FIG. 11, the conductor plane 2PV2 shown in FIGS. 15, 27, and 29, the through hole wires 2TV2 shown in FIG. 20, the plurality of vias 2vv2 electrically coupling together the individual wiring layers, and the conductor patterns in the individual wiring layers to which the vias 2vv2 are coupled. The electrodes Vxs shown in FIG. 7 are electrically coupled to the lands 2LVS shown in FIG. 30 via the pads Vys shown in FIG. 11, the conductor planes 2PS2 to 2PS10 formed in the wiring layers WL2 to WL10, and the plurality of vias 2vs electrically coupling together the individual wiring layers.

Figure 31:
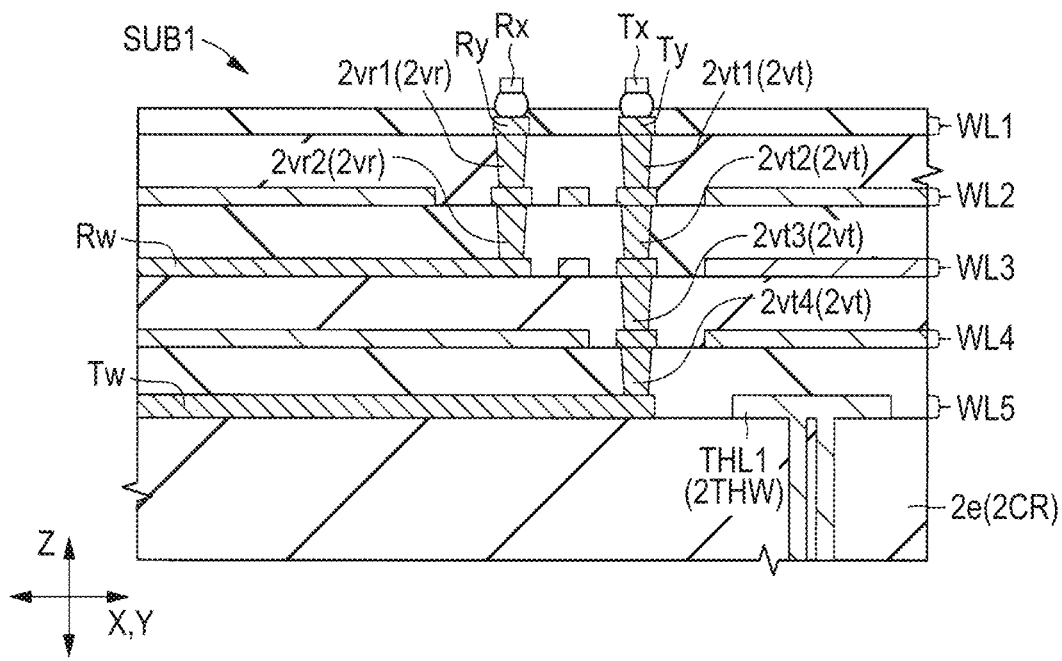
FIG. 31 is a main-portion enlarged cross-sectional view showing an example of a cross-sectional structure of the signal transmission paths shown in FIG. 6.
Figure 32:
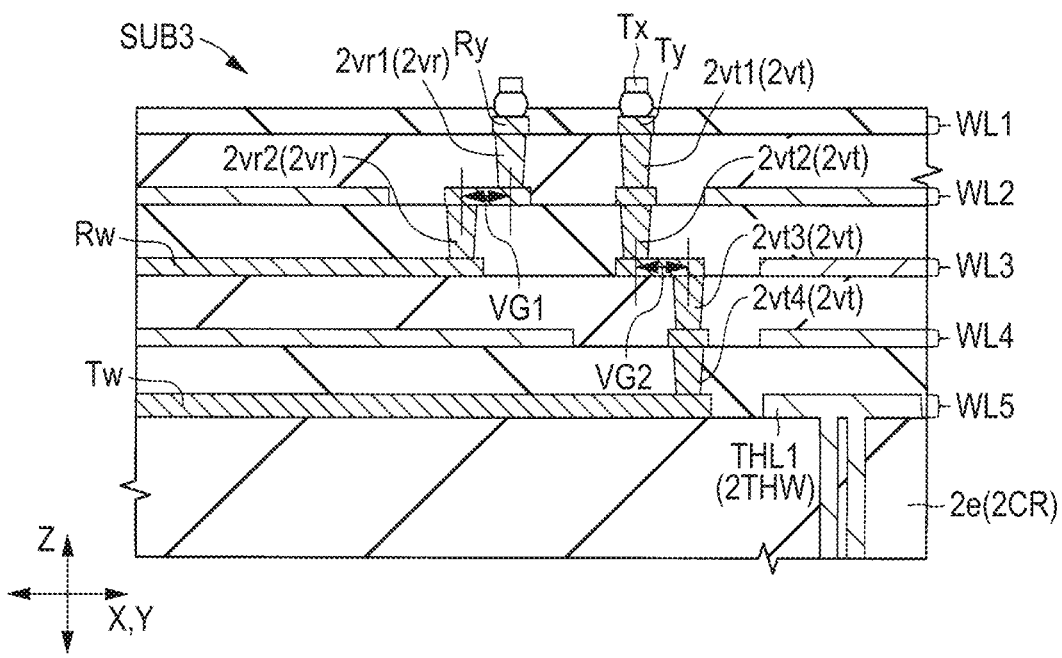
FIG. 32 is a main-portion enlarged cross-sectional view showing a modification of the example shown in FIG. 31.

In the example shown in FIGS. 14, 16, 19, and 21, the vias 2vt included in the transmission paths for the output signal overlap each other in the region CHR1. As also shown in FIGS. 14 and 16, the vias 2vr included in the transmission paths for the input signal overlap each other in the region CHR1. FIG. 31 is a main-portion enlarged cross-sectional view showing an example of the cross-sectional structures of the signal transmission paths shown in FIG. 6. FIG. 32 is a main-portion enlarged cross-sectional view showing a modification of the example shown in FIG. 31.

When the vias 2vr included in the signal transmission paths overlap each other in plan view, as shown in FIG. 31, the routing distance of the signal transmission path coupled to each of the electrodes Rx can be reduced. As shown in FIG. 31, since the via 2vr1 electrically coupling together the wiring layer WL1 and the wiring layer WL2 and the via 2vr2 electrically coupling together the wiring layer WL2 and the wiring layer WL3 have respective center points overlapping in plan view, the routing distance of the signal transmission path extending from the electrode Rx to the wiring layer WL3 is shortest.

Likewise, the vias 2vt included in the signal transmission path coupled to each of the electrodes Tx includes the via 2vt1 electrically coupling together the wiring layer WL1 and the wiring layer WL2, the via 2vt2 electrically coupling together the wiring layer WL2 and the wiring layer WL3, the via 2vt3 electrically coupling together the wiring layer WL3 and the wiring layer WL4, and the via 2vt4 electrically coupling together the wiring layer WL4 and the wiring layer WL5. When the vias 2vt1, 2vt2, 2vt3, and 2vt4 overlap each other in plan view, it is possible to reduce the routing distance of the signal transmission path extending from the electrode Tx to the wiring layer WL5.

When the routing distances of the signal transmission paths are reduced, the risk of being affected by noise is reduced. In addition, the signal intensity is less likely to be reduced. Accordingly, in terms of improving the reliability of signal transmission, it is particularly preferable that the plurality of vias 2vr coupled to the electrodes Rx or the plurality of vias 2vt coupled to the electrodes Tx overlap each other in plan view.

However, in a modification of the wiring substrate SUB1 shown in FIG. 31, there may be a case where the via 2vr1 and the via 2vr2 do not overlap each other in plan view, as in a wiring substrate SUB3 shown in FIG. 32. In the example shown in FIG. 32, in plan view, the via 2vr1 and the via 2vr2 do not overlap each other. Also, in the example shown in FIG. 32, in plan view, the via 2vt2 and the via 2vt3 do not overlap each other. When the wire Tw included in the signal transmission path is disposed in the wiring layer WL5 in which the through hole wire 2THW is disposed as in the present embodiment, there may be a case where the signal transmission path is disposed around the land portion THL1 of the through hole wire 2THW. At this time, since the signal transmission path is disposed around the land portion THL1, it may be difficult to lay out the plurality of vias 2vr or the plurality of vias 2vt such that the vias 2vr or the vias 2vt overlap each other in plan view.

When the amount of displacement between the via 2vr1 and the via 2vr2 is expressed as a center-to-center distance VG1 between the via 2vr1 and the via 2vr2 in plan view, the center-to-center distance VG1 is preferably minimized. Likewise, when the amount of displacement between the via 2vt2 and the via 2vt3 is expressed as a center-to-center distance VG2 between the via 2vt2 and the via 2vt3 in plan view, the center-to-center distance VG2 is preferably minimized.

The center-to-center distance VG1 is preferably smaller than the extending distance of the wire Rw coupled to the electrode Rx. As shown in FIG. 21, when the land portions THL1 (see FIG. 23) of the plurality of through hole wires 2THW (see FIG. 23) are arranged to be adjacent to each other in the wiring layer WL5, the center-to-center distance VG1 shown in FIG. 32 is preferably not more than the center-to-center distance between the adjacent land portions THL1. It is particularly preferable that the center-to-center distance VG1 shown in FIG. 32 is not more than the diameter of each of the land portions THL1.

Likewise, the center-to-center distance VG2 is preferably smaller than the extending distance of the wire Tw coupled to the electrode Tx. As shown in FIG. 21, when the land portions THL1 (see FIG. 23) of the plurality of through hole wires 2THW (see FIG. 23) are arranged to be adjacent to each other in the wiring layer WL5, the center-to-center distance VG2 shown in FIG. 32 is preferably not more than the center-to-center distance between the adjacent land portions THL1. It is particularly preferable that the center-to-center distance VG2 shown in FIG. 32 is not more than the diameter of each of the land portions THL1.

While the description has been given of several modifications even in the foregoing embodiment, the following will describe representative modifications other than the modifications described in the foregoing embodiment.

<Modification 1>

In the case of the semiconductor device PKG1 described above, the embodiment in which the power supply potential VD1 and the power supply potential VD2 which are shown in FIG. 3 are different has been described. In a modification of the semiconductor device PKG1, the power supply potential VD1 and the power supply potential VD2 may also be the same. In this modification, the plurality of pads Vy2 shown in FIG. 24 and the conductor plane 2PV1 may also be connected via the connecting portions Vy2j. It may also be possible to connect the conductor plane 2PV1 and the conductor plane 2PV2 shown in each of FIGS. 27 and 29 to provide the indiscrete conductor plane 2PV1. In this case, the number of the supply paths for the power supply potentials further increases compared to that in the semiconductor device PKG1. As a result, it is possible to further stabilize power supplies to the memory circuits MC1, the logic circuits LGC1, the input/output circuits IOC1, or the lookup table LUT1.

<Modification 2>

Figure 33:
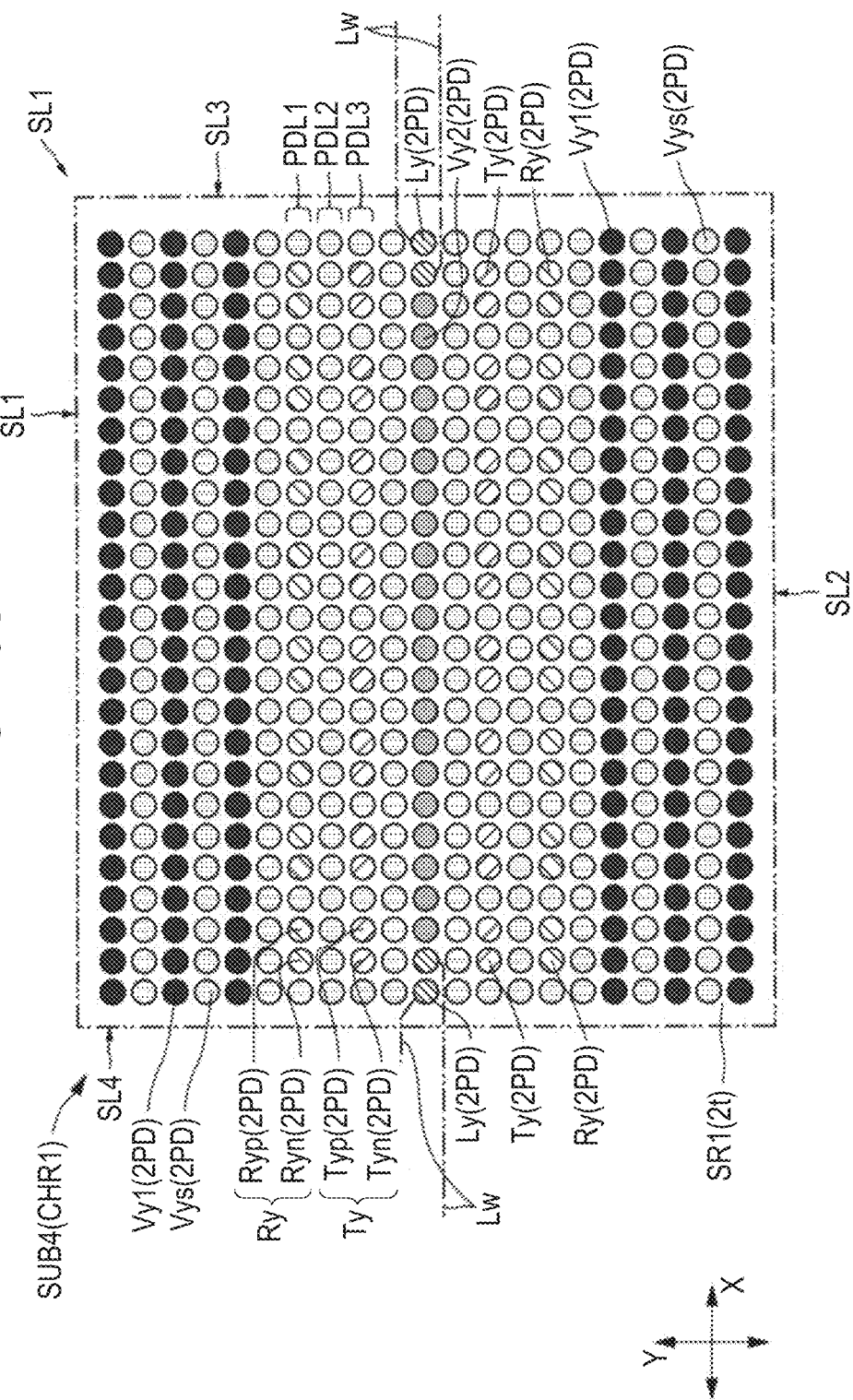
FIG. 33 is an enlarged plan view showing an example of a layout of pads in the first wiring layer of the wiring substrate included in a semiconductor device as a modification of the semiconductor device shown in FIG. 11.

In the case of the semiconductor device PKG1 described above, only high-speed signal transmission is shown and described. However, a modification of the semiconductor device PKG1 may also have a low-speed signal transmission path which transmits an electric signal at a transmission speed (e.g., about not more than 3 Gbps) lower than the transmission speed of the signal transmission path SGP (see FIG. 1) as the high-speed transmission path. FIG. 33 is an enlarged plan view showing an example of a layout of pads in the first wiring layer of the wiring substrate included in a semiconductor device in a modification of the semiconductor device shown in FIG. 11.

A wiring substrate SUB4 shown in FIG. 33 is different from the wiring substrate SUB1 shown in FIG. 1 in that the wiring substrate SUB4 has pads (terminals or low-speed signal terminals) Ly in the wiring layer WL1 thereof. To each of the plurality of pads Ly shown in FIG. 33, a low-speed signal is transmitted at a transmission speed lower than the speeds at which the signal SGT and the signal SGR which are shown in FIG. 1 are transmitted. The plurality of pads Ly are disposed at positions facing the respective electrodes (low-speed signal electrodes) of the semiconductor chip and electrically coupled to the electrodes (low-speed signal electrodes) of the semiconductor chip, in the same manner as in the example of the pads Ty and the pads Ry which are shown in FIG. 31.

When the high-speed signal and the low-speed signal are thus present in mixed relation, to prevent crosstalk noise from the low-speed signal from affecting the high-speed signal, the high-speed signal transmission path and the low-speed signal transmission path are preferably disposed to be spaced apart from each other. In the example shown in FIG. 33, the outer edge of the region CHR1 has the side (long side or first side) SL1, a side (long side or second side) SL2 located opposite to the side SL1, a side (short side or third side) SL3 crossing the sides SL1 and SL2, and a side (short side or fourth side) SL4 located opposite to the side SL3.

In the same manner as in the example of the wiring substrate SUB1 described above, each of the plurality of wires Rw (see FIG. 15) coupled to the plurality of pads Ry shown in FIG. 33 and the plurality of wires Tw (see FIG. 20) coupled to the plurality of pads Ty is disposed so as to cross the side SL1 or the side SL2. In other words, the high-speed signal transmission path is led out to the region CHR2 (see FIG. 15) across the side SL1 or the side SL2 of the region CHR1. On the other hand, as shown in FIG. 33, each of the plurality of pads Ly is disposed at a position closer to the side SL3 or the side SL4 than to the side SL1 and the side SL2. Accordingly, the plurality of wires Lw coupled to the plurality of pads Ly are disposed so as to cross the side SL3 or the side SL4, as shown in FIG. 33. In other words, the low-speed signal transmission path is led out to the region CHR2 (see FIG. 15) across the side SL3 or the side SL4 of the region CHR1.

The layout shown in FIG. 33 increases the distance by which the high-speed signal transmission path and the low-speed signal transmission path are spaced apart. This can prevent crosstalk noise from the low-speed signal from affecting the high-speed signal.

<Modification 3>

Figure 34:
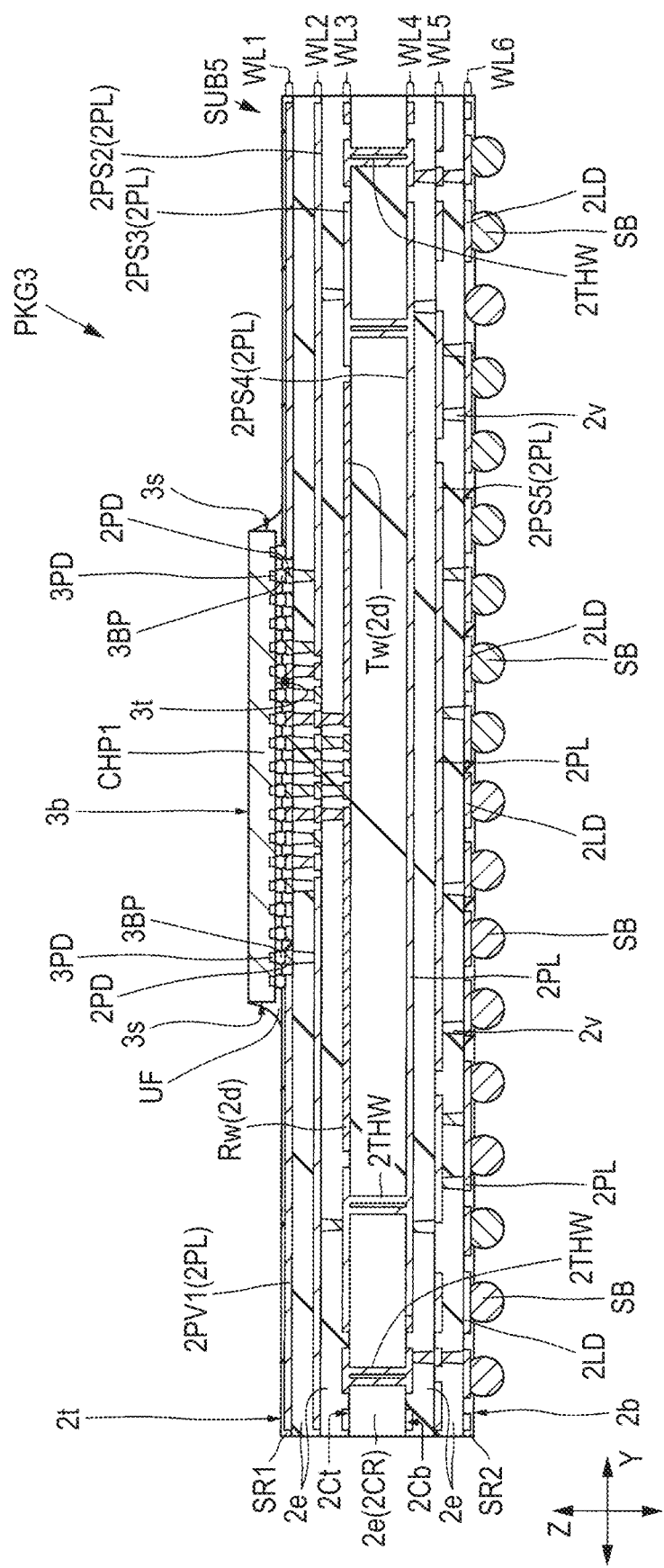
FIG. 34 is a cross-sectional view of a semiconductor device as a modification of the semiconductor device shown in FIG. 6.
Figure 35:
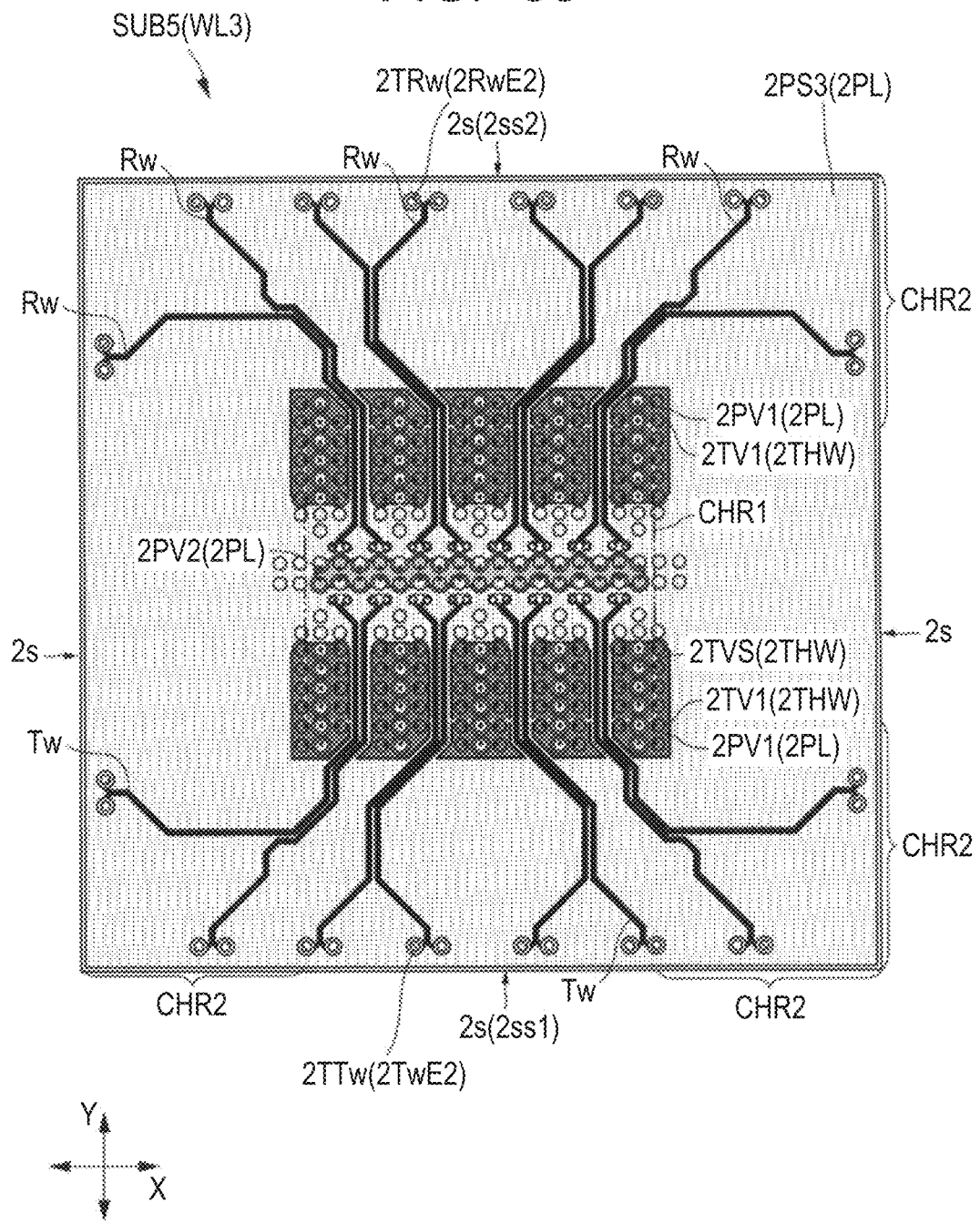
FIG. 35 is a plan view of the third wiring layer among the wiring layers shown in FIG. 34.

In the foregoing embodiment, the description has been given of the plurality of techniques associated with the semiconductor device which performs high-speed signal transmission. However, it may also be possible to extract some of the plurality of techniques. For example, when the technique of forming the signal transmission wires in the insulating layer 2CR (see FIG. 6) as the core layer, which is among the plurality of techniques described above, is used appropriately, a wiring substrate SUB5 (see FIG. 34) having the wiring layers smaller in number than those of the wiring substrate SUB1 is obtained. FIG. 34 is a cross-sectional view of a semiconductor device as a modification of the semiconductor device shown in FIG. 6. FIG. 35 is a plan view of the third wiring layer among the wiring layers shown in FIG. 34.

The wiring substrate SUB5 included in a semiconductor device PKG3 shown in FIG. 34 is different from the wiring substrate SUB1 in the semiconductor device PKG1 shown in FIG. in having a structure in which the number of the wiring layers is 6. The wiring substrate SUB5 is also different from the wiring substrate SUB1 in that, in the wiring layer WL3 in which the plurality of through hole wires 2THW (specifically, the land portions THL1 of the through hole wires 2THW shown in FIG. 23) are formed, the plurality of wires Tw and the plurality of wires Rw are disposed.

As shown in FIG. 35, the semiconductor substrate SUB5 includes a side 2ss1 and a side 2ss2 located opposite to the side 2ss1. In the wiring layer WL3, each of the plurality of wires Rw extends from the region CHR1 toward the side 2ss1 of the wiring substrate SUB5. On the other hand, each of the plurality of wires Tw extends from the region CHR1 toward the side 2ss2. In other words, the plurality of wires Rw and the plurality of wires Tw extend in opposite directions.

By thus allowing the wires Rw and the wires Tw to extend in the opposite directions, crosstalk noise between the input signal and the output signal can be reduced. However, the noise reduction property of the wiring layer WL3 is about the same as that of the wiring layer WL5 of the wiring substrate SUB1 shown in FIG. 6. Accordingly, in terms of improving the noise reduction property of the wires Rw as the transmission paths for the input signal, the structure of the wiring substrate SUB1 described using FIG. 6 is preferred to the structure of the wiring substrate SUB5.

<Modification 4>

In the case of the semiconductor device PKG1, as shown in FIG. 9, over the upper surface 2t of the wiring substrate USB1, only the semiconductor chip CHP1 is mounted. However, in a modification, not only the semiconductor chip CHP1, but also components such as a plurality of capacitor components and a heat dissipation plate may also be mounted over the wiring substrate SUB1.

<Modification 5>

While the description has been given above of the various modifications, a combination of the individual modifications described above may also be used appropriately.

While the invention achieved by the present inventors has been specifically described heretofore on the basis of the embodiment, the present invention is not limited to the foregoing embodiment. It will be appreciated that various changes and modifications can be made in the invention within the scope not departing from the gist thereof.

The following is provided as additional description of parts of the content of the description of the foregoing embodiment.

(Note 1)

A semiconductor device, includes:

a semiconductor chip including a first top surface, a first back surface opposite to the first top surface, and a plurality of electrodes arranged in a plurality of rows over the first top surface; and a wiring substrate including a first main surface over which the semiconductor chip is mounted, a second main surface opposite to the first main surface, a plurality of wiring layers located between the first main surface and the second main surface, a first insulating layer located between the first main surface and the second main surface and having a third main surface and a fourth main surface opposite to the third main surface, and a plurality of through hole wires extending through the first insulating layer in a thickness direction and electrically coupling together the third main surface and the fourth main surface, in which the electrodes of the semiconductor chip include a plurality of input signal electrodes to which an input signal input to the semiconductor chip is transmitted, a plurality of output signal electrodes to which an output signal output from the semiconductor chip is transmitted, a plurality of reference potential electrodes which supply a reference potential to a first circuit of the semiconductor chip, and a plurality of first potential electrodes which supply a first potential different from the reference potential to the first circuit, in which, in plan view, the semiconductor chip has a first side, a second side opposite to the first side, a first region located between the first side and the second side, a second region located between the first region and the second side, and a third region located between the first region and the second region, in which the first potential electrodes and the reference potential electrodes of the semiconductor chip are arranged in each of the first region and the second region, in which the input signal electrodes and the output signal electrodes of the semiconductor chip are arranged in the third region, in which the wiring layers of the wiring substrate include:

a first wiring layer located between the first main surface and the second main surface;

a second wiring layer located between the first wiring layer and the second main surface; and a third wiring layer located between the second wiring layer and the second main surface and formed over the third main surface of the first insulating layer, in which the wiring substrate includes:

a plurality of input signal wires formed in the third wiring layer and coupled to the respective input signal electrodes;

a plurality of output signal wires formed in the third wiring layer and coupled to the respective output signal electrodes, a first conductor pattern formed in the first wiring layer and supplied with the first potential;

a second conductor pattern formed in the second wiring layer and supplied with the reference potential; and a third conductor pattern formed in the third wiring layer and electrically coupled to the second conductor pattern, in which, in plan view, each of the input signal wires and the output signal wires overlaps the second conductor pattern, wherein each of the wiring layers of the wiring substrate includes a chip overlapping region overlapping the semiconductor chip in plan view and a chip non-overlapping region located closer to a peripheral edge portion of the wiring substrate than the chip overlapping region in plan view, in which an outer edge of the wiring substrate has a first substrate side and a second substrate side located opposite to the first substrate side, and in which, in plan view, each of the input signal wires extends from the chip overlapping region toward the first substrate side, while each of the output signal wires extends from the chip overlapping region toward the second substrate side.

What is claimed is:

1. A semiconductor device, comprising:
a semiconductor chip including a first surface, a second surface opposite to the first surface, a first side, a second side opposite the first side, a first electrode formed on the first surface and a second electrode formed on the first surface; and
a wiring substrate including a first main surface over which the semiconductor chip is mounted, a second main surface opposite to the first main surface, a first wire for output signals extending in a first direction along the first main surface and located between the first main surface and the second main surface, a second wire for input signals extending in the first direction and located closer to the first main surface than the first wire in a cross-section view, wherein the first wire is electrically connected with the first electrode of the semiconductor chip, wherein the second wire is electrically connected with the second electrode of the semiconductor chip and is located between a first conductor pattern and a second conductor pattern in a cross-section view, and wherein, when a cross-sectional area of each of the first wire and the second wire is defined as a wire cross-sectional area in a second direction orthogonal to the first direction, the wire cross-sectional area of the second wire is smaller than the wire cross-sectional area of the first wire.

2. The semiconductor device according to claim 1,
wherein the first conductor pattern is located between the first wire and the second wire in the cross-section view, and wherein the second conductor pattern is located between the first main surface and the second wire in the cross-section view.

3. The semiconductor device according to claim 2,
wherein a third conductor pattern is located between the first main surface of the wiring substrate and the second conductor pattern.

4. The semiconductor device according to claim 3,
wherein the first and second conductor pattern are supplied with a reference potential, and wherein the third conductor pattern is supplied with a first potential.

5. The semiconductor device according to claim 4,
wherein the reference potential is a ground potential.

6. The semiconductor device according to claim 3,
wherein the first electrode of the semiconductor chip is located between a center portion of the first surface of the semiconductor chip and the first side of the semiconductor chip, wherein the second electrode of the semiconductor chip is located between the first electrode of the semiconductor chip and the first side of the semiconductor chip.

7. The semiconductor device according to claim 6,
wherein the first surface of the semiconductor chip faces the first main surface of the wiring substrate, and wherein a plurality of external electrodes is formed on the second main surface of the wiring substrate.

8. The semiconductor device according to claim 3,
wherein the semiconductor chip includes a third electrode for output signals formed on the first surface and a fourth electrode for input signals formed on the first surface, wherein the wiring substrate includes a third wire for output signals formed in a first wiring layer in which the first wire is formed, and a fourth wire for input signals formed in a second wiring layer in which the second wire is formed, wherein the third wire is electrically connected with the third electrode, and wherein the fourth wire is electrically connected with the fourth electrode.

9. The semiconductor device according to claim 8,
wherein the first and third wires are located side by side, and wherein the second and fourth wires are located side by side.

10. The semiconductor device according to claim 9,
wherein the third electrode of the semiconductor chip is located between a center portion of the first surface of the semiconductor chip and the first side of the semiconductor chip, wherein the fourth electrode of the semiconductor chip is located between the third electrode of the semiconductor chip and the first side of the semiconductor chip.

11. The semiconductor device according to claim 10,
wherein a pair of the first and third electrodes is a first differential pair, and wherein a pair of the second and fourth electrodes is a second differential pair.

12. The semiconductor device according to claim 9,
wherein a pair of the first and third wires is a first differential pair, and wherein a pair of the second and fourth wires is a second differential pair.

13. The semiconductor device according to claim 12,
wherein, in the cross-section view, the second and fourth wires are sandwiched between the third conductor formed in the second wiring layer and a fourth conductor formed in the second wiring layer.

14. The semiconductor device according to claim 13,
wherein, in the cross-section view, each of the third and fourth conductors is electrically connected with the first conductor via a plurality of first through hole wires.

15. The semiconductor device according to claim 14,
wherein, in the cross-section view, each of the third and fourth conductors is electrically connected with the first conductor via a plurality of second through hole wires.

16. The semiconductor device according to claim 15,
wherein, in the cross-section view, the first and third wires are sandwiched between a fifth conductor formed in the first wiring layer and a sixth conductor formed in the first wiring layer.

17. The semiconductor device according to claim 16,
wherein, in the cross-section view, each of the fifth and sixth conductors is electrically connected with the first conductor via a plurality of third through hole wires.

* * * * *